(12) United States Patent
Banba et al.

(10) Patent No.: US 7,215,196 B2
(45) Date of Patent: May 8, 2007

(54) VARIABLE IMPEDANCE CIRCUIT, VARIABLE GAIN DIFFERENTIAL AMPLIFIER, MULTIPLIER, HIGH-FREQUENCY CIRCUIT AND DIFFERENTIAL DISTRIBUTED AMPLIFIER

(75) Inventors: Seiichi Banba, Ohgaki (JP); Norihiro Nikai, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 191 days.

(21) Appl. No.: 10/802,878

(22) Filed: Mar. 18, 2004

(65) Prior Publication Data

US 2004/0183599 A1 Sep. 23, 2004

(30) Foreign Application Priority Data

| Mar. 19, 2003 | (JP) | ............................... 2003-075902 |
| Feb. 27, 2004 | (JP) | ............................... 2004-055399 |

(51) Int. Cl.
*H03F 3/45* (2006.01)

(52) U.S. Cl. .................. 330/254; 330/278; 327/359; 327/356

(58) Field of Classification Search ................ 330/254, 330/278; 327/356, 359
See application file for complete search history.

(56) References Cited

U.S. PATENT DOCUMENTS

| 3,641,450 | A | * | 2/1972 | Lunn | ........................ 330/254 |
| 6,100,760 | A | * | 8/2000 | Maruyama et al. | ......... 330/254 |
| 6,316,997 | B1 | * | 11/2001 | Tammone, Jr. | .............. 330/254 |
| 6,480,064 | B1 | * | 11/2002 | Cyrusian | .................... 330/253 |
| 6,570,447 | B2 | * | 5/2003 | Cyrusian et al. | ............ 330/254 |
| 6,597,243 | B1 | | 7/2003 | Fratti | |
| 6,980,053 | B2 | * | 12/2005 | Caresosa et al. | ............ 330/254 |
| 2003/0184383 | A1 | | 10/2003 | Ogawa | |

FOREIGN PATENT DOCUMENTS

| JP | 05-300039 | 11/1993 |
| JP | 09-252228 | 9/1997 |
| JP | 10-261926 | 9/1998 |
| JP | 11-088079 | 3/1999 |
| JP | 2003-168937 A | 6/2003 |
| JP | 2003-209448 A | 7/2003 |
| JP | 2003-168938 A | 8/2003 |
| JP | 2003-298370 A | 10/2003 |

* cited by examiner

*Primary Examiner*—Patricia Nguyen
(74) *Attorney, Agent, or Firm*—McDermott Will & Emery LLP

(57) ABSTRACT

The collectors of transistors are connected via respective resistances to a power supply terminal receiving a power supply voltage. The emitters of the transistors are connected to a ground terminal via respective resistances. A shunt resistance, a FET, and a shunt resistance are connected in series between nodes connected to the respective emitters of the transistors. The gate of the FET is connected via a resistance to a control terminal receiving a control voltage. The shunt resistances and FET form a variable resistance circuit.

9 Claims, 33 Drawing Sheets

F I G. 4
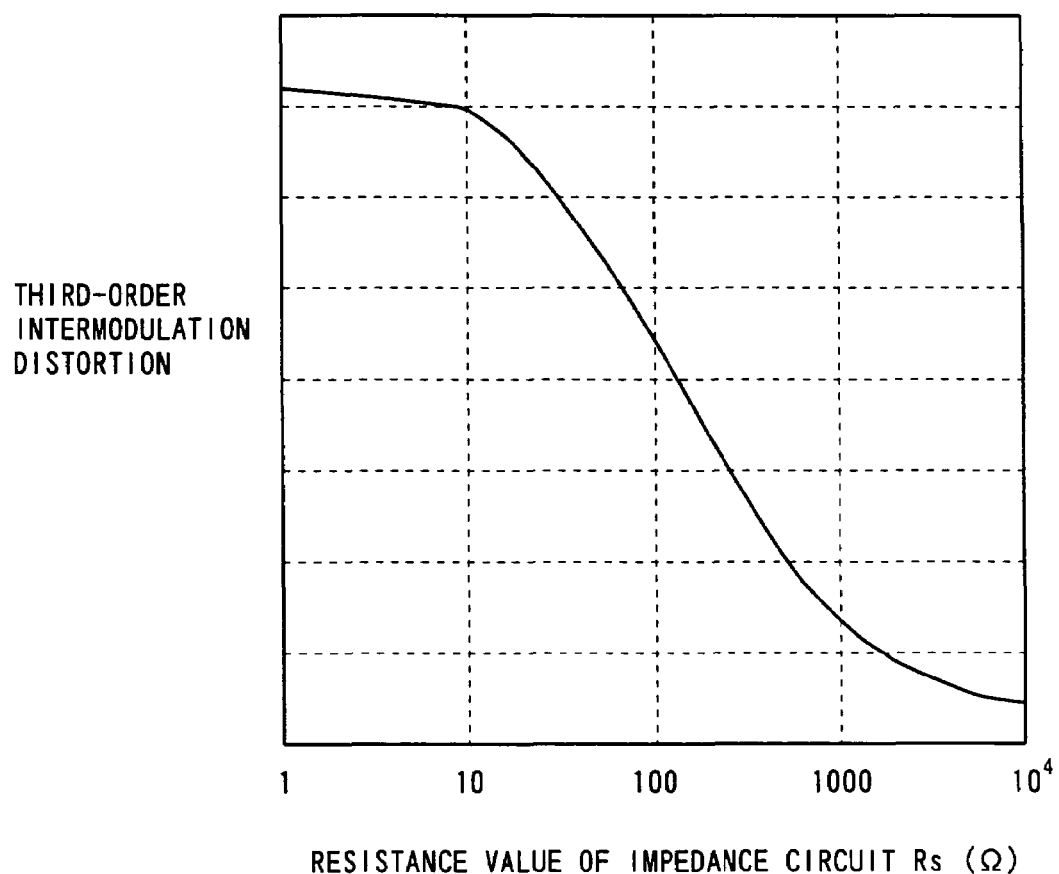

F I G. 7
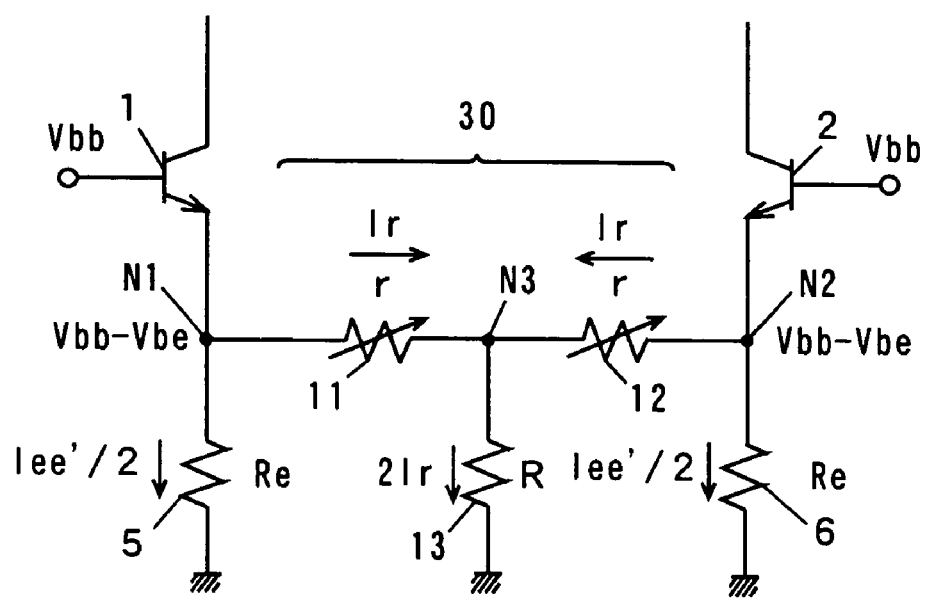

F I G. 1 0
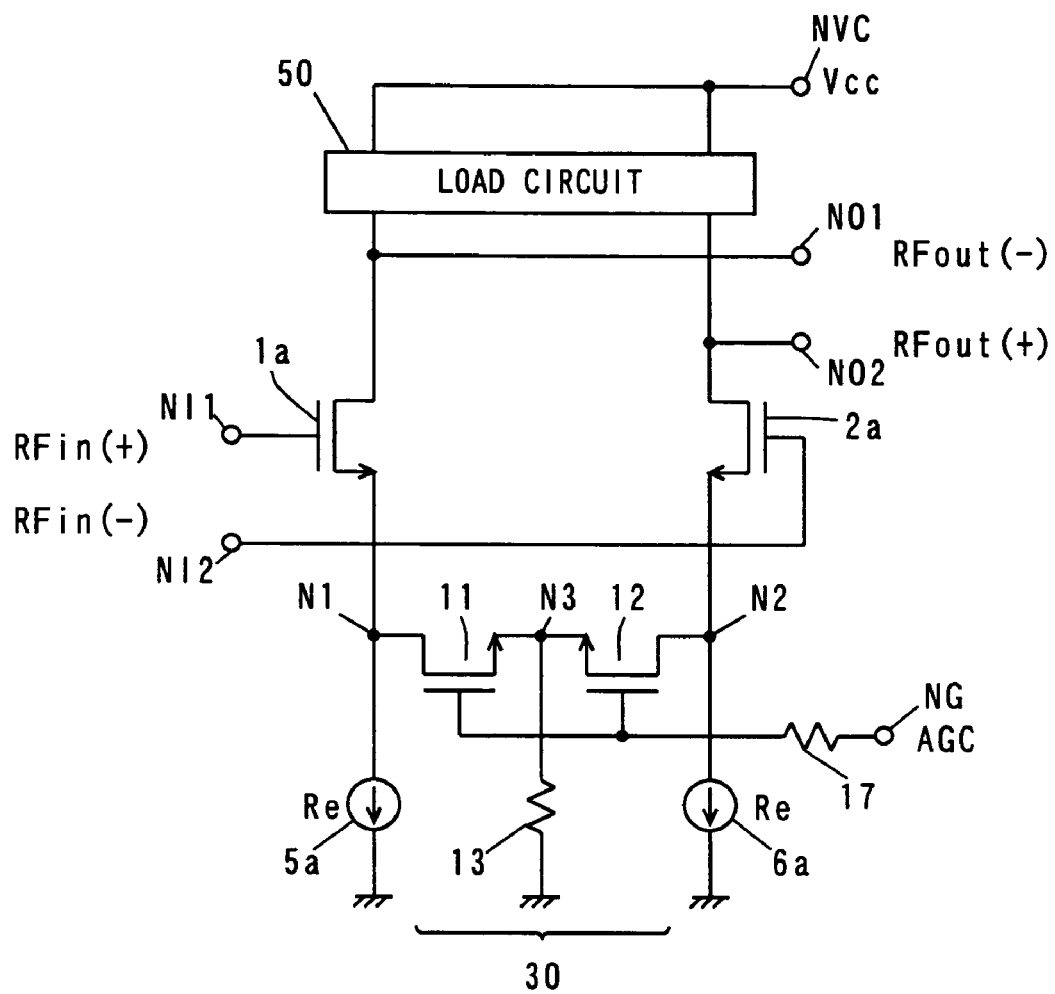

F I G. 1 2
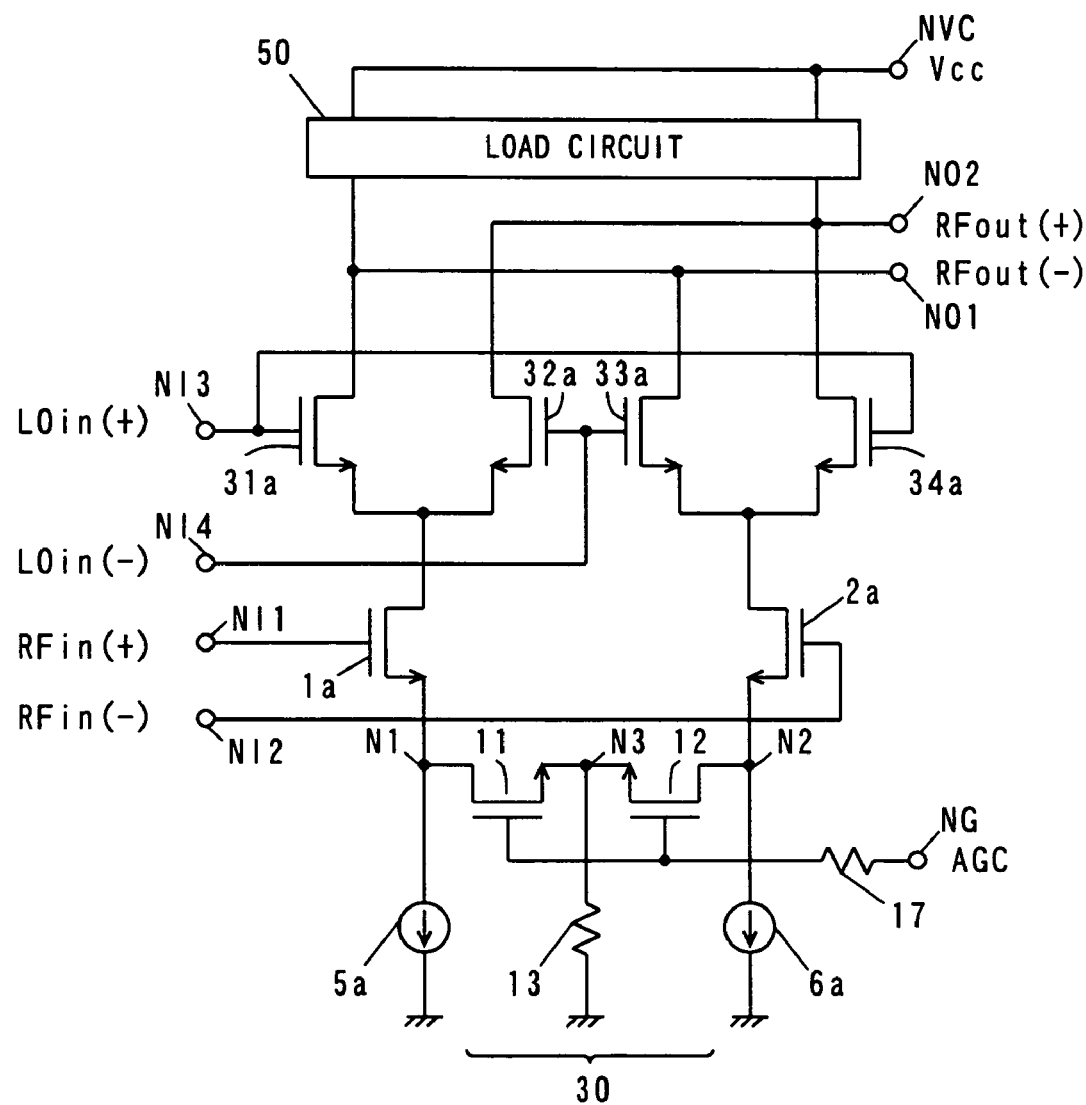

VARIABLE IMPEDANCE CIRCUIT, VARIABLE GAIN DIFFERENTIAL AMPLIFIER, MULTIPLIER, HIGH-FREQUENCY CIRCUIT AND DIFFERENTIAL DISTRIBUTED AMPLIFIER

BACKGROUND OF THE INVENTION

1. Field of the Invention

The present invention relates to a variable impedance circuit, a variable gain differential amplifier using the same, a multiplier and a differential distributed amplifier using the same and a high-frequency circuit using them.

2. Description of the Background Art

Variable gain differential amplifiers (differential amplification circuits having a variable gain function) have been conventionally in use. Integrated circuits using Si (silicon) devices, such as bipolar transistors and MOSFETs (Metal Oxide Semiconductor Field-Effect Transistors), mainly include an amplifier having the Gilbert-cell structure or OTA (operational transconductance amplifier) structure as a variable gain differential amplifier.

An amplifier having the Gilbert-cell structure has a wide variable gain range, but is inferior in power consumption and noise characteristics. For this reason, mobile communication devices and the like in general use the OTA structure having a variable resistance circuit formed by an FET switch and the like in a differential amplifier.

FIG. 35 is a circuit diagram of a conventional variable gain differential amplifier having the OTA structure.

The variable gain differential amplifier shown in FIG. 35 is formed by bipolar transistors (hereinafter abbreviated to transistors) 101 and 102, resistors 103, 104, 105 and 106, and an n-MOSFET (hereinafter abbreviated to an FET) 107. The FET 107 forms a variable resistance circuit 50.

The base of the transistor 101 is connected to an input terminal NI1 receiving an input signal RFin(+), and the base of the transistor 102 is connected to another input terminal NI2 receiving another input signal RFin(−). The input signals RFin(+) and RFin(−) are differential inputs. The collectors of the transistors 101 and 102 are connected to a power supply terminal NVC receiving a power supply voltage Vcc via the resistors 103 and 104, respectively. The emitters of the transistors 101 and 102 are connected to ground terminals via the resistors 105 and 106, respectively. The collectors of the transistors 101 and 102 are connected to output terminals NO1 and NO2, respectively. Output signals RFout(−) and RFout(+) are derived from the output terminals NO1 and NO2, respectively. The output signals RFout(+) and RFout(−) are differential outputs.

The FET 107 is connected between nodes N1 and N2 that are connected to the respective emitters of the transistors 101 and 102. The gate of the FET 107 is connected to a control terminal NG receiving a control voltage AGC via a resistor 110.

In the variable gain differential amplifier shown in FIG. 35, the control voltage AGC is applied to the gate of the FET 107 for varying a source-to-drain resistance of the FET 107 so as to perform gain control. The maximum gain and lowered noise characteristics can be achieved when the FET 107 is in an ON-state, for example. In this case, the variable gain differential amplifier is suitable for amplifying a small high-frequency signal. On the other hand, the amount of attenuation is maximized (minimum gain) to enhance distortion characteristics when the FET 107 is in an OFF-state.

In this case, the variable gain differential amplifier is resistant against cross modulation in a state of high electric field strength.

Also for Gilbert-cell multipliers, a similar structure as that of a variable gain differential amplifier having the OTA structure has been proposed.

FIG. 36 is a diagram showing the structure of a conventional differential input/output high-frequency circuit used for a high-frequency receiver.

The differential input/output high-frequency circuit shown in FIG. 36 is formed by a variable gain amplifier 610, multiplier 620, and a variable gain intermediate frequency band multiplier (hereinafter abbreviated to an IF band amplifier) 630. A differential signal is input to the variable gain amplifier 610, and an amplified differential signal is output from the variable gain IF band amplifier 630. The variable gain amplifier 610 and the variable gain IF band frequency 630 are supplied with a control voltage AGC for controlling the gain.

The variable gain amplifier 610 is formed by a differential amplifier having a variable gain function; the multiplier 620 is formed by a Gilbert-cell amplifier without a variable gain function; and the IF band amplifier 630 is formed by a differential amplifier having a variable gain function.

Thus, in the differential input/output high-frequency circuit, the dynamic range of a differential amplifier used for the first stage greatly affects the dynamic range of a high-frequency receiver. In this case, the operating conditions of the Gilbert-cell multiplier are not optimized, resulting in a small dynamic range.

For this reason, receivers having a high-frequency amplifier, a mixer, and an intermediate frequency detecting circuit provided with an AGC (Automatic Gain Control) circuit that controls the gains of the high-frequency amplifier and the mixer have been proposed (refer to, for example, JP-5-300039-A.)

Distributed amplifiers are well known amplifiers that operate over a frequency band of one octave or wider in microwave band to millimeter wave band (refer to, for example, JP-9-252228-A, JP-11-88079-A, and JP-2003-209448-A.)

FIG. 37 is a circuit diagram showing one example of the structure of a conventional distributed amplifier. The distributed amplifier has a plurality of transistors TR1 to TR4, the gates (input terminals) of the plurality of transistors TR1 to TR4 being connected via respective inductive elements IL1 to IL4 each formed by a high-impedance transmission line or inductive element, the drains (output terminals) of the plurality of transistors TR1 to TR4 being connected via respective inductive elements OL1 to OL4 each formed by a high-impedance transmission line or inductive element. The parasitic capacitances of the respective transistors TR1 to TR4 (gate-to-source capacities on the input side and source-to-drain capacities on the output side) and the inductances IL1 to IL4, OL1 to OL4 thus form a quasi-transmission line. As a result, input and output impedance matching over a wide band can be achieved. In general, distributed amplifiers having a larger number of stages of transistors operate in a wider band.

In the variable gain differential amplifier shown in FIG. 35, however, the variable resistance circuit 50 has strong non-linearity at a region of the control voltage around a pinch-off voltage for the FET. This causes deterioration in the distortion characteristics around a specific control voltage. In the case of continuous gain control, therefore, the distortion characteristics of the variable gain differential amplifier are deteriorated when the FET is supplied with a control voltage at which waveform distortion is increased.

It is possible to increase emitter resistances of the transistors 101, 102 to achieve improved distortion characteristics in the variable gain differential amplifier. In this case, however, the operating current of the variable gain differential amplifier varies with varying gain.

In some variable gain differential amplifiers, it is desired to improve the distortion without variation of the operating current, depending on their uses.

Further, in the variable gain differential amplifier shown in FIG. 35, when the input voltage level is constant, the output voltage level increases at higher gain to easily cause saturation of the input/output characteristics. This is because the operating current of the variable gain differential amplifier does not vary with varying gain.

In some variable gain differential amplifiers, it is desired to set the operating current according to the output voltage level to suppress the saturation of input/output characteristics, depending on their uses.

In addition, in a conventional receiver using the variable gain differential amplifier shown in FIG. 35, a sufficiently high dynamic range has not been realized.

Distributed amplifiers are used in high-speed digital signal transmission systems, for example. In the high-speed digital signal transmission system, an amplifier having a variable gain function is effective in varying the gain in case of variation in the input level.

For this reason, a structure of a distributed amplifier has been proposed in which cascode-connected transistors are used in each of amplifying sections, and the transistors are individually turned on/off (refer to, JP-2003-298370-A, for example.)

In the structure in which the transistors are individually turned on/off, however, the gain only varies in a discrete manner.

SUMMARY OF THE INVENTION

An object of the present invention is to provide a variable impedance circuit capable of realizing reduced distortion without variation of an operating current, a variable gain differential amplifier using the same, and a multiplier using the same.

Another object of the present invention is to provide a variable impedance circuit capable of realizing reduced distortion while suppressing the saturation of input/output characteristics, a variable gain differential amplifier using the same, and a multiplier using the same.

Still another object of the present invention is to provide a high-frequency circuit in which a sufficiently increased dynamic range and reduced distortion is realized.

Still another object of the present invention is to provide a differential distributed amplifier whose gain can be continuously varied over a wide band.

It should be noted that a mixer is also included in the multiplier according to the present invention.

A variable gain differential amplifier according to one aspect of the present invention (first invention) is a variable gain differential amplifier comprising a first transistor having a first terminal receiving a first input signal, a second terminal connected to a first potential via a first load, and a third terminal connected to a second potential via a first impedance device; a second transistor having a first terminal receiving a second input signal, a second terminal connected to the first potential via a second load, and a third terminal connected to the second potential via a second impedance device; and a variable impedance circuit connected between the third terminal of the first transistor and the third terminal of the second transistor, wherein the variable impedance circuit includes a first resistive element, a variable impedance device, and a second resistive element connected in series between the third terminal of the first transistor and the third terminal of the second transistor, and a control voltage is applied to a control terminal of the variable impedance device.

In the variable gain differential amplifier according to the present invention, the first and second input signals are differentially amplified by the first and second transistors. In this case, the impedance of the variable impedance device in the variable impedance circuit varies depending on the control voltage so as to vary the gain of the variable gain differential amplifier.

Moreover, the distortion characteristics are improved by the first and second resistive elements in the variable impedance circuit. At this time, there is no variation in the operating currents flowing in the first and second transistors. Accordingly, the distortion can be reduced without variation of the operating currents.

A multiplier according to another aspect of the present invention (second invention) is a multiplier comprising first, second, third, fourth, fifth, and sixth transistors each having a first terminal, a second terminal, and a third terminal; and a variable impedance circuit, wherein the first terminal of the first transistor receives a first input signal, the second terminal thereof is connected to a first potential via a first load, and the third terminal thereof is connected to the second terminal of the fifth transistor; the first terminal of the second transistor receives a second input signal, the second terminal thereof is connected to the first potential via a second load, and the third terminal thereof is connected to the second terminal of the fifth transistor; the first terminal of the third transistor receives the second input signal, the second terminal thereof is connected to the first potential via the first load, and the third terminal thereof is connected to the second terminal of the sixth transistor; the first terminal of the fourth transistor receives the first input signal, the second terminal thereof is connected to the first potential via the second load, and the third terminal is connected to the second terminal of the sixth transistor; the first terminal of the fifth transistor receives a third input signal, and the third terminal thereof is connected to a second potential via a first impedance device; the first terminal of the sixth transistor receives a fourth input signal, and the third terminal thereof is connected to the second potential via a second impedance device, and wherein the variable impedance circuit includes a first resistive element, a variable impedance device, and a second resistive element connected in series between the third terminal of the fifth transistor and the third terminal of the sixth transistor, and wherein a control voltage is applied to a control terminal of the variable impedance device.

In the multiplier according to the present invention, the first and second input signals are differentially amplified by the first to fourth transistors, the third and fourth input signals are differentially amplified by the fifth and sixth transistors, and a result of the differential amplification of the first and second input signals and a result of the differential amplification of the third and fourth input signals are multiplied with each other. In this case, the impedance of the variable impedance device in the variable impedance circuit varies depending on the control voltage so as to vary the gain of the multiplier.

Moreover, the distortion characteristics are improved by the first and second resistive elements in the variable impedance circuit. At this time, there is no variation in the operating currents flowing in the fifth and sixth transistors. Accordingly, the distortion can be reduced without variation of the operating currents.

A variable impedance circuit according to still another aspect of the present invention (third invention) is a variable impedance circuit including first and second nodes each supplied with an equivalent potential; and a first resistive element, a variable impedance device, and a second resistive element connected in series between the first node and the second node, wherein a control voltage is applied to a control terminal of the variable impedance device.

In the variable impedance circuit according to the present invention, the impedance between the first node and the second node can be varied with the potential between the first node and the second node being equivalent. In this case, because the first node and the second node are at an equivalent potential, no current flows in the first resistive element, variable impedance device, and second resistive element.

Consequently, power consumption can be reduced using this variable impedance circuit in the variable gain amplifier or multiplier.

A variable gain differential amplifier according to still another aspect of the present invention (fourth invention) is a variable gain differential amplifier comprising a first transistor having a first terminal receiving a first input signal, a second terminal connected to a first potential via a first load, and a third terminal connected to a second potential via a first impedance device; a second transistor having a first terminal receiving a second input signal, a second terminal connected to the first potential via a second load, and a third terminal connected to the second potential via a second impedance device; and a variable impedance circuit connected between the third terminal of the first transistor and the third terminal of the second transistor, wherein the variable impedance circuit includes first and second variable impedance devices connected in series between the third terminal of the first transistor and the third terminal of the second transistor; and a resistive element connected between a junction point between the first variable impedance device and the second variable impedance device and the second potential, and wherein a control voltage is applied to a control terminal of the first and second variable impedance devices.

In the variable gain differential amplifier according to the present invention, the first and second input signals are differentially amplified by the first and second transistors. In this case, the impedances of the first and second variable impedance devices in the variable impedance circuit vary depending on the control voltage so as to vary the gain of the variable gain differential amplifier.

In addition, the operating current increases at higher gain, and decreases at lower gain (during attenuation.) This improves the saturation of input/output characteristics at high gain. As a result, the linearity of the input/output characteristics is increased to improve the distortion characteristics.

A multiplier according to still another aspect of the present invention (fifth invention) is a multiplier comprising first, second, third, fourth, fifth, and sixth transistors each having a first terminal, a second terminal, and a third terminal; and a variable impedance circuit, wherein the first terminal of the first transistor receives a first input signal, the second terminal thereof is connected to a first potential via a first load, and the third terminal thereof is connected to the second terminal of the fifth transistor; the first terminal of the second transistor receives a second input signal, the second terminal thereof is connected to the first potential via a second load, and the third terminal thereof is connected to the second terminal of the fifth transistor; the first terminal of the third transistor receives the second input signal, the second terminal thereof is connected to the first potential via the first load, and the third terminal thereof is connected to the second terminal of the sixth transistor; the first terminal of the fourth transistor receives the first input signal, the second terminal thereof is connected to the first potential via the second load, and the third terminal thereof is connected to the second terminal of the sixth transistor; the first terminal of the fifth transistor receives a third input signal, and the third terminal thereof is connected to a second potential via a first impedance device; the first terminal of the sixth transistor receives a fourth input signal, and the third terminal thereof is connected to the second potential via a second impedance device, and wherein the variable impedance circuit includes first and second variable impedance devices connected in series between the third terminal of the fifth transistor and the third terminal of the sixth transistor; and a resistive element connected between a junction point between the first variable impedance device and the second variable impedance device and the second potential, and wherein a control voltage is applied to a control terminal of the first and second variable impedance devices.

In the multiplier according to the present invention, the first and second input signals are differentially amplified by the first to fourth transistors, the third and fourth input signals are differentially amplified by the fifth and sixth transistors, and a result of the differential amplification of the first and second input signals and a result of the differential multiplication of the third and fourth input signals are multiplied with each other. In this case, the impedances of the first and second variable impedance devices in the variable impedance circuit are varied depending on the control voltage so as to vary the gain of the multiplier.

In addition, the operating current increases at higher gain, and decreases at lower gain (during attenuation.) This improves the saturation of input/output characteristics at high gain. As a result, the linearity of the input/output characteristics is increased to improve the distortion characteristics.

A variable impedance circuit according to still another aspect of the present invention is a variable impedance circuit comprising first, second, third, fourth, and fifth nodes; first and second variable impedance devices connected between the first node and the second node; a first resistive element connected between the first node and the third node; a second resistive element connected between the second node and the fourth node; and a third resistive element connected between a junction point between the first variable impedance device and the second variable impedance device and the fifth node, wherein the first, second, third, fourth, and fifth nodes are supplied with first, second, third, fourth, and fifth potentials, respectively, the first and second potentials being equal, and wherein a control voltage is applied to a control terminal of the first and second variable impedance devices.

In the variable impedance circuit according to the present invention, currents flowing in the first, second, and third resistive elements can be varied depending on the control voltage. The variable impedance circuit thus serves as a variable current source.

Accordingly, using this variable impedance circuit in the variable gain amplifier circuit or multiplier, the operating current can be varied with varying gain. As a result, the saturation of input/output characteristics can be suppressed while distortion can be reduced.

The third, fourth, and fifth potentials may differ from the first and second potentials, and the third, fourth, and fifth potentials may be equal.

In this case, a product of the first, second and third resistive elements and the currents flowing in the resistive elements is constant.

A high-frequency circuit according to still another aspect of the present invention is a high-frequency circuit comprising the differential amplifier according to the first or fourth invention that receives first and second input signals; and the multiplier according to the second or fifth invention, wherein output signals at the second terminals of the first and second transistors in the differential amplifier are applied to the first terminals of the fifth and sixth transistors in the multiplier as third and fourth input signals, a first control voltage is applied to the variable impedance circuit in the differential amplifier, and a second control voltage is applied to the variable impedance circuit in the multiplier.

In the high-frequency circuit according to the present invention, the gain of the differential amplifier can be varied by varying the first control voltage, and the gain of the multiplier can be varied by varying the second control voltage. In this case, the gain range of each of the differential amplifier and multiplier is a result of multiplication of the gain ranges of the differential amplifier and the multiplier.

When the input power level is low, the control voltage is applied such that the impedance of the variable impedance circuit may be minimized. At this time, the differential amplifier and multiplier simultaneously operate with a maximum gain and minimum noise figure. This high-frequency circuit accordingly has a maximum receiving sensitivity at a low input power level.

Conversely, when the input power level is high, the control voltage is applied such that the impedance of the variable impedance circuit may be maximized. At this time, the differential amplifier and multiplier simultaneously operate with a minimum gain. This high-frequency circuit accordingly operates with a maximum amount of attenuation at a high input power level, thereby reducing intermodulation distortion and cross modulation to a minimum.

By controlling the gains in both the differential amplifier and multiplier in this manner, a high-frequency circuit having a high dynamic range is realized.

In particular, the distortion characteristics are enhanced using the differential amplifier according to the first or fourth invention and the multiplier according to the second or fifth invention.

A high-frequency circuit according to still another aspect of the present invention is a high-frequency circuit comprising a differential amplifier that receives first and second input signals and a multiplier, wherein the differential amplifier comprises a first transistor having a first terminal receiving a first input signal, a second terminal connected to a first potential via a first load, and a third terminal connected to a second potential via a first impedance device; a second transistor having a first terminal receiving a second input signal, a second terminal connected to the first potential via a second load, and a third terminal connected to the second potential via a second impedance; and a first variable impedance circuit having an impedance connected to the third terminal of the first transistor and the third terminal of the second transistor and varying depending on a first control voltage, and wherein the multiplier includes first, second, third, fourth, fifth, and sixth transistors each having a first terminal, a second terminal, and a third terminal; and a second variable impedance circuit, the first terminal of the first transistor receiving a third input signal, the second terminal thereof being connected to a first potential via a first load, the third terminal thereof being connected to the second terminal of the fifth transistor; the first terminal of the second transistor receiving a fourth input signal, the second terminal thereof being connected to the first potential via a second load, the third terminal thereof being connected to the second terminal of the fifth transistor; the first terminal of the third transistor receiving the fourth input signal, the second terminal thereof being connected to the first potential via the first load, the third terminal thereof being connected to the second terminal of the sixth transistor; the first terminal of the fourth transistor receiving the third input signal, the second terminal thereof being connected to the first potential via the second load, the third terminal thereof being connected to the second terminal of the sixth transistor; the first terminal of the fifth transistor receiving a fifth input signal, the third terminal thereof being connected to the second potential via a first impedance device; the first terminal of the sixth transistor receiving a sixth input signal, the third terminal thereof being connected to the second potential via a second impedance device, the second variable impedance circuit being connected between the third terminal of the fifth transistor and the third terminal of the sixth transistor and having an impedance varying depending on a second control voltage, and wherein output signals at the second terminals of the first and second transistors in the differential amplifier are applied to the first terminals of the fifth and sixth transistors in the multiplier as the fifth and sixth input signals.

In the high-frequency circuit according to the present invention, the gain of the differential amplifier can be varied by varying the first control voltage, and the gain of the multiplier can be varied by varying the second control voltage. In this case, the gain range of each of the differential amplifier and multiplier is a result of the multiplication of the gain ranges of the differential amplifier and the multiplier.

When the input power level is low, the control voltage is applied such that the impedance of the variable impedance circuit may be minimized. At this time, the differential amplifier and multiplier simultaneously operate with a maximum gain and minimum noise figure. This high-frequency circuit accordingly has a maximum receiving sensitivity at a low input power level.

Conversely, when the input power level is high, the control voltage is applied such that the impedance of the variable impedance circuit may be maximized. At this time, the differential amplifier and multiplier simultaneously operate with a minimum gain. This high-frequency circuit accordingly operates with a maximum amount of attenuation at a high input power level, thereby reducing intermodulation distortion and cross modulation to a minimum.

By controlling the gains in both the differential amplifier and multiplier in this manner, a high-frequency circuit having a high dynamic range is realized.

The first and second control voltages may be a common voltage.

In this case, both the gains of the differential amplifier and multiplier can be controlled by the common voltage.

The first and second input signals maybe in a predetermined frequency range, and the first and second output signals may have a constant frequency.

In this case, the first and second input signals in a predetermined frequency range can be converted into the first and second output signals having a constant frequency.

The differential amplifier may include the differential amplifier according to the first or fourth invention. In this case, the distortion characteristics are enhanced.

The multiplier may include the multiplier according to the second or fifth invention. In this case, the distortion characteristics are enhanced.

A high-frequency circuit according to still another aspect of the present invention comprises a variable gain differential amplifier that receives first and second input signals in a predetermined frequency range; and a variable gain multiplier from which first and second output signals having a constant frequency are derived, wherein gains of the variable differential amplifier and variable gain multiplier are controlled by a common control voltage.

In the high-frequency circuit according to the present invention, the first and second input signals in a predetermined frequency range can be converted into the first and second output signals having a constant frequency. Moreover, the gains of the variable gain differential amplifier and variable gain multiplier can be controlled by the common control voltage. In this case, the gain range of each of the variable gain differential amplifier and variable gain multiplier is a result of multiplication of the variable gains of the variable gain differential amplifier and variable gain multiplier.

When the input power level is low, the variable gain differential amplifier and variable gain multiplier are simultaneously made to operate with a maximum gain and minimum noise figure. This high-frequency circuit accordingly has a maximum receiving sensitivity at a low input power level.

Conversely, when the input power level is high, the variable gain differential amplifier and variable gain multiplier are simultaneously made to operate with a minimum gain. Accordingly, this high-frequency circuit operates with a maximum amount of attenuation at a high input power level, thereby reducing intermodulation distortion and cross modulation to a minimum.

By controlling the gains in both the variable gain differential amplifier and variable gain multiplier in this manner, a high-frequency circuit having a high dynamic range is realized.

A differential distributed amplifier according to still another aspect of the present invention is a differential distributed amplifier comprising a first transmission circuit composed of a plurality of inductive elements receiving a first signal; a second transmission circuit composed of a plurality of inductive elements receiving a second input signal; a third transmission circuit composed of a plurality of inductive elements; a fourth transmission circuit composed of a plurality of inductive elements; and a plurality of differential amplifiers, wherein each of the plurality of differential amplifiers comprises a first transistor having a first terminal connected to any of the plurality of inductive elements of the first transmission circuit, a second terminal connected to any of the plurality of inductive elements of the third transmission circuit, and a third terminal; a second transistor having a first terminal connected to any of the plurality of inductive elements of the second transmission circuit, a second terminal connected to any of the plurality of inductive elements of the fourth transmission circuit, and a third terminal; and a variable impedance circuit connected between the third terminal of the first transistor and the third terminal of the second transistor, wherein the variable impedance circuit includes first and second variable impedance devices connected between the third terminal of the first transistor and the third terminal of the second transistor; and a resistive element connected between a junction point between the first variable impedance device and the second variable impedance device and a reference voltage, and wherein a control voltage is applied to a control terminal of the first and second variable impedance devices.

In the differential distributed amplifier according to the present invention, the first and second input signals are applied to the plurality of differential amplifiers via the first and second transmission circuits, and differentially amplified by the first and second transistors in each of the plurality of differential amplifiers. The signals amplified by each of the plurality of differential amplifiers are output as first and second output signals via the third and fourth transmission circuits.

In this case, the parasitic capacities on the input sides of the first and second transistors in the respective plurality of differential amplifiers and the plurality of inductive elements of the first and second transmission circuits form a quasi-transmission line on the input side, and the parasitic capacities on the output sides of the first and second transistors and the plurality of inductive elements of the third and fourth transmission circuits form a quasi-transmission line on the output side. Input and output impedance matching over a wide range can be thus obtained.

In addition, the impedances of the first and second variable impedances are varied to vary the gain in each of the plurality of differential amplifiers. As noted above, because the differential distributed amplifier according to the present invention is composed of a plurality of differential amplifiers with variable gain function, the gain can be continuously varied over a wide band.

The resistive element may include a constant current source. In this case, the operating current can be stabilized.

Each of the plurality of differential amplifiers may further include a first impedance device connected between the third terminal of the first transistor and a reference potential; and a second impedance device connected between the third terminal of the second transistor and a reference potential.

In this case, the operating current increases at higher gain and decreases at lower gain (during attenuation). This improves the saturation of input/output characteristics at high gain. As a result, the linearity of the input/output characteristics is increased to improve the distortion characteristics.

The first and second impedance devices may include a resistance. In this case, the structure of each of the differential amplifier is simplified.

The first and second impedance devices may include a constant current source. In this case, the operating current can be stabilized.

The resistive element may include a constant current source. In this case, the operating current can be stabilized.

Each of the plurality of differential amplifiers may further include a third transistor having a first terminal receiving a bias voltage; and a fourth transistor having a first terminal receiving a bias voltage, the first and third transistors being cascode-connected, the second and fourth transistors being cascode-connected, the second terminal of the first transistor being connected via the third transistor to any of the plurality of inductive elements of the third transmission circuit, the second terminal of the second transistor being connected via the fourth transistor to any of the plurality of inductive elements of the fourth transmission circuit.

In this case, because each of the differential amplifiers is composed of the cascode-connected first to fourth transistors, the frequency characteristics of the differential distributed amplifier are enhanced.

Also in the case where each of the plurality of differential amplifiers has the above-mentioned structure, the resistive element may include a constant current source. In this case, the operating current can be stabilized.

Also in the case where each of the plurality of differential amplifiers has the above-mentioned structure, each of the plurality of differential amplifiers may further include a first impedance device connected between the third terminal of the first transistor and a reference potential; and a second impedance device connected between the third terminal of the second transistor and a reference potential.

In this case, the operating current increases at higher gain and decreases at lower gain (during attenuation). This improves the saturation of input/output characteristics at high gain. As a result, the linearity of the input/output characteristics is increased to improve the distortion characteristics.

Also in the case where each of the plurality of differential amplifiers has the above-mentioned structure, the first and second impedance devices may include a resistance. In this case, the structure of each of the differential amplifier is simplified.

Also in the case where each of the plurality of differential amplifiers has the above-mentioned structure, the first and second impedance devices may include a constant current source. In this case, the operating current can be stabilized.

Also in the case where each of the plurality of differential amplifiers has the above-mentioned structure, the resistive element may include a constant current source. In this case, the operating current can be stabilized.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram showing the calculation result of dependence of the distortion characteristics of the Gilbert-cell multiplier shown in FIG. 3 on the resistance value of the variable impedance circuit;

FIG. 7 is a diagram showing the transistors, resistances, and schematized variable resistance circuit in the variable gain differential amplifier shown in FIG. 6;

FIG. 10 is a circuit diagram showing the structure of a variable gain differential amplifier according to a fourth embodiment of the present invention;

FIG. 12 is a circuit diagram showing the structure of a Gilbert-cell multiplier (mixer) according to a sixth embodiment of the present invention;

DESCRIPTION OF THE PREFERRED EMBODIMENTS (First Embodiment)

Figure 1:
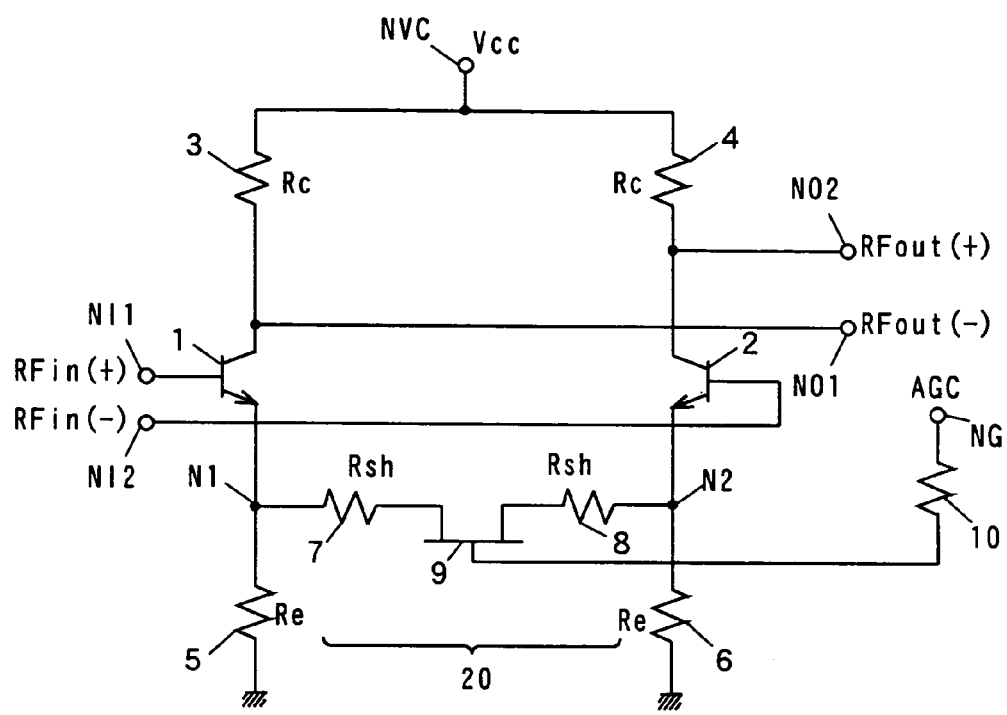
FIG. 1 is a circuit diagram showing the structure of a variable gain differential amplifier according to a first embodiment of the present invention.

FIG. 1 is a circuit diagram showing the structure of a variable gain differential amplifier according to a first embodiment of the present invention.

The variable gain differential amplifier shown in FIG. 1 comprises bipolar transistors (hereinafter abbreviated to transistors) 1, 2, resistances 3, 4, 5, 6, 10, shunt resistances 7, 8, and an n-MOSFET (hereinafter abbreviated to FET) 9. The shunt resistances 7, 8 form a variable resistance circuit 20. A bias voltage is determined by the resistances 3, 4, 5, 6.

The base of the transistor 1 is connected to an input terminal NI1 receiving an input signal RFin(+), and the base of the transistor 2 is connected to an input terminal NI2 receiving an input signal RFin(−). The input signals RFin(+) and RFin(−) are differential inputs. The collectors of the transistors 1, 2 are connected to a power supply terminal NVC receiving a power supply voltage VCC via the resistances 3, 4, respectively. The emitters of the transistors 1, 2 are connected to ground terminals via the resistances 5, 6, respectively. The collectors of the transistors 1, 2 are connected to output terminals NO1, NO2, respectively. Output signals RFout(−), RFout(+) are derived from the output terminals NO1, NO2, respectively. The output signals RFout(+) and RFout(−) are differential outputs.

The shunt resistance 7, FET 9, and shunt resistance 8 are connected in series between nodes N1 and N2 that are connected to the respective emitters of the transistor 1, 2. The gate of the FET 9 is connected via the resistance 10 to a control voltage NG receiving a control voltage AGC.

The resistances 3, 4 have an equal resistance value Rc; the resistances 5, 6 have an equal resistance value Re; and the shunt resistances 7, 8 have an equal resistance value RSh.

In the present embodiment, the transistor 1 corresponds to a first transistor; the transistor 2 corresponds to a second transistor; the resistances 7, 8 correspond to first and second resistive elements, respectively; and the FET 9 corresponds to a variable impedance device. In addition, the resistance 3 corresponds to a first load; the resistance 4 corresponds to a second load; the resistance 5 corresponds to a first impedance device; and the resistance 6 corresponds to a second impedance device. Further, the variable resistance circuit 20 corresponds to a variable impedance circuit.

Figure 2:
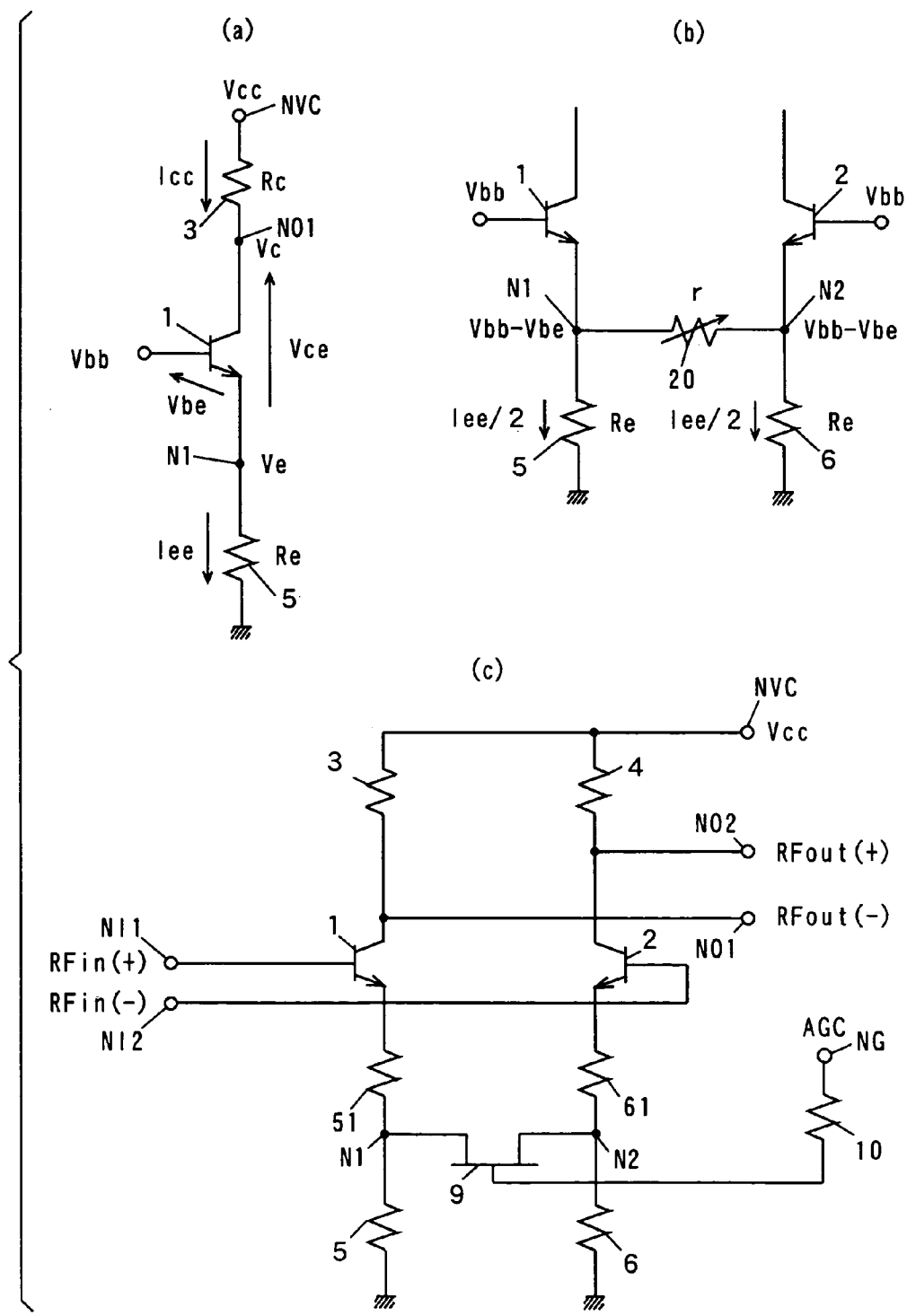
FIG. 2 is a diagram showing the operation of the variable gain differential amplifier shown in FIG. 1.

Using now FIGS. 2(a), (b), (c), the operation of the variable gain differential amplifier shown in FIG. 1 is described. FIG. 2(a) shows a half side of the variable gain differential amplifier including the transistor 1 shown in FIG. 1; FIG. 2(b) shows the transistors 1, 2, resistances 5, 6, and schematized variable resistance circuit 20 in the variable gain differential amplifier shown in FIG. 1. In addition, FIG. 2(c) is a diagram showing a method for improving intermodulation distortion at a high input voltage level in a differential amplifier or a Gilbert-cell multiplier as Comparative Example.

In the Comparative Example shown in FIG. 2(c), in order to improve the intermodulation distortion at a high input level, resistances 51, 61 are inserted between the emitter of transistor 1 and a node N1 and between the emitter of transistor 2 and a node N2, respectively, so that the distortion of a FET 9 can be alleviated.

In the structure of Comparative Example, however, the resistances 51, 61 develop voltage drop to vary the operating current.

In the variable gain differential amplifier shown in FIG. 1, on the other hand, the shunt resistances 7, 8 are connected across the FET 9 serving as the variable gain control circuit, so as to achieve reduced distortion without variation of the operating current, as described later.

Referring to FIG. 2(a), a method for determining a bias current and an operating current will be explained. It is assumed here that Vcc represents the power supply voltage; Vbb represents the base voltage of the transistor 1; Vc represents the collector voltage; Ve represents the emitter voltage; Vbe represents the base-emitter voltage; and Vce represents the collector-emitter voltage. Assuming that Rc represents the collector resistance (resistance value of resistance 3) of the transistor 1; Re represents the emitter resistance (resistance value of resistance 5); Icc represents the collector current; and Iee represents the emitter current, the following equations (1) to (5) hold:

$$Vbb = Vbe + Ve = Vbe + Re \cdot Iee \quad (1)$$

$$Iee = (Vbb - Vbe)/Re \quad (2)$$

$$Vcc = Icc \cdot Rc + Vce + Ve = Icc \cdot Rc + Vce + Re \cdot Iee \quad (3)$$

$$Icc \approx Iee \quad (4)$$

$$Vcc = Icc \cdot (Rc + Re) + Vce \quad (5)$$

Note that in the circuit of FIG. 2(a), the operating current is equal to the emitter current Iee. When the base voltage Vbe and emitter resistance Re are determined in accordance with the above equation (2), the operating current Iee of the transistor 1 is determined. A decrease in the emitter resistance Re increases the operating current Iee.

In FIG. 2(b), r is a resistance value of the variable resistance circuit 20. When it is assumed that the nodes N1, N2 are at the same potential, the operating current Iee for FIG. 2(a) can be expressed by the following equation (6):

$$Iee = 2 \cdot (Vbb - Vbe)/Re \quad (6)$$

It can be seen from the above equation (6) that the operating current Iee for the circuit of FIG. 2(b) is not dependent upon the resistance value r of the variable resistance circuit 20, and is held constant even when the resistance value r of the variable resistance circuit 20 varies.

Consequently, in the variable gain differential amplifier shown in FIG. 1, the distortion can be reduced without variation of the operating current Iee.

Here, in the example of the variable gain differential amplifier shown in FIG. 1, the values of sizes of the emitters and the like for the transistors 1, 2 were selected to be suitable for the reduction of noise. The power supply source Vcc was set to 3 V. The resistance value Rc of the resistances 3, 4 was set to 250Ω, the resistance value Re of the resistances 5, 6 was set to 250Ω, and the resistance value Rsh of the shunt resistances 7, 8 was set to 25Ω such that the total circuit current (operating current) would be 5 mA. In addition, a control voltage AGC in a range of 3 V to 0 V was applied to the control terminal NG for gain control. The voltage drop on the resistances 5, 6 were approximately 0.62 V, and the total circuit current did not vary by variation of the resistance value Rsh of the shunt resistances 7, 8. It was therefore found that the distortion characteristics can be improved without variation of the operating current Iee.

(Second Embodiment)

Figure 3:
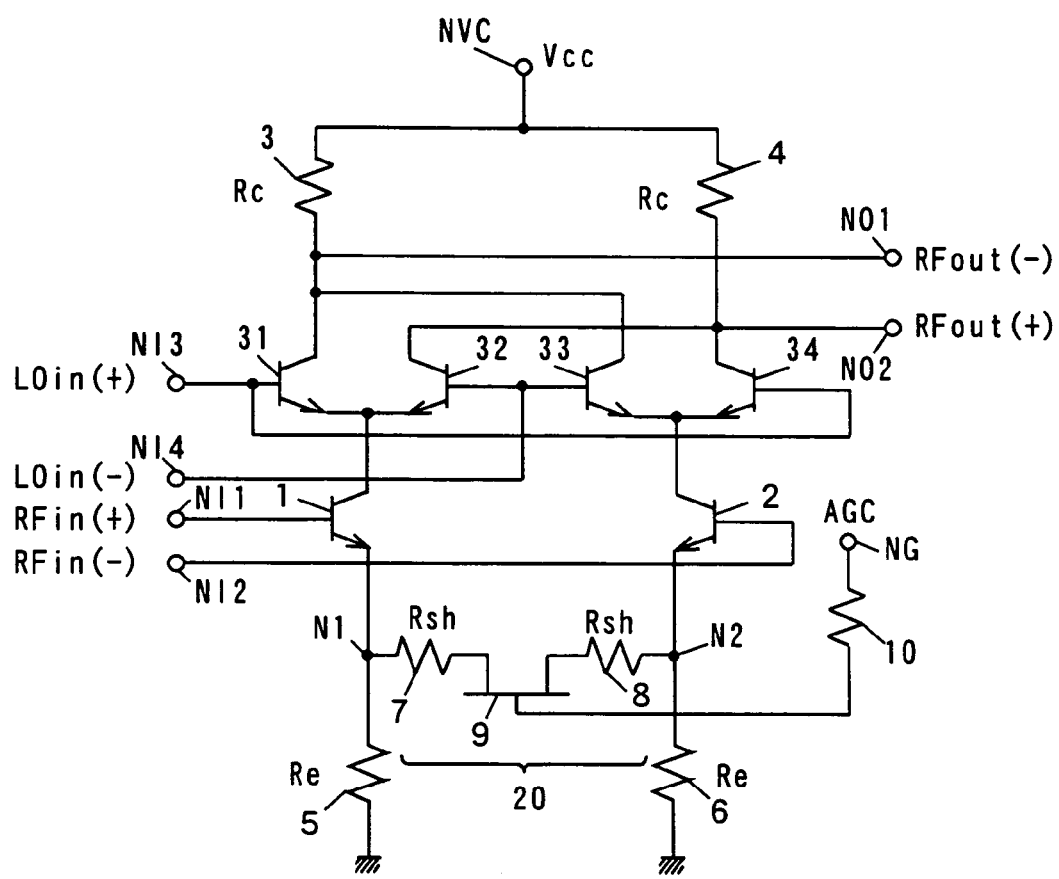
FIG. 3 is a circuit diagram showing the structure of a Gilbert-cell multiplier according to a second embodiment of the present invention.

FIG. 3 is a circuit diagram showing the structure of a Gilbert-cell multiplier (mixer) according to a second embodiment of the present invention.

The Gilbert-cell multiplier shown in FIG. 3 comprises bipolar transistors (hereinafter abbreviated to transistors) 1, 2, 31, 32, 33, 34, resistances 3, 4, 5, 6, 10, shunt resistances 7, 8, and an n-MOSFET (hereinafter abbreviated to FET) 9. The shunt resistances 7, 8 and the FET 9 form a variable resistance circuit 20. A bias voltage is determined by the resistances 3, 4, 5, 6.

The base of the transistor 1 is connected to an input terminal NI1 receiving an input signal RFin(+), and the base of the transistor 2 is connected to an input terminal NI2 receiving an input signal RFin(−). The input signals RFin (+), RFin(−) are differential inputs. The transistors 31, 32 are inserted between the collector of the transistor 1 and an output terminal NO1 and between the collector of the transistor 1 and an output terminal NO2, respectively. The transistors 33, 34 are further inserted between the collector of the transistor 2 and an output terminal NO1 and between the collector of the transistor 2 and an output terminal NO2, respectively. The bases of the transistors 31, 34 are connected to an input terminal NI 3 receiving an input signal LOin(+), and the bases of the transistors 32, 33 are connected to an input terminal NI 4 receiving an input signal LOin(−). The input signals LOin(+) and LOin(−) are differential inputs. The collectors of the transistors 31, 33 are connected via the resistance 3 to a power supply terminal NVC receiving a power supply voltage Vcc. The collectors of the transistors 32, 34 are connected to the power supply terminal NVC via the resistance 4.

Otherwise, the structure of the Gilbert-cell multiplier shown in FIG. 3 is the same as that of the variable gain differential amplifier shown in FIG. 1.

In the present embodiment, the transistor 31 corresponds to a first transistor; the transistor 32 corresponds to a second transistor; the transistor 33 corresponds to a third transistor; the transistor 34 corresponds to a fourth transistor; the transistor 1 corresponds to a fifth transistor; and the transistor 2 corresponds to a sixth transistor. The shunt resistances 7, 8 correspond to first and second resistive elements, respectively; and the FET 9 corresponds to a variable impedance device. Further, the resistance 3 corresponds to a first load; the resistance 4 corresponds to a second load; the resistance 5 corresponds to a first impedance device; and the resistance 6 corresponds to a second impedance device. The variable resistance circuit 20 corresponds to a variable impedance circuit.

It is assumed here that one differential input signal is expressed by RF=RFin(+)−RFin(−); another differential input signal is expressed by LO=LOin(+)−LOin(−); and a differential output signal is expressed by IF=IFout(+)−IFout (−). Assuming that $f_{RF}$ represents the frequency of the differential input signal RF; $f_{LO}$ represents the frequency of the differential input signal LO; and $f_{IF}$ represents the frequency of the differential output signal IF, the following equation holds:

$$f_{IF}=f_{RF}\pm f_{LO}$$

Assuming, for example, that the frequency $f_{RF}$ of the differential input signal RF is 1.1 Ghz, and the frequency $f_{LO}$ of the differential input signal LO is 1 GHz, the frequency $f_{IF}$ of the differential output signal IF is 2.1 GHz and 100 MHz. The Gilbert-cell multiplier shown in FIG. 3 can be therefore used as a downconverter by removing the frequency $f_{IF}$ of 100 MHz.

Similarly in the Gilbert-cell multiplier shown in FIG. 3, as in the variable gain differential amplifier shown in FIG. 1, the distortion characteristics can be improved without variation of the operating current.

The distortion characteristics of the Gilbert-cell multiplier shown in FIG. 3 were then calculated. FIG. 4 is a diagram showing the calculation result of dependence of the distortion characteristics of the Gilbert-cell multiplier shown in FIG. 3 on the resistance value Rs of the variable impedance circuit. Here, the resistance value Rs of the variable impedance circuit was varied to calculate third-order intermodulation distortion.

As can be seen from FIG. 4, the third-order intermodulation distortion is reduced with the increasing resistance value Rs of the variable impedance circuit. Also in this case, there is no variation in the operating current. Consequently, also in the Gilbert-cell multiplier shown in FIG. 3, the distortion characteristics can be improved without variation of the operating current.

(First Example of Variable Resistance Circuit)

Figure 5:
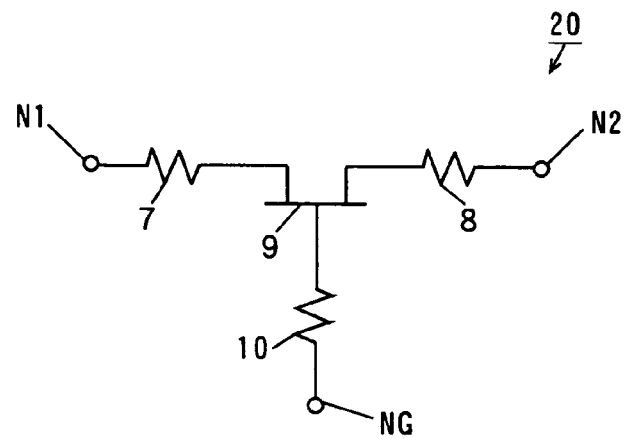
FIG. 5 is a circuit diagram showing the variable resistance circuit used for the variable gain differential amplifier shown in FIG. 1 and the Gilbert-cell multiplier shown in FIG. 3.

FIG. 5 is a circuit diagram showing the variable resistance circuit 20 used for the variable gain differential amplifier shown in FIG. 1 and the Gilbert-cell multiplier shown in FIG. 3.

The variable resistance circuit 20 shown in FIG. 5 comprises shunts resistances 7, 8, resistance 10, and a FET 9. The shunt resistance 7, FET 9, and shunt resistance 8 are connected between nodes N1 and N2. The nodes N1 and N2 are supplied with the same potential. The gate of the FET 9 is connected to a control terminal NG via the resistance 10. A control voltage AGC is applied to the control terminal NG.

In the variable resistance circuit 20 shown in FIG. 5, variation of the control voltage AGC can vary an impedance between the nodes N1 and N2 with the nodes N1 and N2 being at the same potential. In this case, because the nodes N1 and N2 are at the same potential, no current flows in the shunt resistance 7, FET 9, and shunt resistance 8. Consequently, power consumption is not increased in any circuit with the addition of the variable resistance circuit 20.

The use of variable resistance circuit 20 shown in FIG. 5 is not limited by the variable gain differential amplifier shown in FIG. 1 and the Gilbert-cell multiplier shown in FIG. 3. The variable resistance circuit may be used in any case where an impedance between nodes N1 and N2 is varied with the nodes N1 and N2 being at the same potential, and therefore be applicable to various types of circuits.

(Third Embodiment)

Figure 6:
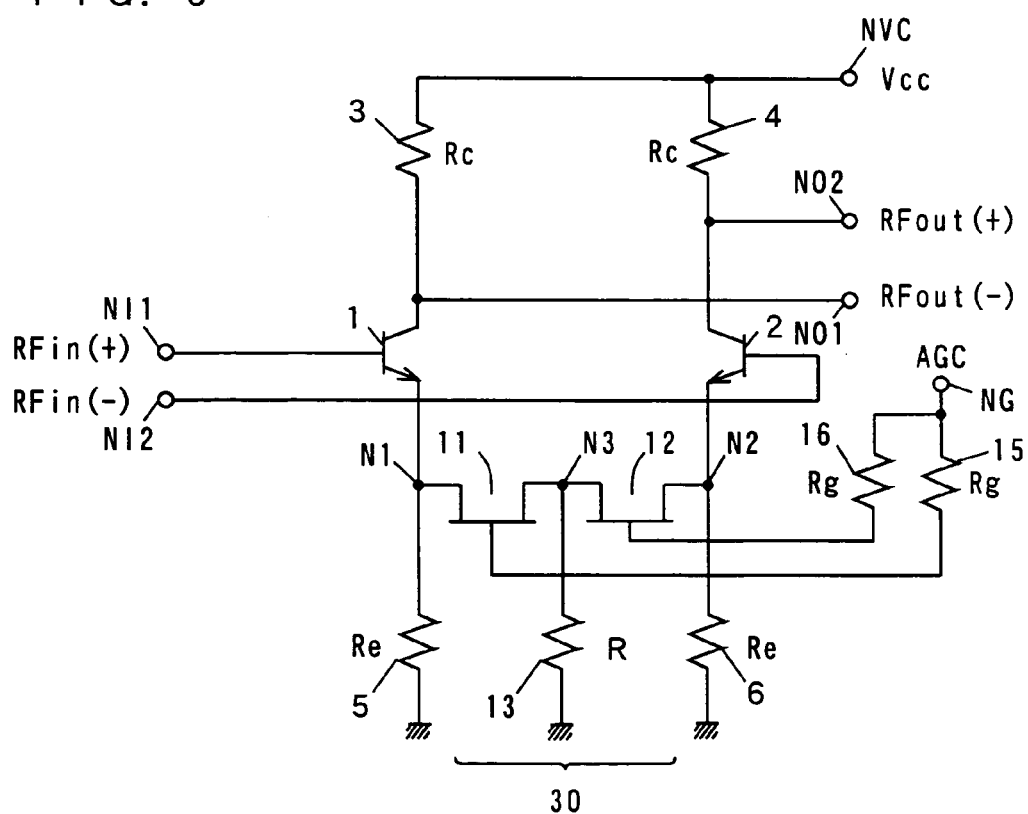
FIG. 6 is a circuit diagram showing the structure of a variable gain differential amplifier according to a third embodiment of the present invention.

FIG. 6 is a circuit diagram showing the structure of a variable gain differential amplifier according to a third embodiment of the present invention.

The variable gain differential amplifier shown in FIG. 6 differs from the variable gain differential amplifier shown in FIG. 1 in that it is provided with a variable resistance circuit 30 in place of the variable resistance circuit 20.

The variable resistance circuit 30 comprises FETs 11, 12, and resistances 13, 15, 16. The FETs 11, 12 are connected in series between nodes N1 and N2. The gates of the FETs 11, 12 are connected to a control terminal NG receiving a control voltage AGC via the resistances 15, 16, respectively.

The resistances 3, 4 have an equal resistance value Rc; the resistances 5, 6 have an equal resistance value Re; and the resistances 15, 16 have an equal resistance value Rg.

Otherwise, the structure of the variable gain differential amplifier shown in FIG. 6 is the same as that of the variable gain differential amplifier shown in FIG. 1.

In the present embodiment, the transistor 1 corresponds to a first transistor; the transistor 2 corresponds to a second transistor; the FET1 corresponds to a first variable impedance device; and the FET12 corresponds to a second variable impedance device. The resistance 3 corresponds to a first load; the resistance 4 corresponds to a second load; the resistance 5 corresponds to a first impedance device; and the resistance 6 corresponds to a second impedance device. Further, the variable resistance circuit 30 corresponds to a variable impedance circuit.

Now using FIG. 7, the operation of the variable gain differential amplifier shown in FIG. 6 is described. FIG. 7 is a diagram showing the transistors 1, 2, resistances 5, 6, schematized variable resistance circuit 30 in the variable gain differential amplifier shown in FIG. 6.

In the variable gain differential amplifier shown in FIG. 6, the two FETs 11, 12 are connected in series between the nodes N1 and N2, and anode 3 between the two FETs 11 and 12 is connected to a ground terminal via the resistance 13, thus allowing a flow of operating current depending on the gain, as described later.

In FIG. 7, r represents each of the resistance values of the FETs 11, 12 in the variable resistance circuit 30, and R represents the resistance value of the resistance 13. Assuming that Ir represents a current flowing in each of the FETs 11, 12, the current flowing in the resistance 13 is 2Ir. In the case where the nodes N1, N2 are at the same potential, the operating current Iee' for FIG. 7 is expressed by the following equation (7):

$$Iee'=2\cdot(Vbb-Vbe)/Re+(Vbb-Vbe)/\{(R+(r/2)\} \tag{7}$$

It can be seen from the above equation (7) that the operating current Iee' of the circuit shown in FIG. 7 varies depending on the resistance value r of each of the FETs 11, 12 in the variable resistance circuit 30. In other words, a decrease in the resistance value r of each of the FETs 11, 12 in the variable resistance circuit 30 increases the gain while increasing the operating current Iee'.

This allows the variable gain differential amplifier shown in FIG. 6 to operate at a higher current when the gain increases, and operate at a lower current when the gain decreases (during attenuation.) Accordingly, it is possible to set the operating current according to an output power level, so as to suppress the saturation of input/output characteristics.

The operating current and input/output characteristics of the variable gain differential amplifier shown in FIG. 6 were calculated.

The values of sizes of the emitters and the like for the transistors 1, 2 were selected to be suitable for the reduction of noise. The power supply Vcc was 3 V, and the base-emitter resistance Vbe was approximately 0.85 V. The resistance value Rc of the resistances 3, 4 was set to 250Ω; the resistance value Re of the resistances 5, 6 was set to 250Ω; and the resistance value R of the resistance 13 was set to 62.5Ω, i.e., ¼ the resistance value Re such that the operating current would be approximately 5 mA (when the control voltage AGC is 0 V). A control voltage AGC in a range of 3 V to 0 V was further applied to the control terminal NG for gain control.

Figure 8:
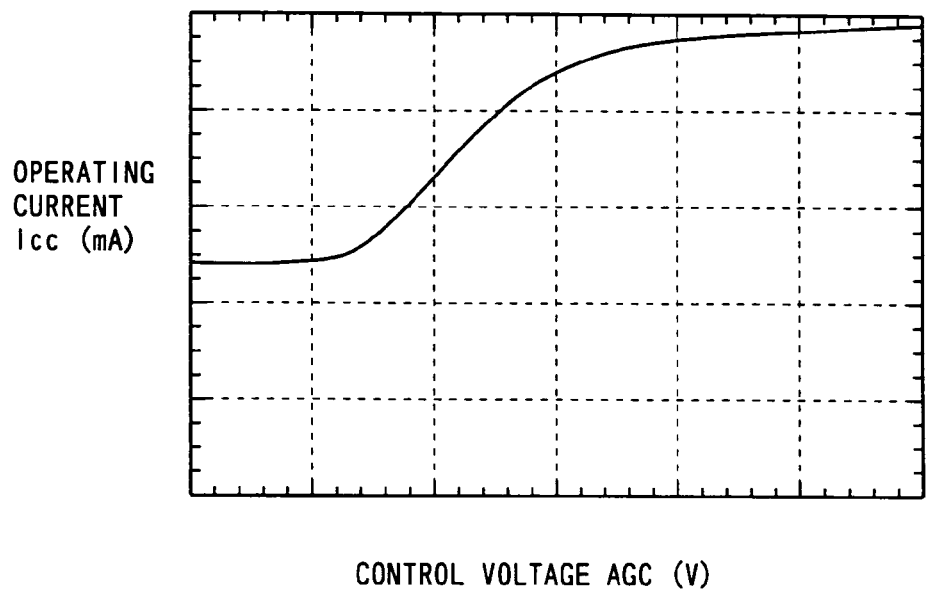
FIG. 8 is a diagram showing the calculation result of dependence of the operating current of the variable gain differential amplifier shown in FIG. 6 on a control voltage.
Figure 9:
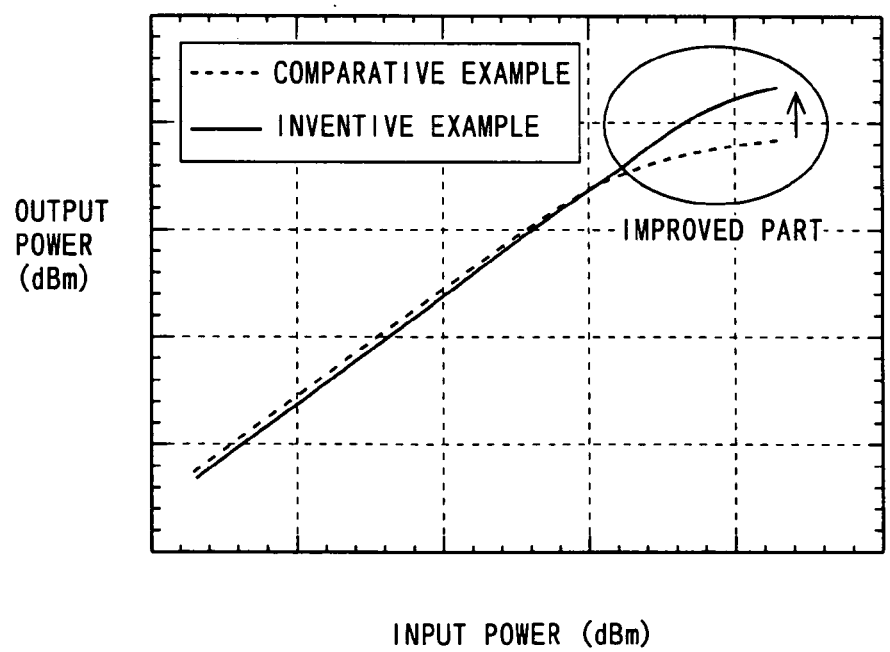
FIG. 9 is a diagram showing the calculation result of the input/output characteristics of the variable gain differential amplifier shown in FIG. 6 as Inventive Example, and the calculation result of the input/output characteristics of the variable gain differential amplifier shown in FIG. 35 as Comparative Example.
Figure 35:
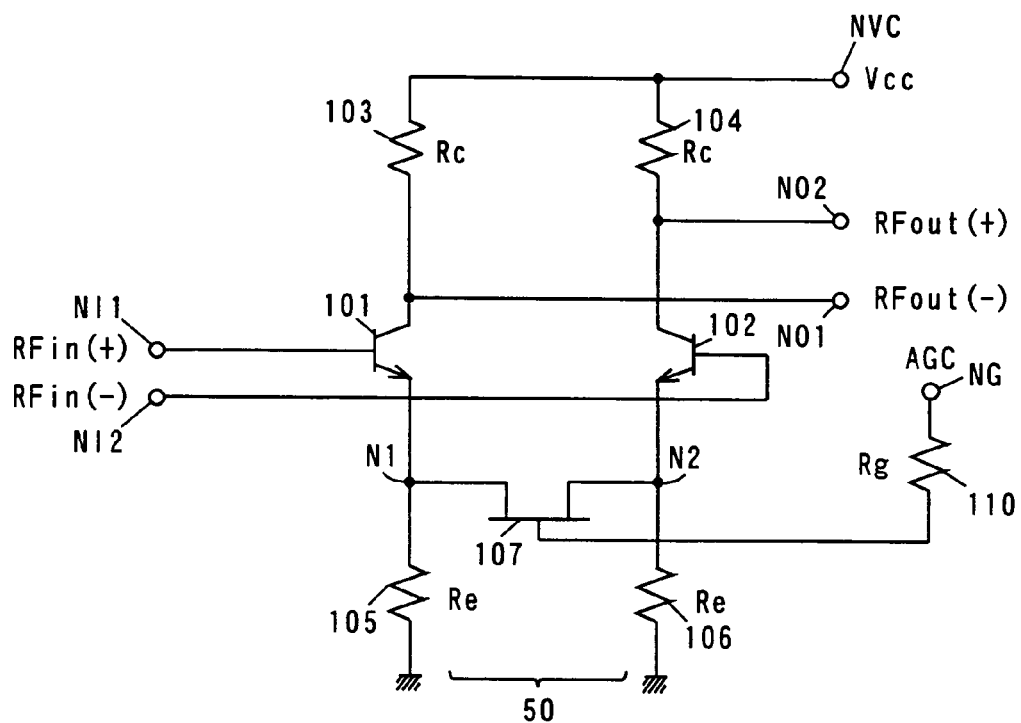
FIG. 35 is a circuit diagram of a conventional variable gain differential amplifier having the OTA structure.
Figure 36:
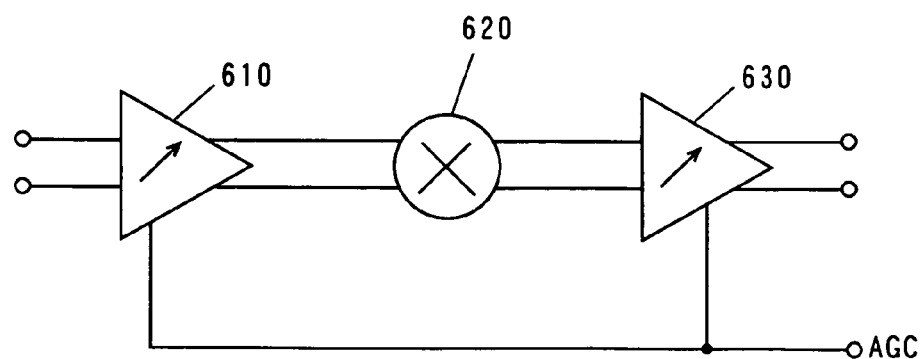
FIG. 36 is a diagram showing the structure of a conventional differential input/output high-frequency circuit used for a high-frequency receiver.
Figure 37:
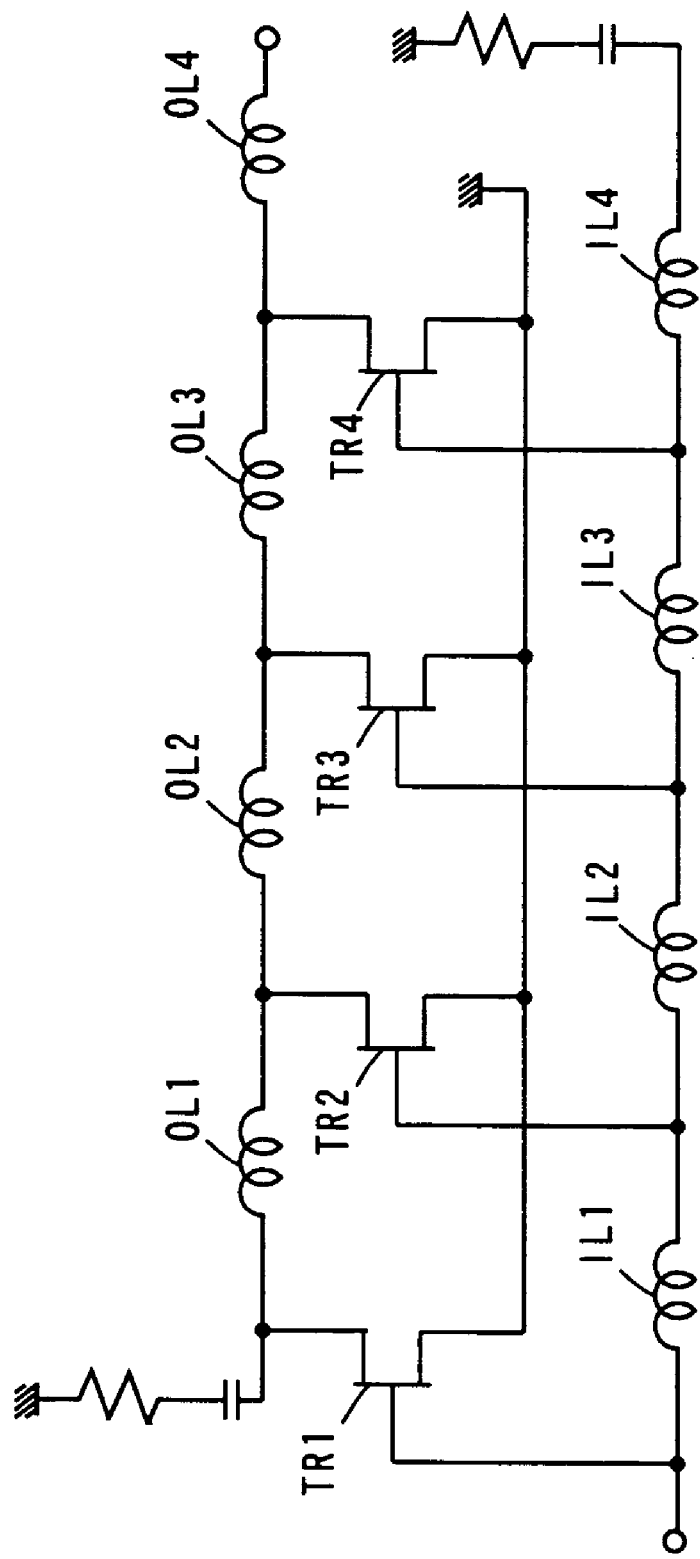
FIG. 37 is a circuit diagram showing one example of the structure of a conventional distributed amplifier.

FIG. 8 is a diagram showing the calculation result of dependence of the operating current of the variable gain differential amplifier shown in FIG. 6 on the control voltage AGC. FIG. 9 shows the calculation result of the input/output characteristics of the variable gain differential amplifier shown in FIG. 6 as Inventive Example, and the calculation result of the input/output characteristics of the variable gain differential amplifier shown in FIG. 35 as Comparative Example.

As can be seen from FIG. 8, in the variable gain differential amplifier shown in FIG. 6, the operating current varies approximately by a factor of two with the varying control voltage AGC. Moreover, as can be seen from FIG. 9, in the variable gain differential amplifier as Inventive Example, the saturation that occurs at high gain is improved compared with the case for the variable gain differential amplifier as Comparative Example. Consequently, in the variable gain differential amplifier as Inventive Example, the linearity of the input/output characteristics is increased to improve the distortion characteristics.

(Fourth Embodiment)

FIG. 10 is a circuit diagram showing the structure of a variable gain differential amplifier according to a fourth embodiment of the present invention.

The variable gain differential amplifier shown in FIG. 10 differs from the variable gain differential amplifier shown in FIG. 6 in that a load circuit 50 is provided in place of the resistances 3, 4, and n-MOSFETs 1a, 2a are provided in place of the transistors 1, 2. While FIG. 10 denotes power supply sources 5a, 6a in place of the resistances 5, 6, high-impedance transistors may be used for the power supply sources 5a, 6a. As the load circuit 50, another device, such as a resistive device, a capacitive device (e.g., capacitor), an inductive element (e.g., inductor or transformer), a transistor (e.g., MOSFET, MESFEET (Metal Semiconductor Field Effect Transistor), or bipolar transistor), or a circuit formed by a combination of these devices may also be used.

Otherwise, the structure of the variable gain differential amplifier shown in FIG. 10 is the same as that of the variable gain differential amplifier shown in FIG. 6.

Similarly in the variable gain differential amplifier according to the present embodiment, as in the variable gain differential amplifier according to the third embodiment, the operating current increases at higher gain, and decreases at lower gain (during attenuation.) This improves the saturation of input/output characteristics at high gain. As a result, the linearity of input/output characteristics is increased to improve the distortion characteristics.

(Fifth Embodiment)

Figure 11:
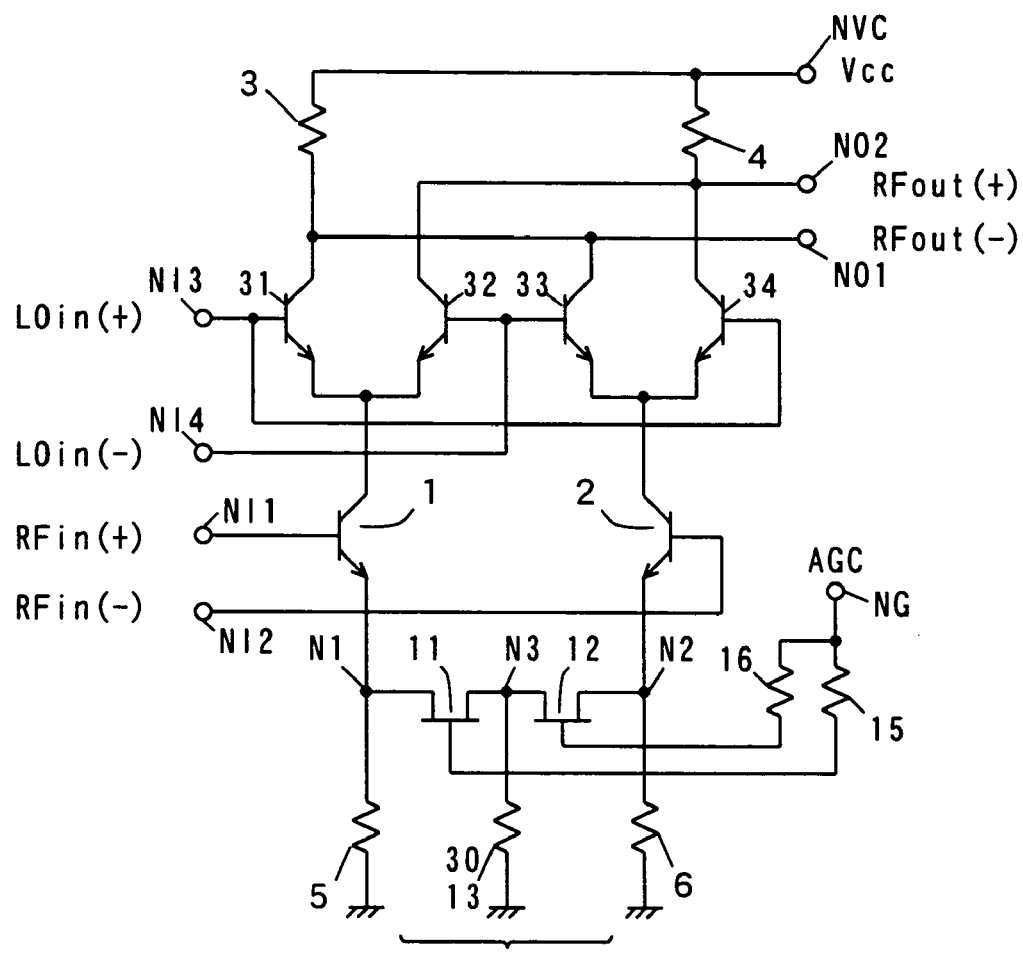
FIG. 11 is a circuit diagram showing the structure of a Gilbert-cell multiplier (mixer) according to a fifth embodiment of the present invention.

FIG. 11 is a circuit diagram showing the structure of a Gilbert-cell multiplier (mixer) according to a fifth embodiment of the present invention.

The Gilbert-cell multiplier shown in FIG. 11 comprises bipolar transistors (hereinafter abbreviated to transistors) 1, 2, 31, 32, 33, 34, resistances 3, 4, 5, 6, 13, 15, 16, and n-MOSFETs (hereinafter abbreviated to FETs) 11, 12. The resistances 13, 15, 16 and FETs 11, 12 form a variable resistance circuit 30.

The base of the transistor 1 is connected to an input terminal NI1 receiving an input signal RFin(+), and the base of the transistor 2 is connected to an input terminal NI2 receiving an input signal RFin(−). The input signals RFin (+), RFin(−) are differential inputs. The transistors 31, 32 are inserted between the collector of the transistor 1 and an output terminal NO1 and between the collector of the transistor 1 and an output terminal NO2, respectively. The transistors 33, 34 are further inserted between the collector of the transistor 2 and the output terminal NO1 and between the collector of the transistor 2 and the output terminal NO2, respectively. The bases of the transistors 31, 34 are connected to an input terminal NI3 receiving an input signal LOin(+), and the bases of the transistors 32, 33 are connected to an input terminal NI4 receiving an input signal LOin(−). The input signals LOin(+), LOin(−) are differential inputs. The collectors of the transistors 31, 33 are connected via the resistance 3 to a power supply terminal NVC receiving a power supply voltage Vcc. The collectors of the transistors 32, 34 are connected to the power terminal NVC via the resistance 4.

Otherwise, the structure of the Gilbert-cell multiplier shown in FIG. 11 is the same as that of the variable gain differential amplifier shown in FIG. 6.

In the present embodiment, the transistor 31 corresponds to a first transistor; the transistor 32 corresponds to a second transistor; the transistor 33 corresponds to a third transistor; the transistor 34 corresponds to a fourth transistor; the transistor 1 corresponds to a fifth transistor; and the transistor 2 corresponds to a sixth transistor. The resistance 3 corresponds to a first load; the resistance 4 corresponds to a second load; the resistance 5 corresponds to a first impedance device; and the resistance 6 corresponds to a second impedance device. Further, the variable resistance circuit 30 corresponds to a variable impedance circuit.

Similarly in the Gilbert-cell multiplier according to the present embodiment, as in the variable gain differential amplifier according to the fourth embodiment, the operating current increases at higher gain, and decreases at lower gain (during attenuation.) This improves the saturation of input/output characteristics at high gain. As a result, the linearity of input/output characteristics is increased to improve the distortion characteristics.

(Sixth Embodiment)

FIG. 12 is a circuit diagram showing the structure of a Gilbert-cell multiplier (mixer) according to a sixth embodiment of the present invention.

The Gilbert-cell multiplier shown in FIG. 12 differs from the Gilbert-cell multiplier shown in FIG. 11 in that n-MOSFETs 1a, 2a, 31a, 32a, 33a, 34a are used in place of the transistors 1, 2, 31, 32, 33, 34; a load circuit 50 is used in place of the resistances 3, 4; impedance devices 5a, 6a are provided as power supply sources in place of the resistances 5, 6; and a common resistance 17 is used in place of the resistances 15, 16. The load circuit 50 and the impedance devices 5a, 6a are the same as those shown in FIG. 10.

Similarly in the Gilbert-cell multiplier according to the present embodiment, as in the variable gain differential amplifier according to the fourth embodiment, the operating current increases at higher gain, and decreases at lower gain (during attenuation.) This improves the saturation of input/output characteristics at high gain. As a result, the linearity of input/output characteristics is increased to improve the distortion characteristics.

(Second Example of Variable Resistance Circuit)

Figure 13:
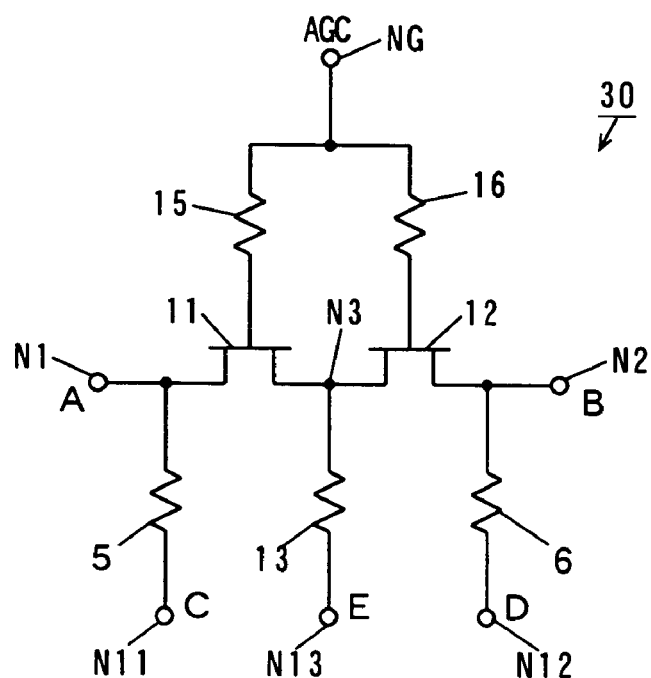
FIG. 13 is a circuit diagram showing the variable resistance circuit used in the variable gain differential amplifiers shown in FIGS. 6 and 10 as well as in the Gilbert-cell multipliers shown in FIGS. 11 and 12.

FIG. 13 is a circuit diagram showing the variable resistance circuit 30 used in the variable gain differential amplifiers shown in FIGS. 6 and 10 as well as in the Gilbert-cell multipliers shown in FIGS. 11 and 12.

The variable resistance circuit 30 shown in FIG. 13 comprises FETs 11, 12 and resistances 13, 15, 16. The FETs 11, 12 are connected in series between nodes N1 and N2. Further, the node N1 is connected to a node N11 via a resistance 5, and the node N2 is connected to a node N12 via a resistance 6. A node N3 between the FETs 11 and 12 is connected to a node N13 via the resistance 13. The gates of the FETs 11, 12 are connected to a control terminal NG via the resistances 15, 16, respectively.

The nodes N1, N2 are supplied with voltages A, B, respectively. The nodes N11, N12 are supplied with voltages C, D, respectively, and the node N13 is supplied with a voltage E. A control voltage AGC is applied to the control terminal NG. The voltages A, B are equal, and the voltages C, D, E may be equal or different.

It is assumed here that the voltages A, B are equal, the voltages C, D are equal, and the voltages C, D, E are different from the voltages A, B. In this case, currents flowing in the resistances 5, 6, 13 can be varied depending on the control voltage AGC. Consequently, the variable resistance circuit 30 can be used as a variable current source. In particular, when the voltages C, D, E are equal, a product of the resistances 5, 6, 13 and the currents flowing in the respective resistances is constant.

The variable resistance circuit 30 may be applicable to various types of circuits as a variable current source, without being limited to the variable gain differential amplifiers shown in FIGS. 6 and 10, and the Gilbert-cell multipliers shown in FIGS. 11 and 12.

(Seventh Embodiment)

Figure 14:
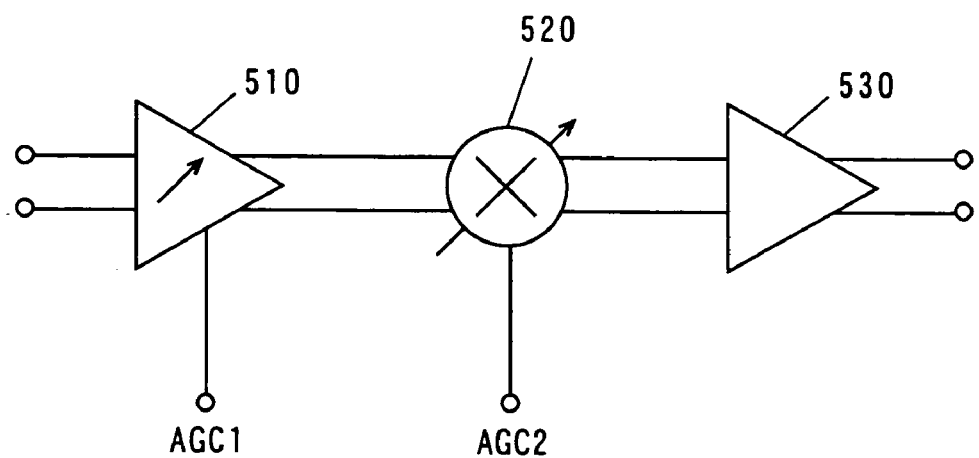
FIG. 14 is a diagram showing the structure of a differential input/output high-frequency circuit according to a seventh embodiment.

FIG. 14 is a diagram showing the structure of a differential input/output high-frequency circuit according to a seventh embodiment. The differential input/output high-frequency circuit shown in FIG. 14 is used for a high-frequency receiver.

The differential input/output high-frequency circuit shown in FIG. 14 comprises a variable gain amplifier 510, a variable gain multiplier 520, and an intermediate-frequency band amplifier (hereinafter referred to as an IF band amplifier) 530. A differential signal is input to the variable gain amplifier 510, and an amplified differential signal is output from the IF band amplifier 530. The variable gain amplifier 510 and variable gain multiplier 520 are supplied with control voltages AGC1, AGC2, respectively, for controlling each gain. Note that the control voltages AGC1, AGC2 may be a common control voltage. In this case, both the gains of the variable gain amplifier 510 and variable gain multiplier 520 can be controlled by the common control voltage.

The variable gain amplifier 510 is composed of a variable gain differential amplifier with variable gain function; the variable gain multiplier 520 is composed of a Gilbert-cell multiplier with variable gain function; and the IF band amplifier 530 is composed of a differential amplifier without variable gain function.

In the differential input/output high-frequency circuit shown in FIG. 14, a high-frequency signal having a wide frequency range is input to the variable gain amplifier 510, and a constant intermediate-frequency signal is output from the variable gain multiplier 520. Accordingly, a signal input to the IF band amplifier 530 has a constant frequency.

Figure 15:
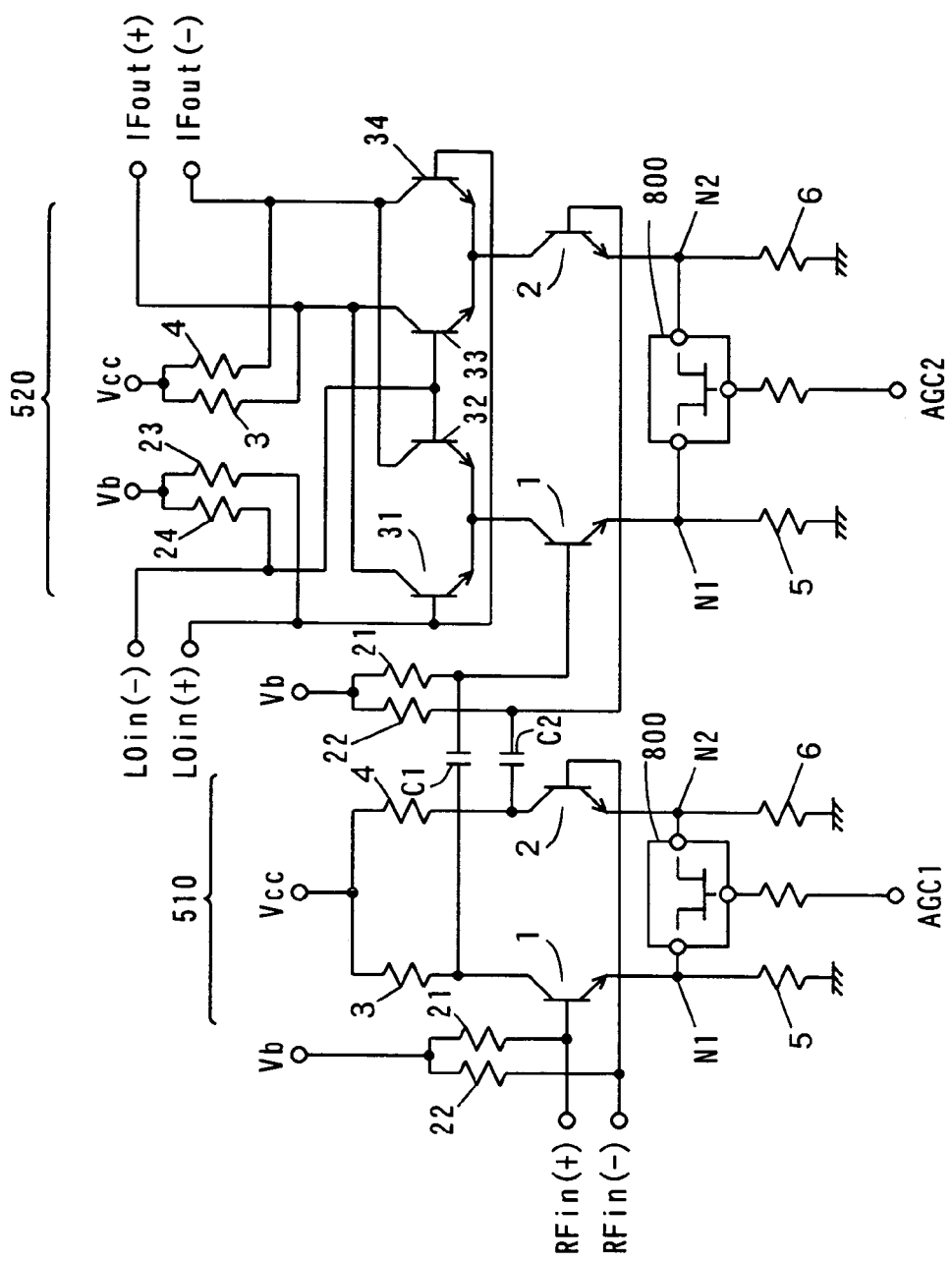
FIG. 15 is a circuit diagram showing a specific circuit structure of each of the variable gain amplifier and variable gain multiplier in the differential input/output high-frequency circuit shown in FIG. 14.

FIG. 15 is a circuit diagram showing a specific circuit structure of each of the variable gain amplifier 510 and variable gain multiplier 520 in the differential input/output high-frequency circuit shown in FIG. 14.

In the differential input/output high-frequency circuit shown in FIG. 15, the variable gain amplifier 510 is composed of a variable gain differential amplifier, and the variable gain multiplier 520 is composed of a Gilbert-cell multiplier.

The variable gain amplifier 510 comprises transistors 1, 2, resistances 3, 4, 5, 6, and a variable resistance circuit 800.

The variable gain multiplier 520 comprises transistors 1, 2, 31, 32, 33, 34, resistances 3, 4, 5, 6, and a variable resistance circuit 800.

In the variable gain amplifier 510, the bases of the transistors 1, 2 receive input signals RFin(+), RFin(−), respectively. The bases of the transistors 1, 2, receive a bias voltage Vb via resistances 21, 22, respectively. The collectors of the transistors 1, 2, receive a power supply voltage Vcc via the resistances 3, 4, respectively. The emitters of the transistors 1, 2 are connected to ground terminals via the resistances 5, 6, respectively. A variable resistance circuit 800 is connected between nodes N1 and N2 connected to the respective emitters of the transistors 1, 2. The collectors of the transistors 1, 2 are connected via interstage capacitors C1, C2, respectively, to the bases of the transistors 1, 2 in the variable gain multiplier 520.

In the variable gain multiplier 520, the bases of the transistors 31, 34 receive an input signal LOin(+), and the bases of the transistors 32, 33 receive an input signal LOin(−). Further, the bases of the transistors 31, 34 receive a bias voltage Vb via a resistance 23, and the bases of the transistors 32, 33 receive the bias voltage Vb via a resistance 24.

The collectors of the transistors 31, 33 receive a power supply voltage Vcc via the resistance 3, and the collectors of the transistors 32, 34 receive the power supply voltage Vcc via the resistance 4. Further, an output signal IFout(+) is derived from each of the collectors of the transistors 31, 33, and an output signal IFout(−) is derived from each of the collectors of the transistors 32, 34.

The emitters of the transistors 31, 32 are each connected to the collector of the transistor 1, and the emitters of the transistors 33, 34 are each connected to the collector of the transistor 2. The variable resistance circuit 800 is connected between nodes N1 and N2 connected to the respective emitters of the transistors 1, 2.

The variable resistance circuits 800 in the variable gain amplifier 510 and the variable gain multiplier 520 are supplied with control voltages AGC1 and AGC2 via respective resistances. The control voltages AGC1, AGC2 may be a common control voltage.

The variable resistance circuit 20 shown in FIG. 1, the variable resistance circuit 30 shown in FIG. 6, the variable resistance circuit 40 shown in FIG. 16, or the variable resistance circuit 70 mentioned below may be used as the variable resistance circuit 800 in the variable gain amplifier 510. The variable resistance circuit 20 shown in FIG. 1, the variable resistance circuit 30 shown in FIG. 6, the variable resistance circuit 40 shown in FIG. 16, or the variable resistance circuit 70 mentioned below may be used as the variable resistance circuit 800 in the variable gain multiplier 520.

In the differential input/output high-frequency circuit shown in FIG. 15, when the input power level is low, the control voltages AGC1, AGC2 are applied such that the resistance value of the variable resistance circuit 800 is minimized. At this time, the variable gain amplifier 510 and variable gain multiplier 520 simultaneously operate with a maximum gain and minimum noise figure. Thus, this differential input/output high-frequency circuit has a maximum receiving sensitivity at a low input power level.

Conversely, when the input power level is high, the control voltages AGC1, AGC2 are applied such that the resistance value of the variable resistance circuit 800 is maximized. At this time, the variable gain amplifier 510 and variable gain multiplier 520 simultaneously operate with a minimum gain. Thus, this differential input/output high-frequency circuit operates with a maximum amount of attenuation at a high input power level, so that the intermodulation distortion and the cross modulation are minimized.

Each of the gain ranges of the variable gain amplifier 510 and variable gain multiplier 520 is a result of multiplication of the gain ranges of the variable gain amplifier 510 and variable gain multiplier 520.

Because the gains are controlled in both the variable gain amplifier 510 and variable gain multiplier 520 in this manner, the high-frequency circuit having a high dynamic range is realized.

Figure 16:
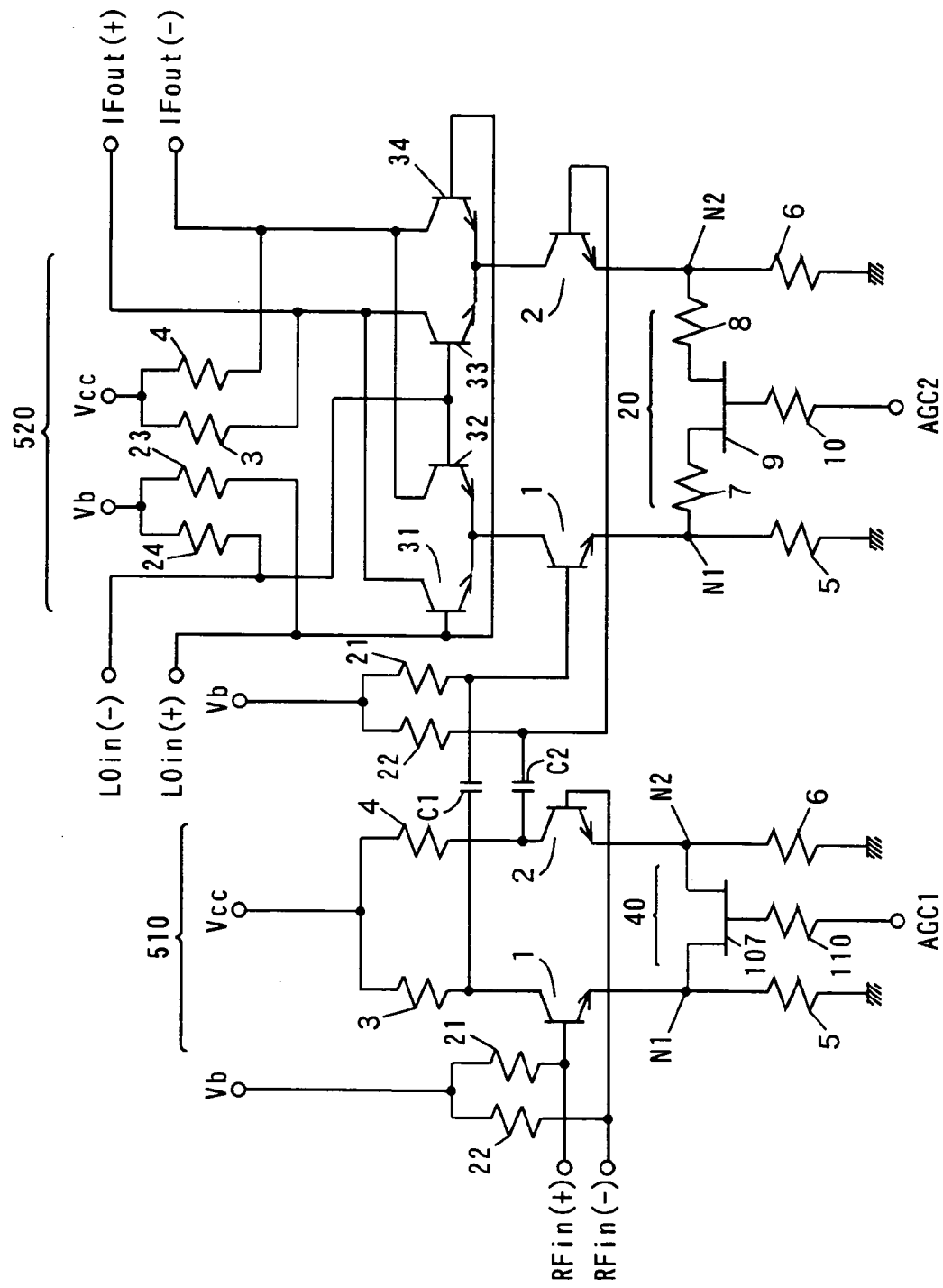
FIG. 16 is a circuit diagram showing a first specific example of each of the variable gain amplifier and the variable gain multiplier shown in FIG. 15.

FIG. 16 is a circuit diagram showing a first specific example of each of the variable gain amplifier 510 and the variable gain multiplier 520 shown in FIG. 15.

In the example of FIG. 16, a variable-resistance circuit 40 is used as the variable resistance circuit 800 of the variable gain amplifier 510, and a variable resistance circuit 20 is used as the variable resistance circuit 800 of the variable gain multiplier 520.

In this case, the distortion characteristics can be improved without variation of the operating current in the variable gain multiplier 520. Consequently, the distortion can be reduced without an increase of the power consumption in the variable gain multiplier 520.

Figure 17:
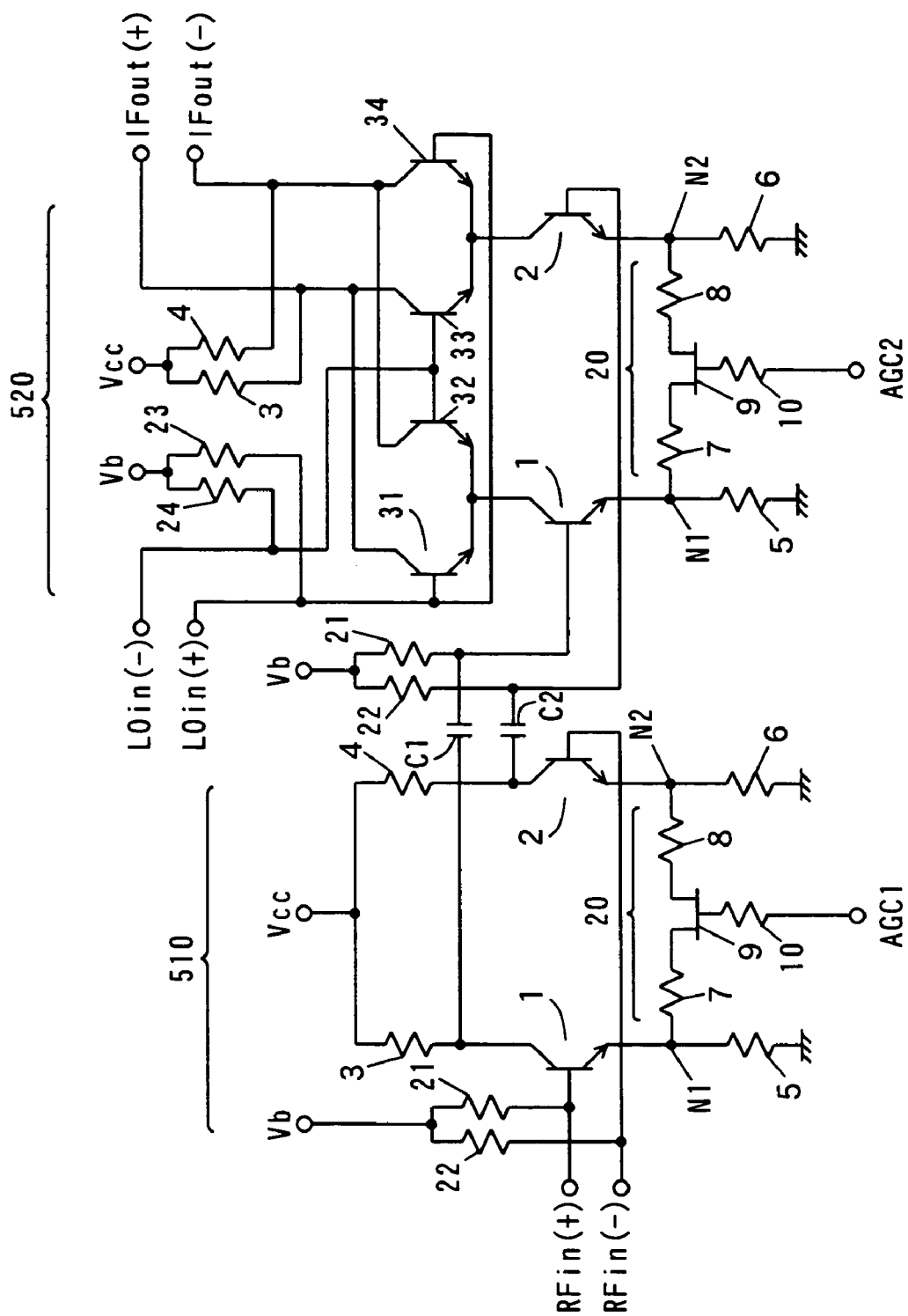
FIG. 17 is a circuit diagram showing a second specific example of each of the variable gain amplifier and the variable gain multiplier shown in FIG. 15.

FIG. 17 is a circuit diagram showing a second specific example of each of the variable gain amplifier 510 and the variable gain multiplier 520 shown in FIG. 15.

In the example of FIG. 17, a variable resistance circuit 20 is used as the variable resistance circuit 800 of the variable gain amplifier 510, and a variable resistance circuit 20 is used as the variable resistance circuit 800 of the variable gain multiplier 520.

In this case, the distortion characteristics can be improved without variations of the operating current in the variable gain amplifier 510 and variable gain multiplier 520. Consequently, the distortion can be sufficiently reduced without an increase of the power consumption.

In the example of the differential input/output high frequency circuit shown in FIG. 17, the values of sizes of the emitters and the like for the transistors 1, 2 were selected to be suitable for the reduction of noise. A power supply voltage Vcc was 3 V. In the variable gain amplifier 510, the resistance value of each of resistances 3, 4 was set to 250Ω; the resistance value of each of resistances 5, 6 was set to 250Ω; and the resistance value of each of shunt resistances 7, 8 in the variable resistance circuit 20 was set to 25Ω such that the operating current would be 5 mA. In the variable gain multiplier 520, the resistance value of resistances 3, 4 was set to 250Ω; the resistance value of resistances 5, 6 was set to 250Ω; and the resistance value of shunt resistances was set to 25Ω such that the operating current would be 4 mA. Common control voltages AGC1, AGC2 were applied to the respective gates of FETs 9 of the variable resistance circuits 20 in the variable gain amplifier 510 and the variable gain multiplier 520 via a resistance 10 having a resistance value as high as approximately 5 kΩ.

Because the power supply voltage Vcc was 3 V, the control voltages AGC1, AGC2 were set to 3 V when the gain is maximized, and the control voltages AGC1, AGC2 were set to 0 V when the gain is minimized (during a maximum attenuation).

In case of variations in the input power level, the control voltages AGC1, AGC2 are varied such that the variable gain amplifier 510 and the variable gain multiplier 520 may operate with a maximum gain and a minimum noise figure when the input power level is presumed to be minimized, and maintain the level of a differential intermediate-frequency signal (output signals IFout(+), IFout(−)) obtained at the time.

This allows simultaneous control of the gains in the variable gain amplifier 510 and the variable gain multiplier 520, and multiplication of the variable gain ranges of the variable gain amplifier 510 and variable gain multiplier 520. Consequently, the high-frequency receiver having a high dynamic range can be realized.

Figure 18:
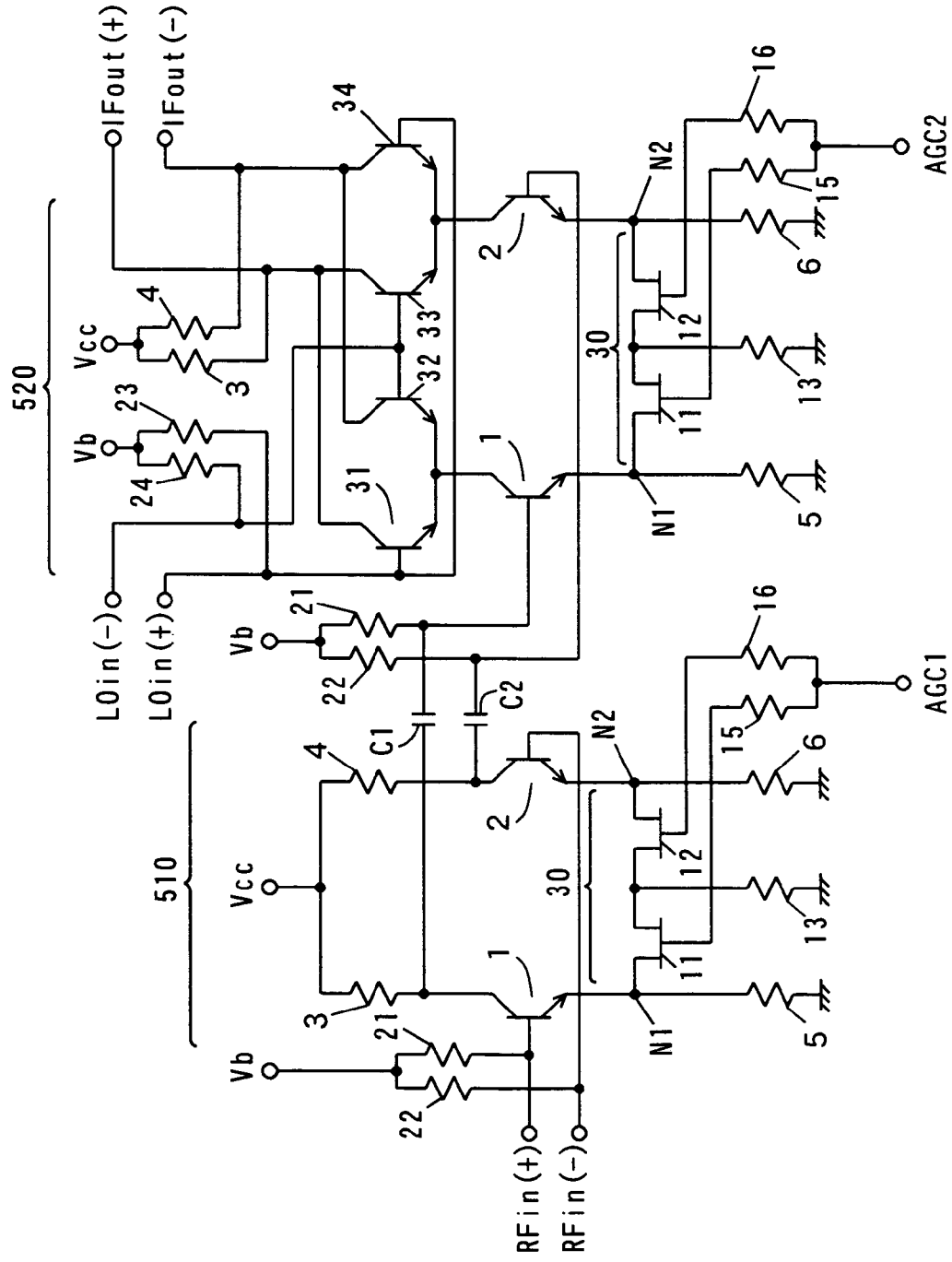
FIG. 18 is a circuit diagram showing a third specific example of each of the variable gain amplifier and the variable gain multiplier shown in FIG. 15.

FIG. 18 is a circuit diagram showing a third specific example of each of the variable gain amplifier 510 and the variable gain multiplier 520 shown in FIG. 15.

In the example of FIG. 18, a variable resistance circuit 30 is used as the variable resistance circuit 800 of the variable gain amplifier 510, and a variable resistance circuit 30 is used as the variable resistance circuit 800 of the variable gain multiplier 520.

In this case, in each of the variable gain amplifier 510 and variable gain multiplier 520, the saturation of the input/output characteristics is improved to increase the linearity of the input/output characteristics, leading to improved distortion characteristics. Consequently, the dynamic range can be greatly improved, and the distortion can also be reduced.

Figure 19:
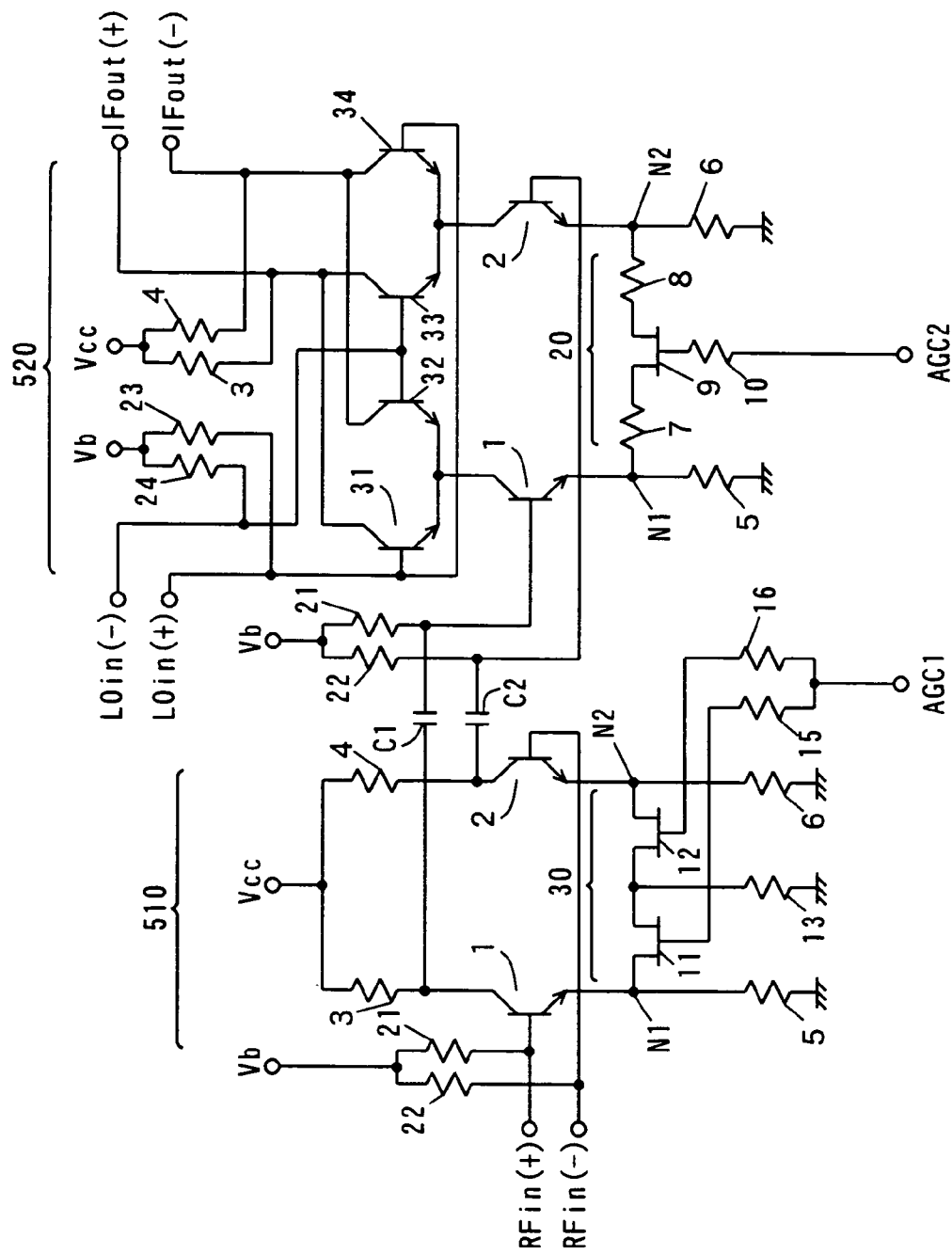
FIG. 19 is a circuit diagram showing a fourth specific example of each of the variable gain amplifier and the variable gain multiplier shown in FIG. 15.

FIG. 19 is a circuit diagram showing a fourth specific example of each of the variable gain amplifier 510 and the variable gain multiplier 520 shown in FIG. 15.

In the example of FIG. 19, a variable resistance circuit 30 is used as the variable resistance circuit 800 of the variable gain amplifier 510, and a variable resistance circuit 20 is used as the variable resistance circuit 800 of the variable gain multiplier 520.

In this case, in the variable gain amplifier 510, the saturation of the input/output characteristics at high gain is improved to increase the linearity of the input/output characteristics, leading to improved distortion characteristics. Moreover, in the variable gain multiplier 520, the distortion characteristics can be improved without variation of the operating current. Consequently, the dynamic range can be improved, and the distortion can also be reduced.

Figure 20:
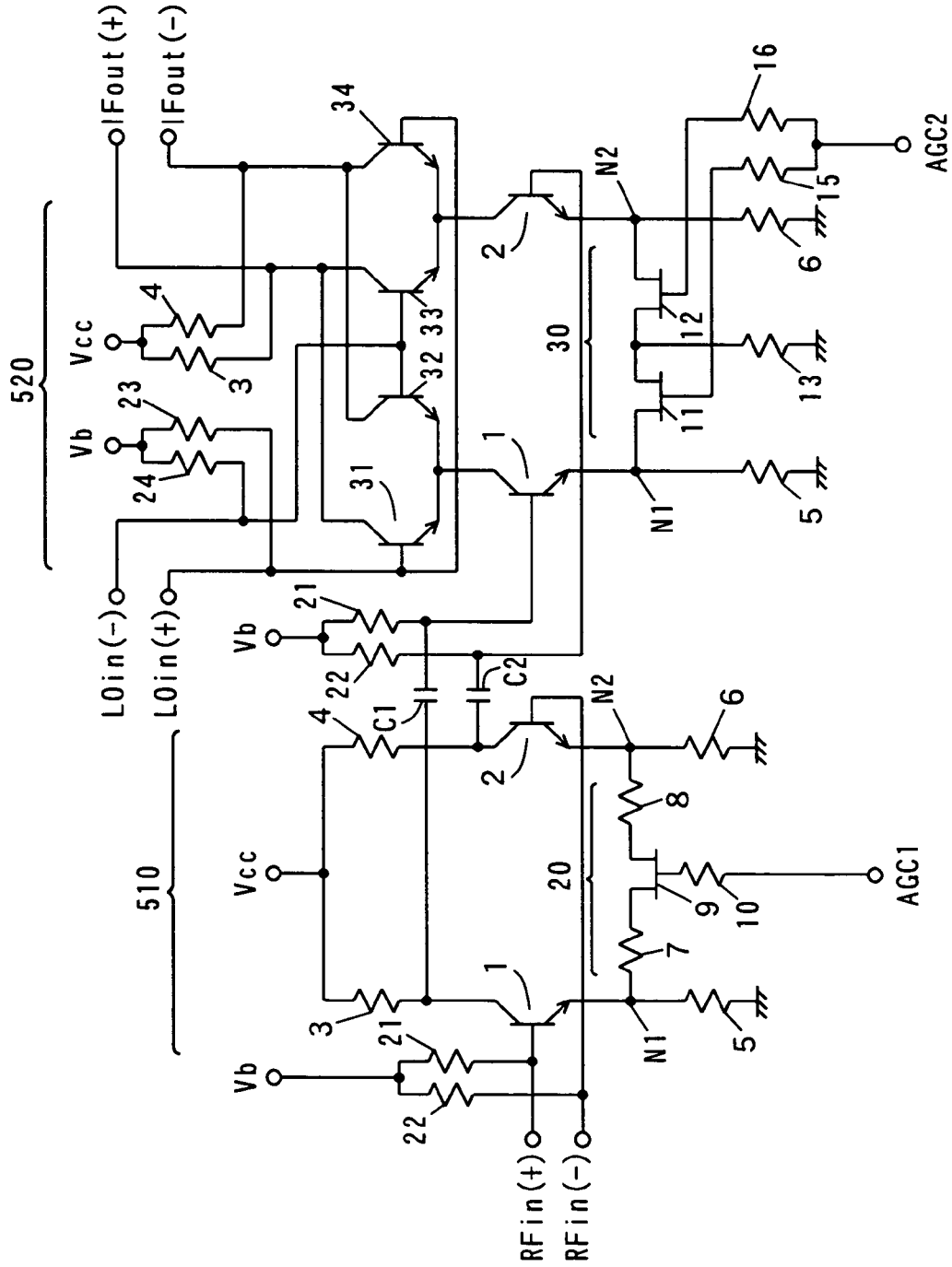
FIG. 20 is a circuit diagram showing a fifth specific example of each of the variable gain amplifier and the variable gain multiplier shown in FIG. 15.

FIG. 20 is a circuit diagram showing a fifth specific example of each of the variable gain amplifier 510 and the variable gain multiplier 520 shown in FIG. 15.

In the example of FIG. 20, a variable resistance circuit 20 is used as the variable resistance circuit 800 of the variable gain amplifier 510, and a variable resistance circuit 30 as the variable resistance circuit 800 of the variable gain multiplier 520.

In this case, in the variable gain amplifier 510, the distortion characteristics can be improved without variation of the operating current. Moreover, in the variable gain multiplier 520, the saturation of the input/output characteristics at high gain is improved to increase the linearity of the input/output characteristics, leading to improved distortion characteristics.

Figure 21:
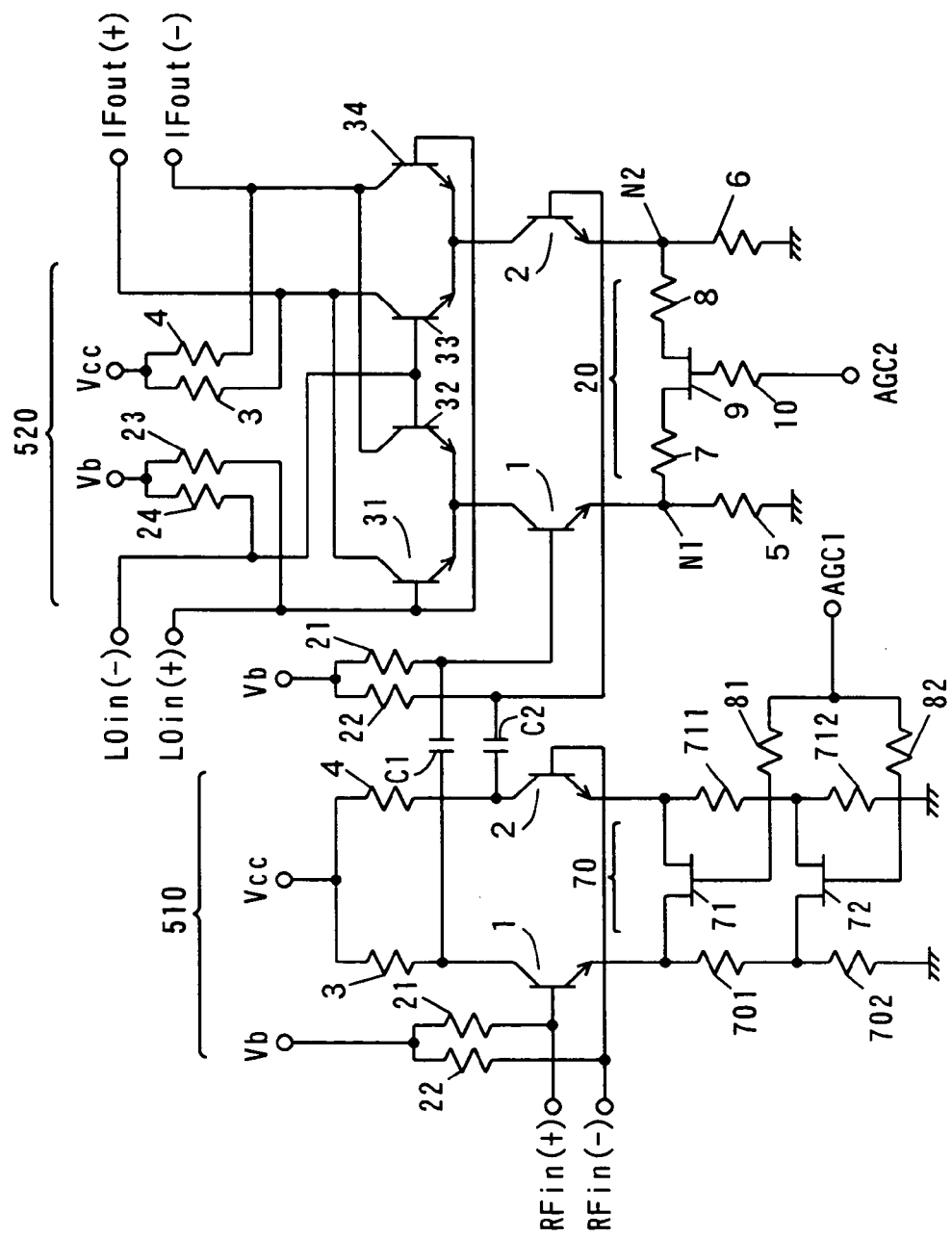
FIG. 21 is a circuit diagram showing a sixth specific example of each of the variable gain amplifier and the variable gain multiplier shown in FIG. 15.

FIG. 21 is a circuit diagram showing a sixth specific example of each of the variable gain amplifier 510 and the variable gain multiplier 520 shown in FIG. 15.

In the example of FIG. 21, a variable resistance circuit 70 is used as the variable resistance circuit 800 of the variable gain amplifier 510, and a variable resistance circuit 20 as the variable resistance circuit 800 of the variable gain multiplier 520.

The variable resistance circuit 70 includes FETs 71, 72, and resistances 701, 702, 711, 712. The emitter of a transistor 1 is connected to a ground terminal via the resistances 701, 702. The emitter of a transistor 2 is connected to a ground terminal via the resistances 711, 712. The FET 71 is connected between the respective emitters of the transistors 1, 2. The FET 72 is connected between a node between the resistances 701 and 702 and a node between the resistances 711 and 712. The gates of the FETs 71, 72 are supplied with a control voltage AGC1 via resistances 81, 82, respectively.

In the variable gain amplifier 510, the gate-source voltage and gate-drain voltage of the FET 71 differ from those of the FET 72 because the gates of the FETs 71, 72 are supplied with the common control voltage AGC1. This is equal to a case where the gates of the FETs 71, 72 are supplied with different control voltages. Accordingly, a control voltage at which the non-linearity is reduced is applied to the FET 72, when a control voltage at which the non-linearity is maximized is applied to the FET 71. Conversely, a control voltage at which the non-linearity is reduced is applied to the FET 71, when a control voltage at which the non-linearity is maximized is applied to the FET 72. As a result, when the control voltage AGC1 is varied to perform continuous gain control, abrupt deterioration at a specific control voltage AGC1 in the distortion characteristics of the variable gain differential amplifier can be suppressed. This suppresses the distortion below a certain level.

Consequently, in the example of FIG. 21, the distortion can be suppressed below a certain level, and the dynamic range is also enhanced.

(Other Modifications)

In the above-mentioned first to seventh embodiments, other types of transistors, such as MOSFETs and MESFETs, may be used as the first to sixth transistors. Cascode-connected transistors may also be used in place of some of or all of the first to sixth transistors.

As the first and second loads in the above-mentioned first to seventh embodiments, other types of devices, such as other resistive devices, capacitive devices (e.g., capacitors), inductive elements (e.g., inductors or transformers), transistors (e.g., MOSFETs, MESFETs, or bipolar transistors), or a circuit formed by a combination of these devices may also be used.

As the first and second impedance devices in the above-mentioned first to seventh embodiments, other types of devices, such as other resistive devices, capacitive devices (e.g., capacitors), inductive elements (e.g., inductors or transformers), transistors (i.e., MOSFETs, MESFETs, or bipolar transistors), or a circuit formed by a combination of these devices may also be used.

As the variable impedance devices in the above-mentioned first to seventh embodiments, other types of transistors, such as p-MOSFETs, bipolar transistors, or the like may be used, or other types of variable impedance devices with impedance that varies depending on a control voltage may also be used.

As the first and second resistive elements in the above-mentioned first, second and seventh embodiments, other types of resistive devices having resistive components may be used, or a circuit formed by a combination of a plurality of devices having resistive components may also be used.

As the resistive elements in the above-mentioned third to seventh embodiments, other types of devices having resistive components may be used, or a circuit formed by a combination of a plurality of devices having resistive components may also be used.

(Eighth Embodiment)

Figure 22:
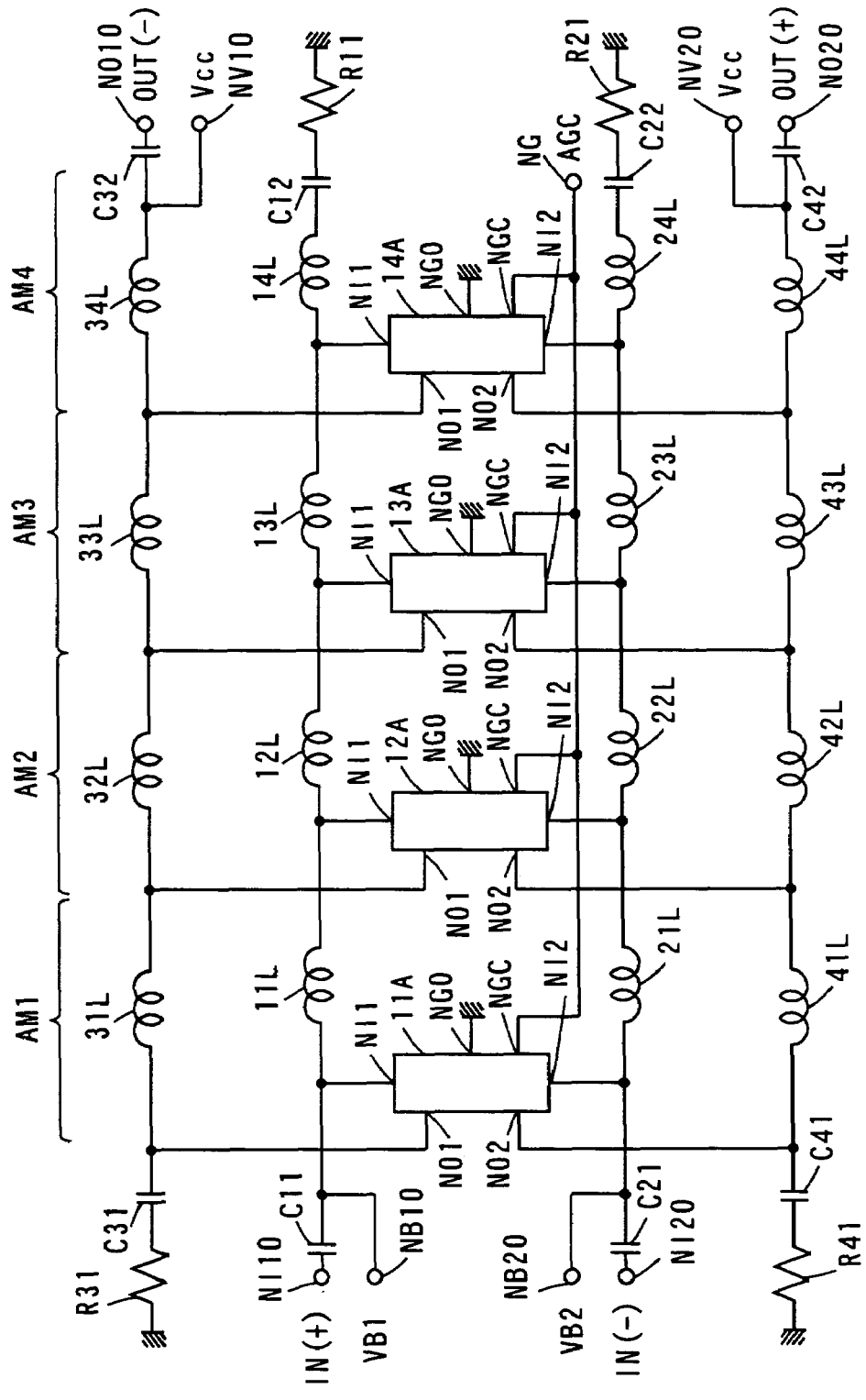
FIG. 22 is a circuit diagram showing the structure of a differential distributed amplifier according to an eighth embodiment.

FIG. 22 is a circuit diagram showing the structure of a differential distributed amplifier according to an eighth embodiment.

In the differential distributed amplifier shown in FIG. 22, a plurality of differential pair circuits 11A to 14A, a plurality of inductors 11L to 14L on the input side, a plurality of inductors 21L to 24L on the input side, a plurality of inductors 31L to 34L on the output side, a plurality of inductors 41L to 44L on the output side, resistances R11, R21, R31, R41, and capacitors C11, C12, C21, C22, C31, C32, C41, C42 form a plurality of stages of differential amplifying sections AM1 to AM 4.

In the present embodiment, spiral inductors are used as the inductors 11L to 14L, 21L to 24L, 31L to 34L, and 41L to 44L. The inductors 11L to 14L are connected in series to form a first input-side transmission circuit. One end of the first input-side transmission circuit is connected to a bias terminal NB1O, and also connected to an input terminal NI10 via the capacitor 11, whereas another end thereof is grounded via the capacitor 12 and resistance R11.

The inductors 21L to 24L are connected in series to form a second input-side transmission circuit. One end of the second input-side transmission circuit is connected to a bias terminal NB20, and also connected to an input terminal NI20 via the capacitor C21, whereas another end thereof is grounded via the capacitor C22 and the resistance R21.

The inductors 31L to 34L are connected in series to form a first output-side transmission circuit. One end of the first output-side transmission circuit is grounded via the capacitor C31 and the resistance R31, whereas another end thereof is connected to a power supply terminal NV10 and also connected to an output terminal NO10 via the capacitor C32.

The inductors 41L to 44L are connected in series to form a second output-side transmission circuit. One end of the second output-side transmission circuit is grounded via the capacitor C41 and the resistance R41, whereas another end thereof is connected to a power supply terminal NV20 and also connected to an output terminal NO20 via the capacitor C42.

Each of the differential pair circuits 11A to 14A has input terminals NI1, NI2, output terminals NO1, NO2, and a ground terminal NG0. The input terminals NI1 of the respective differential pair circuits 11A to 14A are connected to one ends of the respective inductors 11L to 14L; the respective input terminals NI2 are connected to one ends of the respective inductors 21L to 24L; the respective output terminals NO1 are connected to one ends of the respective inductors 31L to 34L; and the respective output terminals NO2 are connected to one ends of the respective inductors 41L to 44L. Each of the ground terminals NG0 of the differential pair circuits 11A to 14A is grounded, each of the control terminals NGC thereof being connected to a control terminal NG.

The input terminal NI10, NI20 are supplied with input signals IN(+), IN(−), respectively, which have phases inverted from each other. The input signals, IN(+), IN(−) are differential inputs. The bias terminals NB10, NB20 are supplied with bias voltages VB1, VB2, respectively, and the power supply terminals NV10, NV20 are supplied with power supply voltages Vcc, respectively. Output signals OUT(−), OUT(+) which have inverted phases from each other are derived from the output terminals NO10, NO20, respectively. The output signals OUT(−), OUT(+) are differential outputs.

Figure 23:
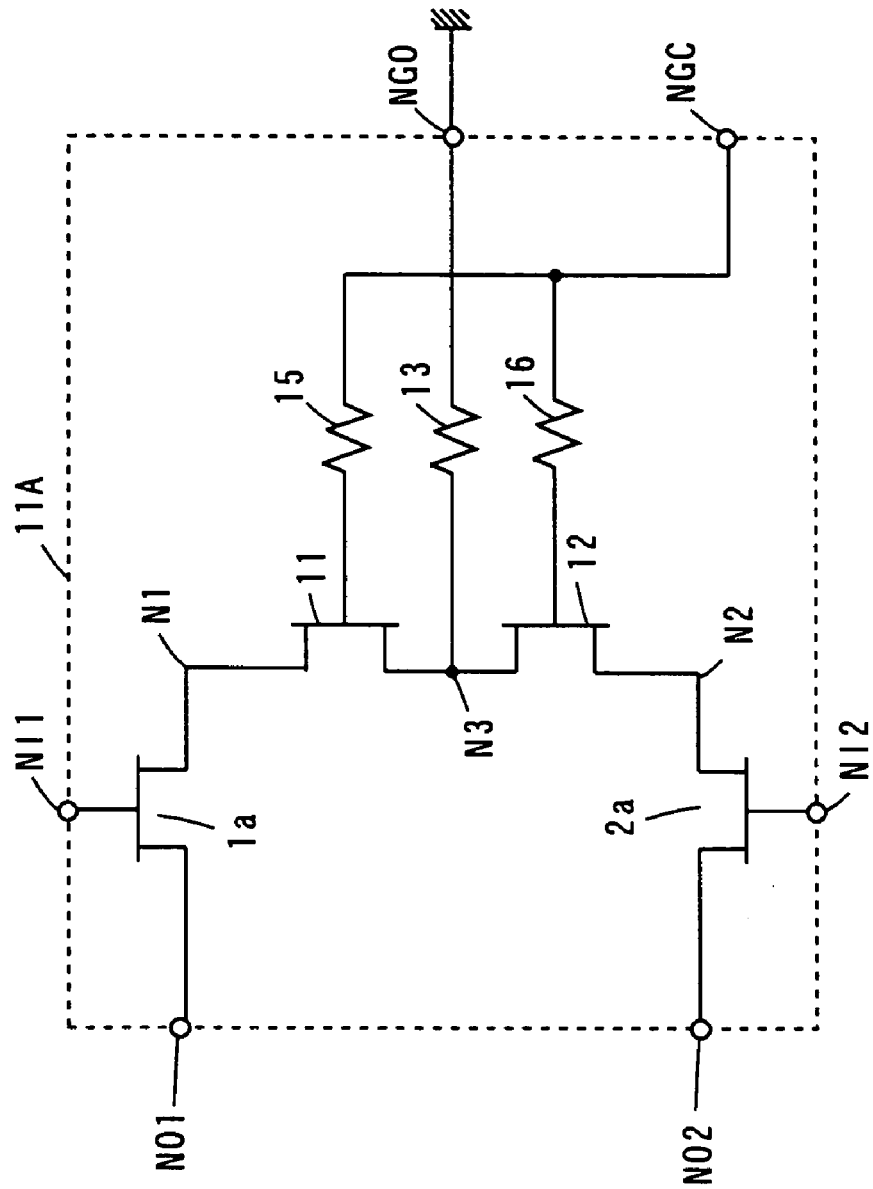
FIG. 23 is a circuit diagram showing one example of the structure of the differential pair circuit in the differential distributed amplifier according to the eighth embodiment.

FIG. 23 is a circuit diagram showing one example of the structure of the differential pair circuit 11A in the differential distributed amplifier according to the eighth embodiment. The structures of the differential pair circuits 12A to 14A are the same as that of the differential pair circuit 11A.

The differential pair circuit 11A includes n-MOSFETs (hereinafter abbreviated to FETs) 1a, 2a, 11, 12, and resistances 13, 15, 16. The FET1a is connected between an output terminal NO1 and a node NI, the FET 2a is connected between an output terminal NO2 and a node N2, the FET 11 is connected between the node N1 and a node N3, and the FET 12 is connected between the node N2 and the node N3.

The gates of the FETs 1a, 2a are connected to input terminals NI1, NI2, respectively. The node N3 is connected to a ground terminal NG0 via the resistance 13, and the gates of the FETs 11, 12 are connected via the resistances 15, 16, respectively, to a control terminal NGC.

Figure 24:
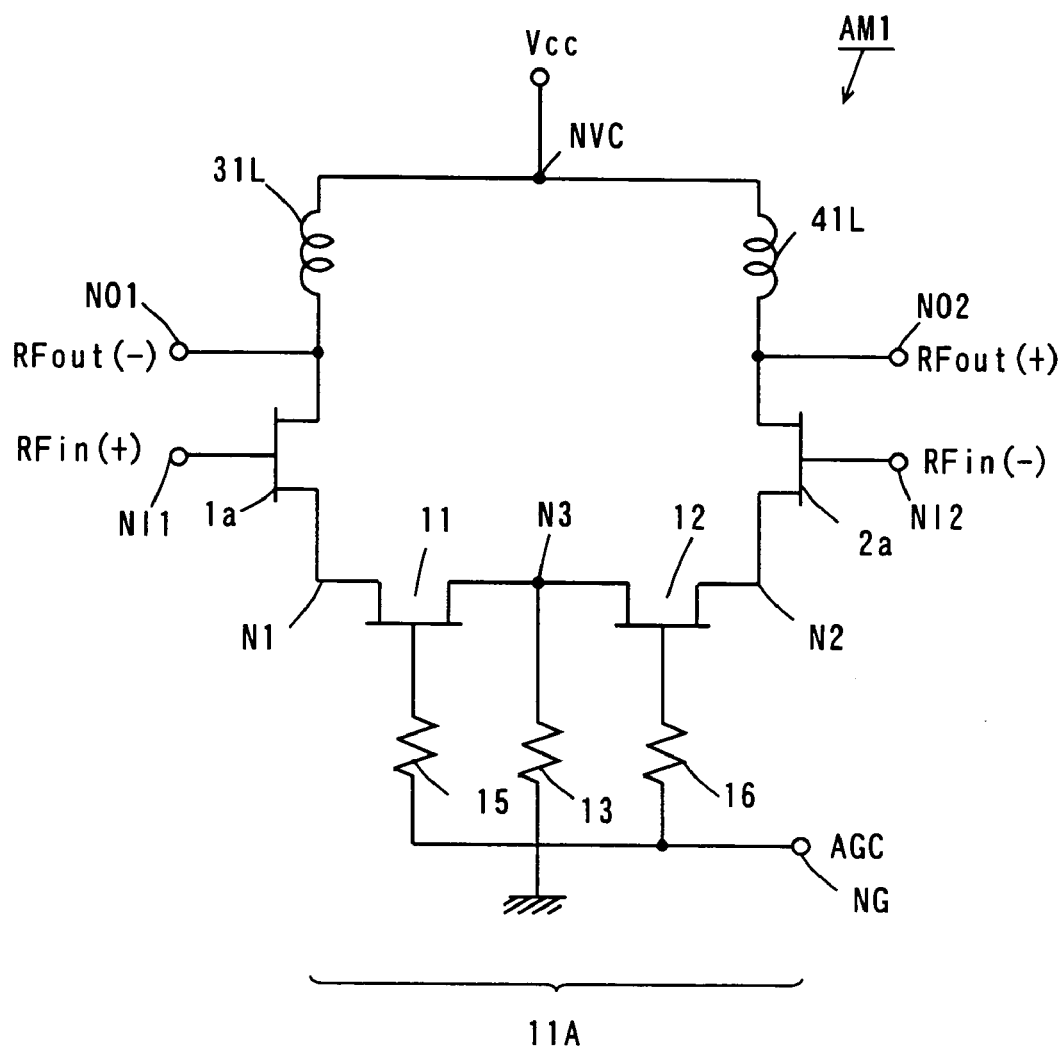
FIG. 24 is a circuit diagram showing the structure of the first-stage differential amplifying section in the differential distributed amplifier according to the eighth embodiment.

FIG. 24 is a circuit diagram showing the structure of the first-stage differential amplifying section AM1 in the differential distributed amplifier according to the eighth embodiment.

The differential amplifying section AM1 shown in FIG. 24 includes the differential pair circuit 11A shown in FIG. 23 and the inductors 31L, 41L shown in FIG. 22.

Input terminals NI1, NI2 are supplied with input signals RFin(+), RFin(−) based on the input signals IN(+), IN(−) shown in FIG. 22, respectively. Output signals RFout(−), RFout(+) are derived from output terminals NO1, NO2, respectively. FETs 11, 12, and resistances 13, 15, 16 form a variable impedance circuit.

In the differential amplifying section AM1 shown in FIG. 24, a node N3 is a virtual ground point for high-frequencies. Impedances (ground impedances) between the virtual ground point and the sources of the FETs 1a and 2a (nodes N1, N2) can be varied depending on the pass characteristics of the variable impedance circuit. The gain of the differential amplifying section AM1 is attenuated when the impedance of the variable impedance circuit is increased, whereas it is increased when the impedance of the variable impedance circuit is decreased.

The gates of the FETs 1a, 2a, 11, 12 in each of the differential pair circuits 11A to 14A are, for example, 0.18 μm long and 100 μm wide for each. In addition, the resistance value of a resistance 13 is 100Ω, and the resistance values of resistances 15, 16 are approximately 5 kΩ, for example. Spiral inductors having 0.6 nH, for example, are used as the inductors 11L to 14L and 21L to 24L, and spiral conductors having 0.5 nH, for example, are used as the inductors 31L to 34L and 41L to 44L.

The rated voltage of each of the FETs 11, 12 forming the variable impedance circuit is, for example, 1.8 V. When a control voltage AGC applied to a control terminal NG for gain control is continuously varied in a range of 1.8 V to 0 V, the differential distributed amplifier shows a maximum gain at a control voltage AGC of 1.8 V, and shows a minimum gain at a control voltage AGC of 0 V.

Figure 25:
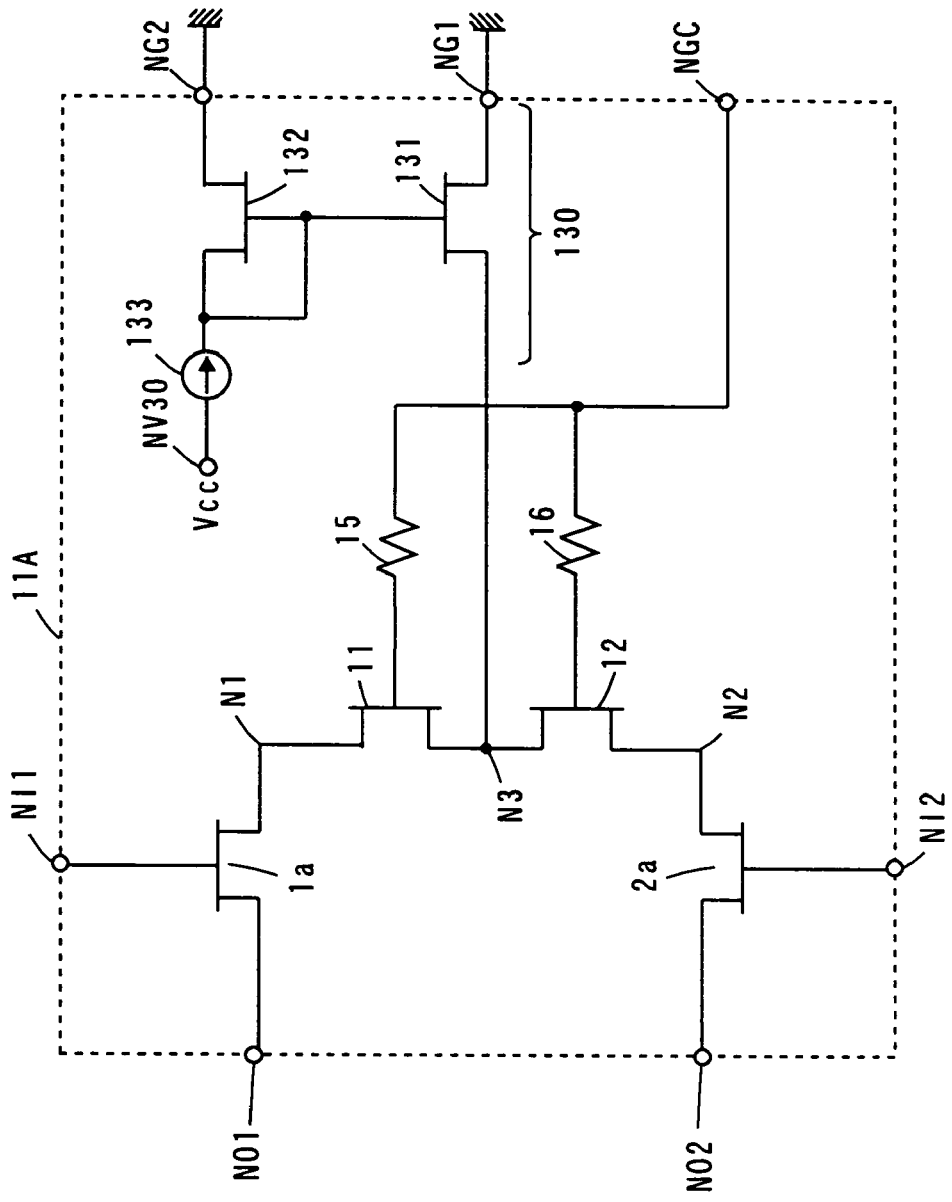
FIG. 25 is a circuit diagram showing another example of the structure of the differential pair circuit in the differential distributed amplifier according to the eighth embodiment.

FIG. 25 is a circuit diagram showing another example of the structure of the differential pair circuit 11A in the differential distributed amplifier according to the eighth embodiment. The structures of the differential pair circuits 12A to 14A are the same as that of the differential pair circuit 11A.

The differential pair circuit 11A shown in FIG. 25 differs from the differential pair circuit 11A shown in FIG. 23 that it is provided with a constant current source 130 in place of the resistance 13. The constant current source 130 includes n-MOSFETs (abbreviated to FETs) 131, 132, and a current source 133. The FET 131 is connected between a node N3 and a ground terminal NG1, and the gates of the FETs 131, 132 are connected to the drain of the FET 132. The current source 133 and FET 132 are connected in series between a power supply terminal NV30 receiving a power supply voltage Vcc and a ground terminal NG2.

Using the differential pair circuit 11A shown in FIG. 25, the operating current can be stabilized.

In the differential distributed amplifier according to the present embodiment, the gate-source capacities of the FETs 1a and 2a in the respective differential pair circuits 11A to 14A and the inductors 11L to 14L, 21L to 24L form a quasi-transmission line on the input side, and the drain-source capacities of the FETs 1a, 2a in the respective differential pair circuits 11A to 14A and the inductors 31L to 34L, 41L to 44L form a quasi-transmission line on the output side. Consequently, input and output impedance matching over a wide band can be achieved.

Moreover, because the differential distributed amplifier according to the present embodiment is formed by the plurality of stages of differential amplifying sections AM1 to AM4, the gain can be continuously varied over a wide band.

In the present embodiment, the plurality of differential pair circuits 11A to 14A correspond to differential amplifiers; the inductors 11L to 14L correspond to a plurality of inductive elements of a first transmission circuit; the inductors 21L to 24L correspond to a plurality of inductive elements of a second transmission circuit; the inductors 31L to 34L correspond to a plurality of inductive elements of a third transmission circuit; and the inductors 41L to 44L correspond to a plurality of inductive elements of a fourth transmission circuit.

Further, the FET1a corresponds to a first transistor; the FET2a corresponds to a second transistor; the FET11 corresponds to a first variable impedance device; the FET12 corresponds to a second variable impedance device; and the resistance 13 or constant current source 130 corresponds to a resistive element. In addition, the ground potential corresponds to a reference potential.

(Ninth Embodiment)

The whole structure of a differential distributed amplifier according to a ninth embodiment is the same as the structure shown in FIG. 22. The differential distributed amplifier according to the ninth embodiment differs from the differential distributed amplifier according to the eighth embodiment in the structures of differential pair circuits 11A to 14A.

Figure 26:
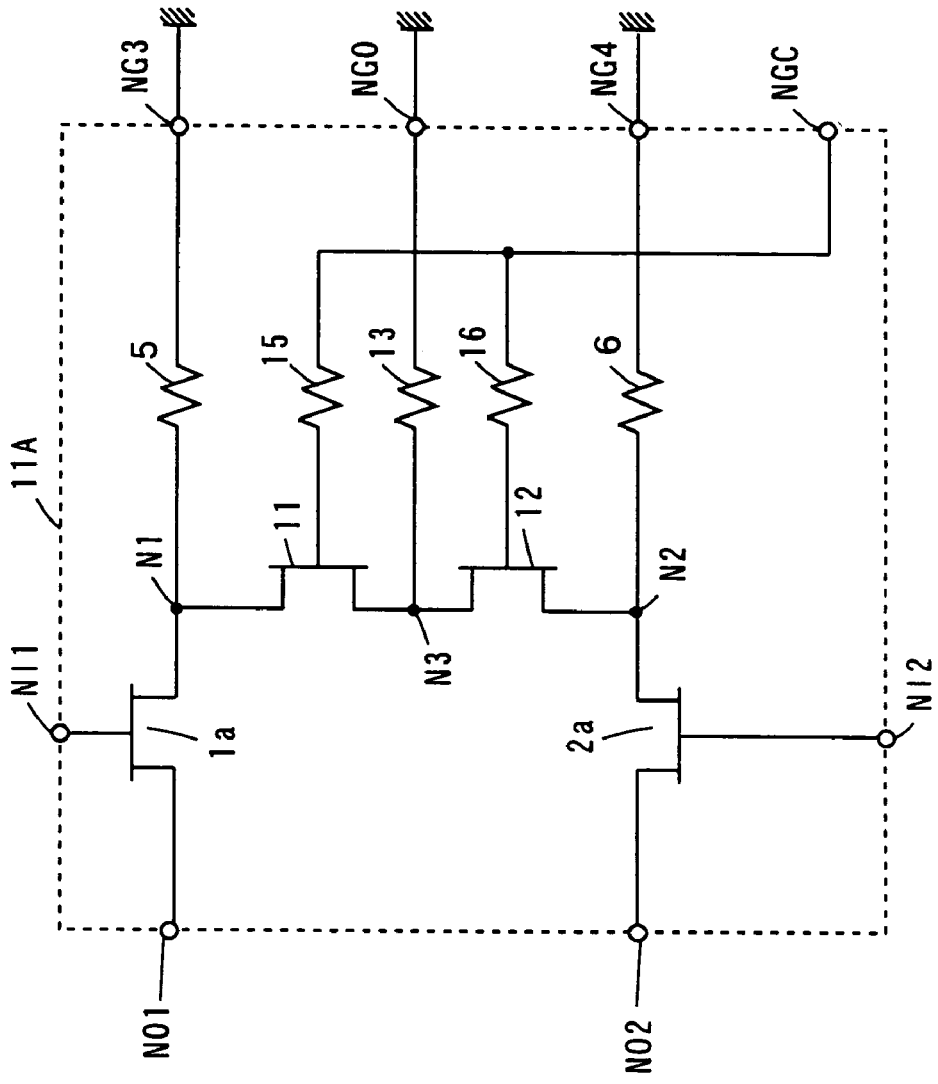
FIG. 26 is a circuit diagram showing one example of the structure of the differential pair circuit in the differential distributed amplifier according to the ninth embodiment.

FIG. 26 is a circuit diagram showing one example of the structure of the differential pair circuit 11A in the differential distributed amplifier according to the ninth embodiment. The structures of the differential pair circuits 12A to 14A are the same as that of the differential pair circuit 11A.

The differential pair circuit 11A shown in FIG. 26 differs from the differential pair circuit 11A shown in FIG. 23 in that a resistance 5 is connected between a node N1 and a ground terminal NG3, and a resistance 6 is connected between a node N2 and a ground terminal NG4.

Figure 27:
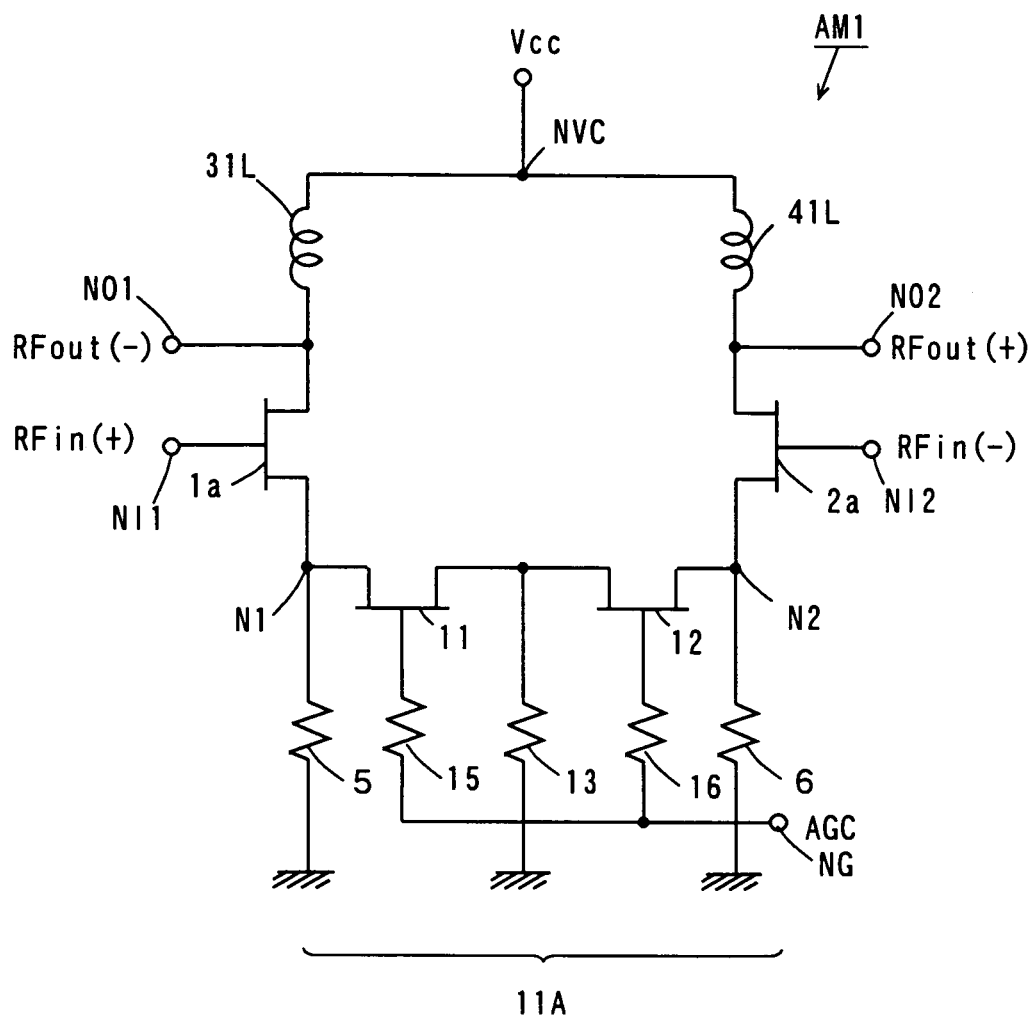
FIG. 27 is a circuit diagram showing the structure of a first-stage differential amplifying section in the differential distributed amplifier according to the ninth embodiment.

FIG. 27 is a circuit diagram showing the structure of a first-stage differential amplifying section AM1 in the differential distributed amplifier according to the ninth embodiment.

The differential amplifying section AM1 includes the differential pair circuit 11A shown in FIG. 26 and the inductors 31L, 41L shown in FIG. 22.

Input terminals NI1, NI2 are supplied with input signals RFin(+), RFin(−) based on the input signals IN(+), IN(−) shown in FIG. 22, respectively. Output signals RFout(−), RFout(+) are derived from output terminals NO1, NO2, respectively. FETs 11, 12 and resistances 13, 15, 16 form a variable impedance circuit.

The operation of the differential amplifying section AM1 shown in FIG. 27 is the same as that of the variable gain differential amplifier shown in FIG. 6. In other words, the ground impedances of the differential amplifying section AM1 can be varied depending on the pass characteristics of the variable impedance circuit. The gain of the differential amplifying section AM1 is attenuated when the impedance of the variable impedance circuit is increased, whereas it is increased when the impedance of the variable impedance circuit is decreased.

In the differential amplifying section AM1 shown in FIG. 27, the operating current increases at higher gain, and decreases at lower gain (during attenuation.) This improves the saturation of input/output characteristics at high gain. As a result, the linearity of input/output characteristics is increased to improve the distortion characteristics.

Note that the structure and operation of each of the differential amplifying sections AM 2 and AM 4 shown in FIG. 22 are the same as those of the differential amplifying section AM1 shown in FIG. 27.

The resistance values of resistances 5, 6, 13 are, for example, 100Ω. The values of the other devices are the same as those in the eighth embodiment. The resistance values of the resistances 5, 6, 13 may differ from one another. When a control voltage AGC applied to a control terminal NG for gain control is continuously varied in a range of 1.8 V to 0 V, the differential distributed amplifier shows a maximum gain at a control voltage AGC of 1.8 V, and shows a minimum gain at a control voltage AGC of 0 V. In this case, as the control voltage AGC increases, the operating current of each of the differential amplifying sections AM1 to AM4 (differential pair circuits 11A to 14A) increases up to approximately 1.5 times. This improves the distortion characteristics of the differential distributed amplifier.

Figure 28:
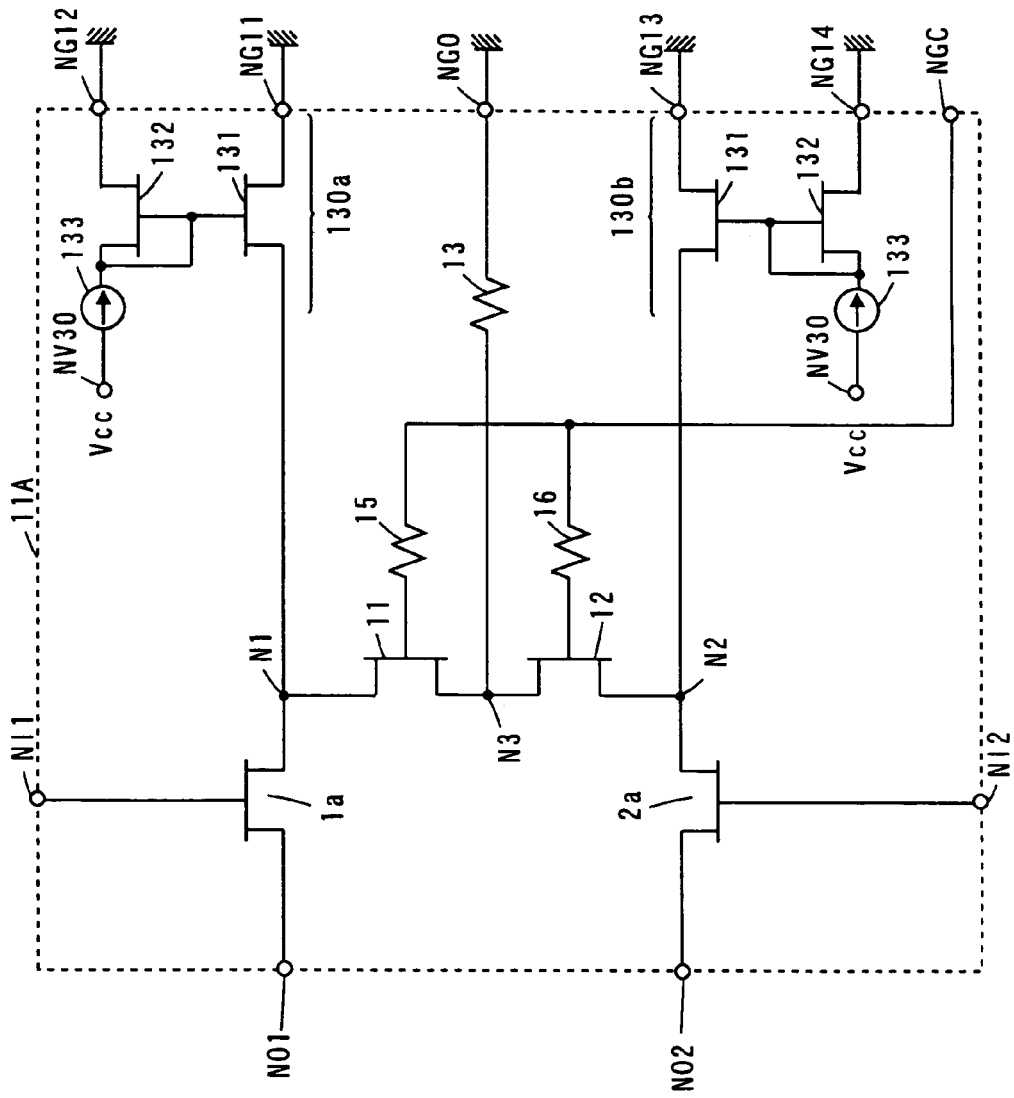
FIG. 28 is a circuit diagram showing another example of the structure of the differential pair circuit in the differential distributed amplifier according to the ninth embodiment.

FIG. 28 is a circuit diagram showing another example of the structure of the differential pair circuit 11A in the differential distributed amplifier according to the ninth embodiment. The structures of the differential pair circuits 12A to 14A are the same as that of the differential pair circuit 11A.

The differential pair circuit 11A shown in FIG. 28 differs from the differential pair circuit 11A shown in FIG. 27 in that it is provided with constant current sources 130a, 130b in place of the resistances 5, 6. The constant current source 130a is connected between a node N1 and ground terminals NG11, NG12, and the constant current source 130b is connected between a node N2 and ground terminals NG13, NG14. The structure of the constant current sources 130a, 130b are the same as that of the constant current source 130 shown in FIG. 25.

Using the differential pair circuit 11A shown in FIG. 28, the operating current can be stabilized.

Moreover, in the differential pair circuit 11A shown in FIG. 28, a constant current source 130 may be provided in place of the resistance 13, as shown in FIG. 25. In this case, a constant operating current flows in the constant current source 130.

In the differential distributed amplifier according to the present embodiment, the gate-source capacities of the FETs 1a, 2a in the respective differential pair circuits 11A to 14A and the inductors 11L to 14L, 21L to 24L form a quasi-transmission line on the input side, and the drain-source capacities of the FETs 1a, 2a in the respective differential pair circuits 11A to 14A and the inductors 31L to 34L, 41L to 44L form a quasi-transmission line on the output side. Consequently, input and output impedance matching over a wide band can be achieved.

Moreover, because the differential distributed amplifier according to the present embodiment is formed by the plurality of stages of differential amplifying sections AM1 to AM4, the gain can be continuously varied over a wide band.

In the present embodiment, the plurality of differential pair circuits 11A to 14A correspond to differential amplifiers; the inductors 11L to 14L correspond to a plurality of inductive elements of a first transmission circuit; the inductors 21L to 24L correspond to a plurality of inductive elements of a second transmission circuit; the inductors 31L to 34L correspond to a plurality of inductive elements of a third transmission circuit; and the inductors 41L to 44L correspond to a plurality of inductive elements of a fourth transmission circuit.

Further, the FET1a corresponds to a first transistor; the FET2a corresponds to a second transistor; the FET11 corresponds to a first variable impedance device; the FET12 corresponds to a second variable impedance device; the resistance 13 or constant current source 130 corresponds to a resistive element. In addition, the resistances 5, 6, or the constant current sources 130a, 130b correspond to first and second impedance devices, respectively. The ground potential corresponds to a reference potential.

(Tenth Embodiment)

Figure 29:
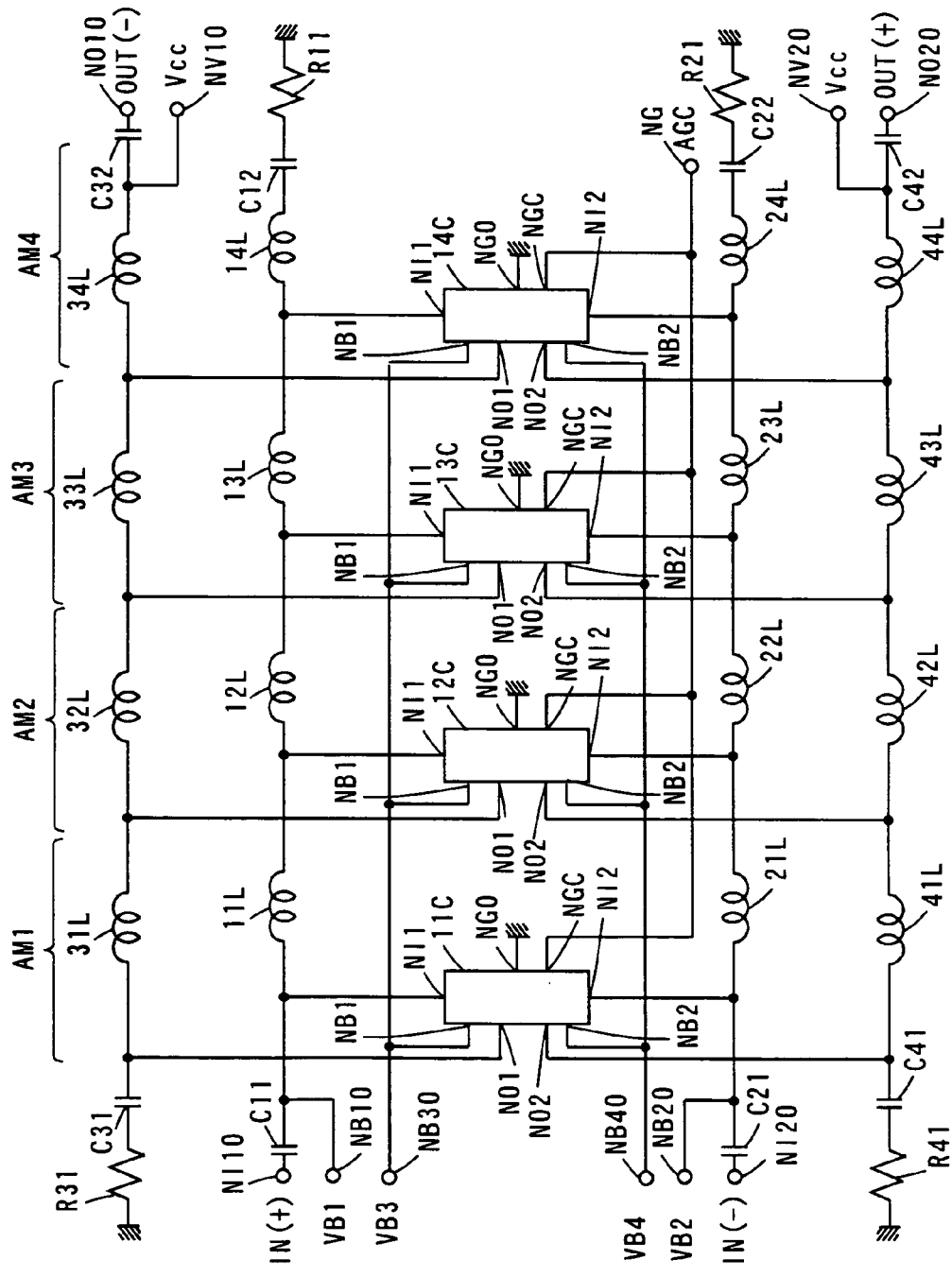
FIG. 29 is a circuit diagram showing the structure of a differential distributed amplifier according to a tenth embodiment.

FIG. 29 is a circuit diagram showing the structure of a differential distributed amplifier according to a tenth embodiment.

The differential distributed amplifier shown in FIG. 29 differs from the differential distributed amplifier shown in FIG. 22 in that it is provided with differential pair circuits 11C to 14C in place of the differential pair circuits 11A to 14A shown in FIG. 22.

Each of the differential pair circuits 11C to 14C includes a plurality of cascode-connected FETs, and has input terminals NI1, NI2, output terminals NO1, NO2, a ground terminal NGO, and in addition, bias terminals NB1, NB2, as described below. The bias terminals NB1, NB2 in each of the differential pair circuits 11C to 14C are connected to bias terminals NB30, NB40, respectively. Bias voltages VB3, VB4 are applied to the bias terminals NB30, NB40, respectively.

Figure 30:
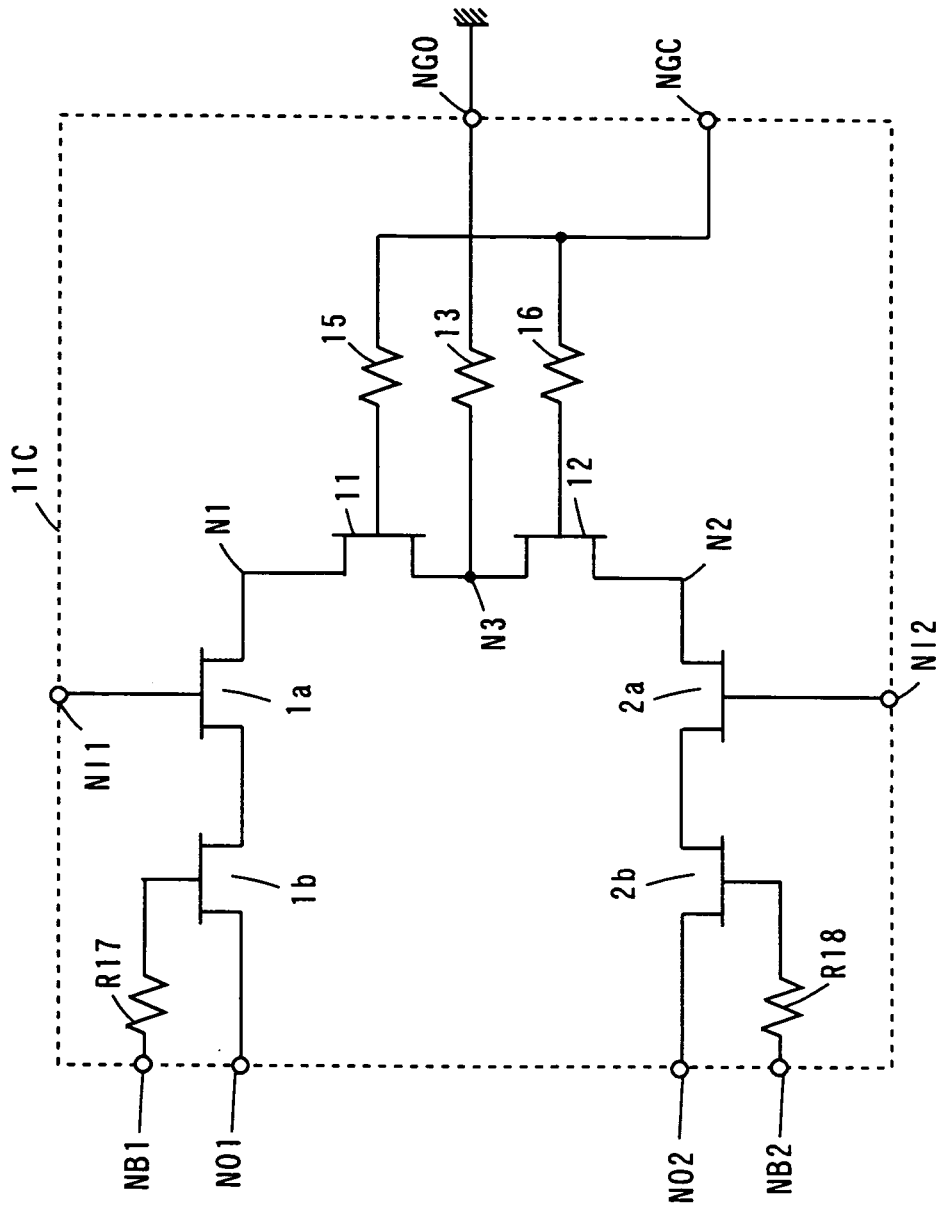
FIG. 30 is a circuit diagram showing one example of the structure of the differential pair circuit in the differential distributed amplifier according to the tenth embodiment.

FIG. 30 is a circuit diagram showing one example of the structure of the differential pair circuit 11C in the differential distributed amplifier according to the tenth embodiment. The structures of the differential pair circuits 12C to 14C are the same as that of the differential pair circuit 11C.

The differential pair circuit 11C shown in FIG. 30 differs from the differential pair circuit 11A shown in FIG. 23 in that it additionally includes n-MOSFETs (hereinafter abbreviated to FETs) 1b, 2b. The FET 1b is connected directly between the output terminal NO1 and the drain of the FET1a, and the FET 2a is directly connected between the output terminal NO2 and the drain of the FET2a. The gates of the FETs 1b, 2b are connected via resistances R17, R18, respectively, to the bias terminals NB1, NB2.

In the present embodiment, the sizes of the FETs 1a, 1b, 2a, 2b are the same. The values of the other devices are the same as those in the eighth embodiment. When a control voltage AGC applied to a control terminal NG for gain control is continuously varied in a range of 1.8 V to 0 V, the differential distributed amplifier shows a maximum gain at a control voltage AGC of 1.8 V, and shows a minimum gain at a control voltage AGC of 0 V.

Figure 31:
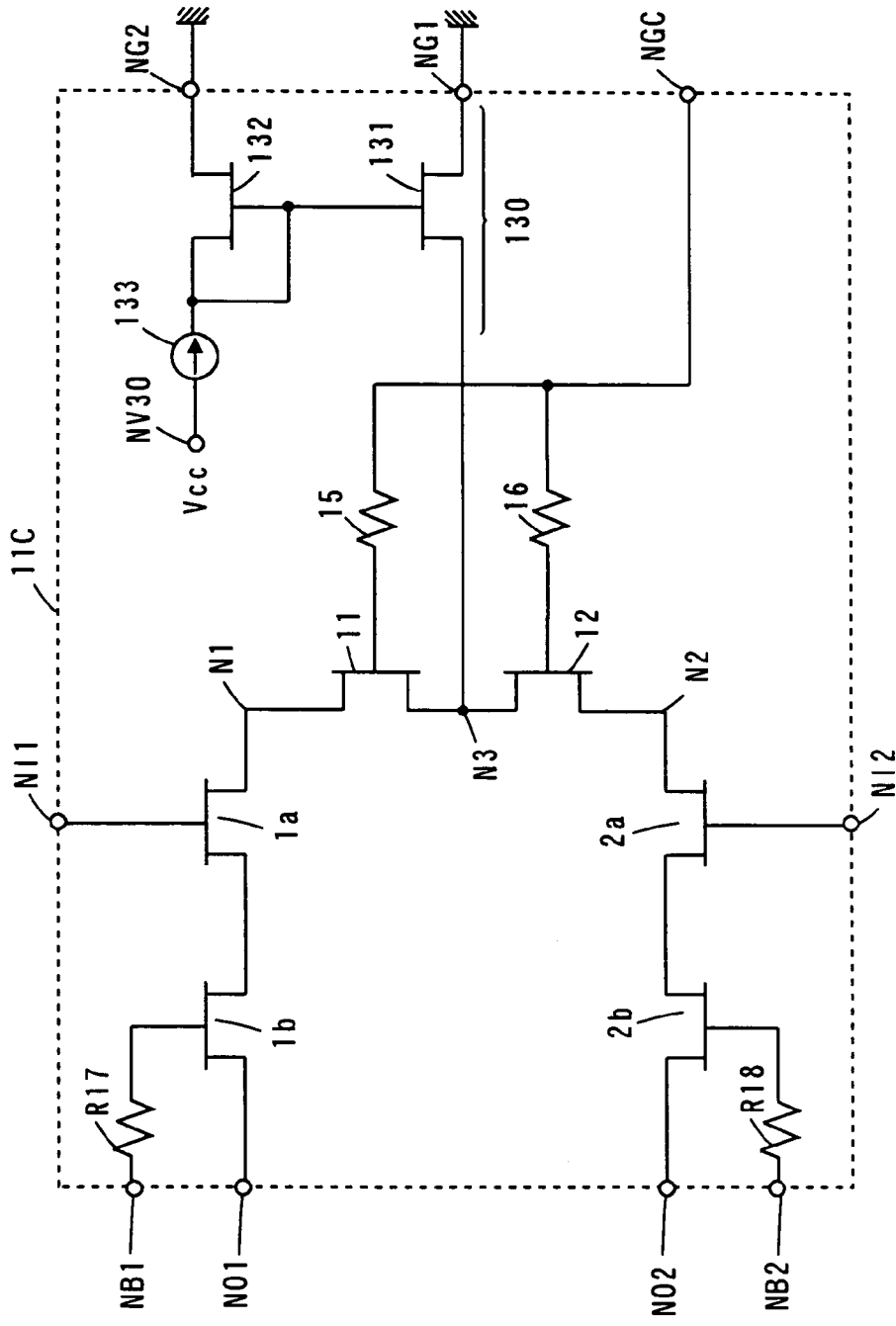
FIG. 31 is a circuit diagram showing another example of the structure of the differential pair circuit in the differential distributed amplifier according to the tenth embodiment.

FIG. 31 is a circuit diagram showing another example of the structure of the differential pair circuit 11C in the differential distributed amplifier according to the tenth embodiment. The structures of the differential pair circuits 12C to 14C are the same as that of the differential pair circuit 11C.

The differential pair circuit 11C shown in FIG. 31 differs from the differential pair circuit 11C shown in FIG. 30 in that it is provided with a constant current source 130 in place of the resistance 13. The structure of the constant current source 130 is the same as that shown in FIG. 25.

Using the differential pair circuit 11C shown in FIG. 31, the operating current can be stabilized.

In the differential distributed amplifier according to the present embodiment, the gate-source capacities of the FETs 1a, 2a in the respective differential pair circuits 11C to 14C and the inductors 11L to 14L, 21L to 24L form a quasi-transmission line on the input side, and the drain-source capacities of the FETs 1a, 2a in the respective differential pair circuits 11C to 14C and the inductors 31L to 34L, 41L to 44L form a quasi-transmission line on the output side. Consequently, input and output impedance matching over a wide band can be achieved.

Moreover, because the differential distributed amplifier according to the present embodiment is formed by the plurality of stages of differential amplifying sections AM1 to AM4, the gain can be continuously varied over a wide band.

In addition, because each of the plurality of stages of differential amplifying sections AM1 to AM4 include the cascode-connected FETs 1a, 1b, 2a, 2b, the frequency characteristics of the differential distributed amplifier can be enhanced.

In the present embodiment, the plurality of differential pair circuits 11C to 14C correspond to differential amplifiers; the inductors 11L to 14L correspond to a plurality of inductive elements in a first transmission circuit; the inductors 21L to 24L correspond to a plurality of inductive elements of a second transmission circuit; the inductors 31L to 34L correspond to a plurality of inductive elements of a third transmission circuit; and the inductors 41L to 44L correspond to a plurality of inductive elements of a fourth transmission circuit.

Further, the FET1a corresponds to a first transistor; the FET2a corresponds to a second transistor; the FET1b corresponds to a third transistor; the FET2b corresponds to a fourth transistor; the FET11 corresponds to a first variable impedance device; the FET12 corresponds to a second variable impedance device; and the resistance 13 or constant current source 130 corresponds to a resistive element. The ground potential corresponds to a reference potential.

(Eleventh Embodiment)

The whole structure of a differential distributed amplifier according to an eleventh embodiment is the same as that shown in FIG. 29. The differential distributed amplifier according to the eleventh embodiment differs from the differential distributed amplifier according to the tenth embodiment in the structures of differential pair circuits 11C to 14C.

Figure 32:
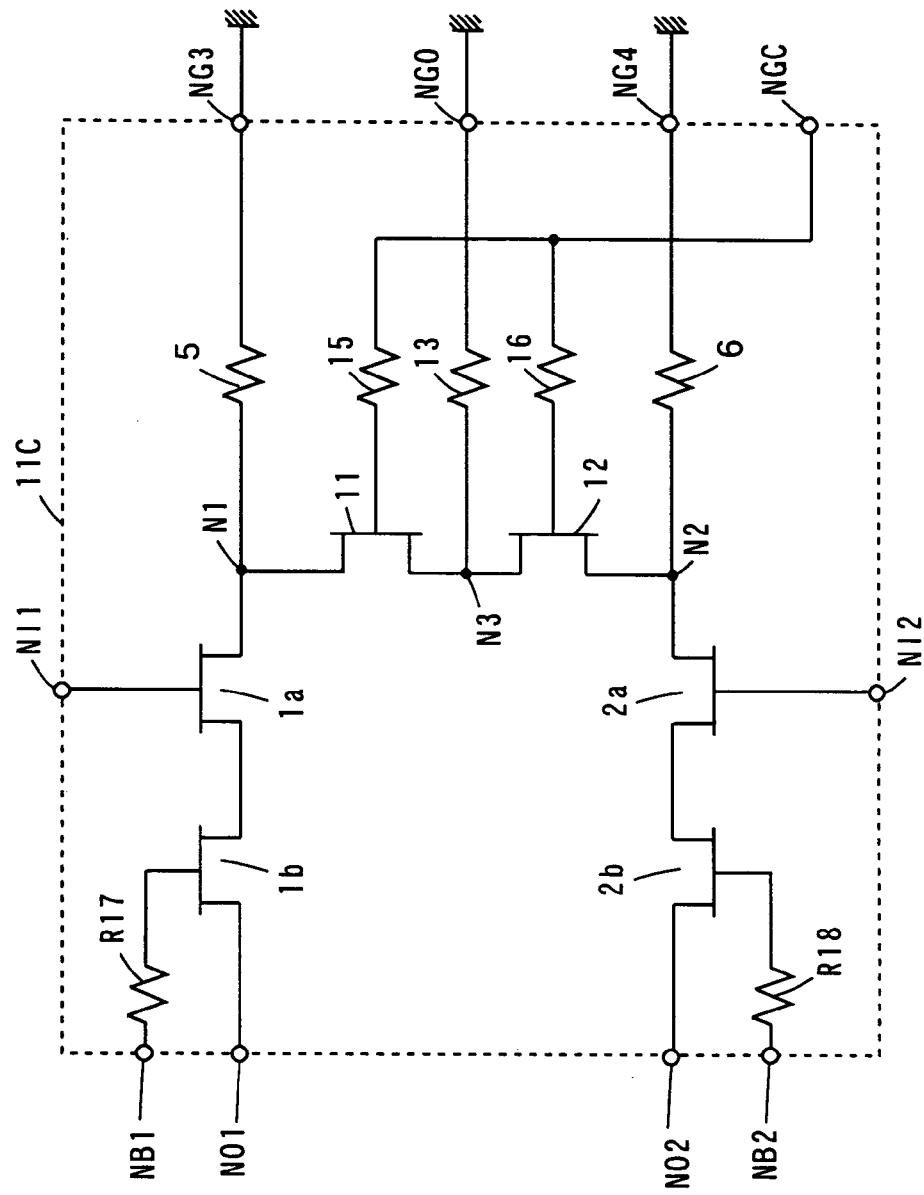
FIG. 32 is a circuit diagram showing one example of the structure of the differential pair circuit in the differential distributed amplifier according to the eleventh embodiment.

FIG. 32 is a circuit diagram showing one example of the structure of the differential pair circuit 11C in the differential distributed amplifier according to the eleventh embodiment.

The structures of the differential pair circuits 12C to 14C are the same as that of the differential pair circuit 11C.

The differential pair circuit 11C shown in FIG. 32 differs from the differential pair circuit 11C shown in FIG. 30 in that are sistance 5 is connected between a node N1 and a ground terminal NG3, and a resistance 6 is connected between a node N2 and a ground terminal NG4.

In the present embodiment, the sizes of the FETs 1a, 1b, 2a, 2b are the same. The values of resistances 5, 6, 1 are, for example, 100Ω. The resistance values of the resistances 5, 6, 13 may differ from one another. The values of the other devices are the same as those in the eighth embodiment. When a control voltage AGC applied to a control terminal NG for gain control is continuously varied in a range of 1.8 V to 0 V, the differential distributed amplifier shows a maximum gain at a control voltage AGC of 1.8 V, and shows a minimum gain at a control voltage AGC of 0 V. In this case, as the control voltage AGC increases, the operating current of each of the differential amplifying sections AM1 to AM4 (differential pair circuits 11A to 14A) increases up to approximately 1.5 times. This improves the distortion characteristics of the differential distributed amplifier.

Figure 33:
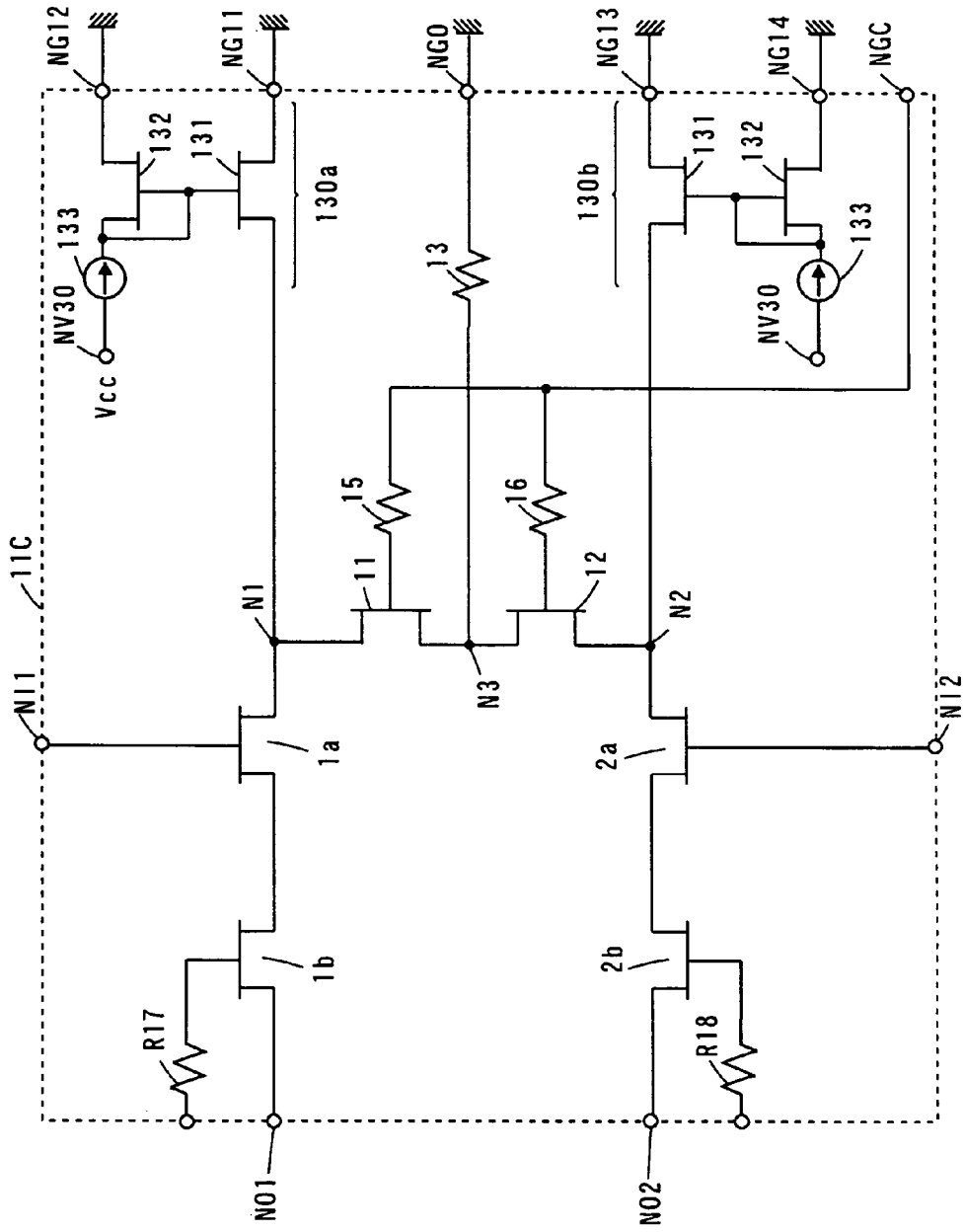
FIG. 33 is a circuit diagram showing another example of the structure of the differential pair circuit in the differential distributed amplifier according to the eleventh embodiment.

FIG. 33 is a circuit diagram showing another example of the structure of the differential pair circuit 11C in the differential distributed amplifier according to the eleventh embodiment. The structures of the differential pair circuits 12C to 14C are the same as that of the differential pair circuit 11C.

The differential pair circuit 11C shown in FIG. 33 differs from the differential pair circuit 11C shown in FIG. 32 in that it is provided with constant current sources 130a, 130b in place of the resistances 5, 6. The constant current source 130a is connected between a node N1 and ground terminals NG11, NG12, and the constant current source 130b is connected between a node N2 and ground terminals NG13, NG14. The structure of each of the constant current sources 130a, 130b is the same as that of the constant current source 130 shown in FIG. 25.

Using the differential pair circuit 11C shown in FIG. 33, the operating current can be stabilized.

The differential pair circuit 11A shown in FIG. 33 may also be provided with a constant current source 130 in place of the resistance R13, as shown in FIG. 25. In this case, a constant operating current flows in the constant current source 130.

In the differential distributed amplifier according to the present embodiment, the gate-source capacities of the FETs 1a, 2a in the respective differential pair circuits 11C to 14C and the inductors 11L to 14L, 21L to 24L form a quasi-transmission line on the input side, and the drain-source capacities of the FETs 1a, 1b, 2a, 2b in the respective differential pair circuits 11C to 14C and the inductors 31L to 34L, 41L to 44L form a quasi-transmission line on the output side. Consequently, input and output impedance matching over a wide band can be achieved.

Moreover, because the differential distributed amplifier according to the present embodiment is formed by the plurality of stages of differential amplifying sections AM1 to AM4, the gain can be continuously varied over a wide band.

In the present embodiment, the plurality of differential pair circuits 11C to 14C correspond to differential amplifiers; the inductors 11L to 14L correspond to a plurality of inductive elements of a first transmission circuit; the inductors 21L to 24L correspond to a plurality of inductive elements of a second transmission circuit; the inductors 31L to 34L correspond to a plurality of inductive elements of a third transmission circuit; and the inductors 41L to 44L correspond to a plurality of inductive elements of a fourth transmission circuit.

In addition, the FET1a corresponds to a first transistor; the FET2a corresponds to a second transistor; the FET1b corresponds to a third transistor; the FET2b corresponds to a fourth transistor; the FET11 corresponds to a first variable impedance device; the FET12 corresponds to a second variable impedance device; and the resistance 13 or constant current source 130 corresponds to a resistive element. The resistances 5, 6 or the constant current sources 130a, 130b correspond to first and second impedance devices, respectively. The ground potential corresponds to a reference potential.

(Evaluation)

Figure 34:
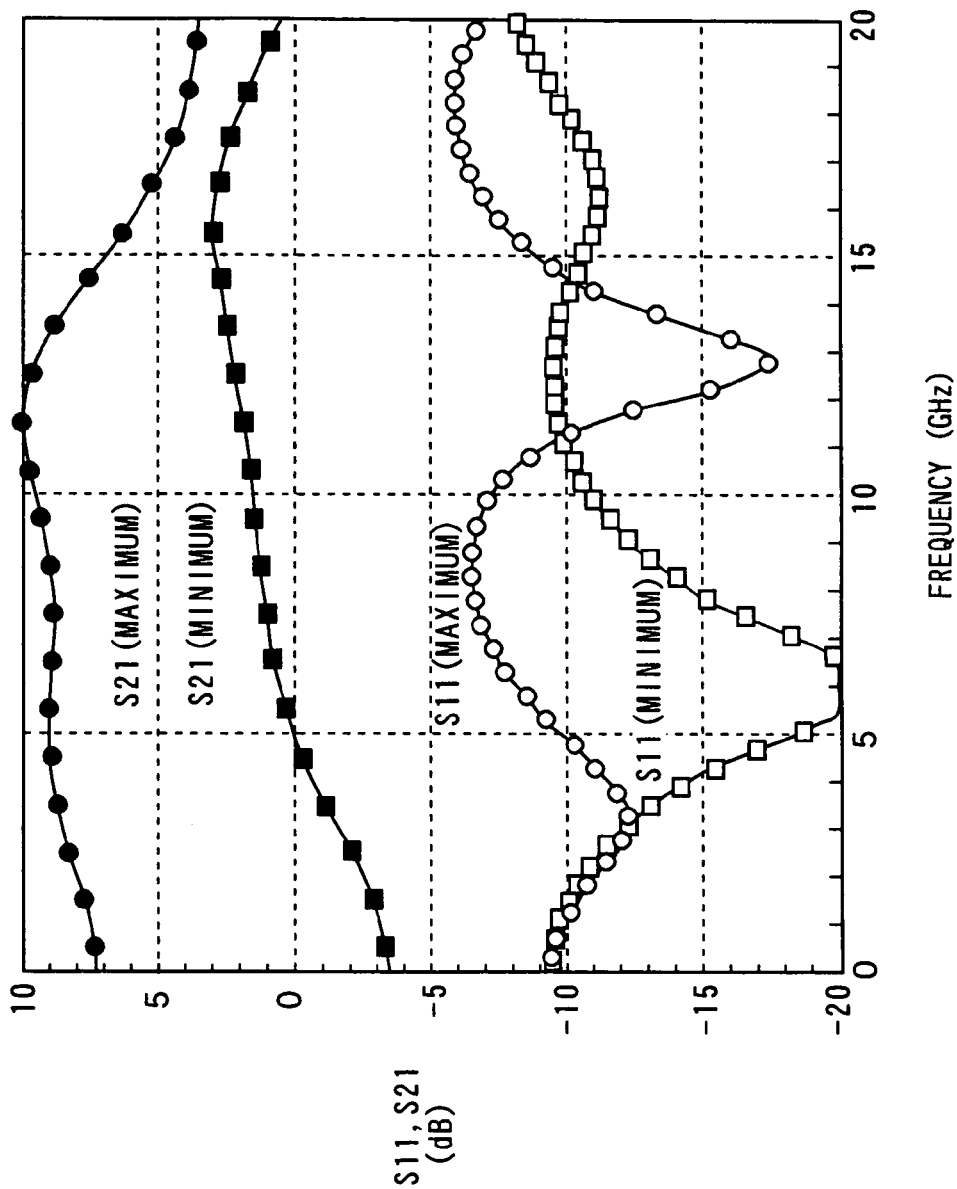
FIG. 34 is a diagram showing the calculation result of characteristics of the differential distributed amplifier according to the eighth embodiment.

FIG. 34 is a diagram showing the calculation result of characteristics of the differential distributed amplifier according to the eighth embodiment. In FIG. 34, the abscissa represents frequencies, and the ordinate represents the values of S parameters.

In FIG. 34, black circles represent maximum values of S21 (gain), whereas black squares represent minimum values of S21 (gain), and white circles represent S11 (input reflection coefficient) at a maximized gain, whereas white squares represent S11 (input reflection coefficient) at a minimized gain.

As shown in FIG. 34, in the differential distributed amplifier according to the eighth embodiment, a variable gain range of 10 dB to 8 dB is obtained in a wide band of 3 GHz to 10 GHz with a voltage range of the control voltage AGC of 1.8 V to 0.7 V. In addition, the absolute value of the input reflection coefficient is greater than 6 dB over a wide band.

(Other Modifications)

It is noted that as the inductive elements in the above-mentioned eighth to eleventh embodiments, other types of inductive elements having transmission lines such as microstrip lines and coplanar lines or inductive components may also be used.

As the first and second transistors in the above-mentioned eighth to eleventh embodiments, not only the n-MOSFETs made of Si (silicon) but also p-MOSFETs may be used, and other types of transistors, such as MOSFETs, MESFETs (Metal Semiconductor Field Effect Transistor), HEMTs (High Electron Mobility Transistors), or bipolar transistors which are made of other semiconductor materials, such as SiGe (Silicon Germanium) or GaAs (Gallium Arsenide) may be used.

As the third and fourth transistors in the above-mentioned tenth and eleventh embodiments, not only the n-MOSFETs made of Si but also p-MOSFETs may be used, and other types of transistors, such as MOSFETs, MESFETs, HEMTs, or bipolar transistors which are made of other semiconductor materials, such as SiGe or GaAs may be used.

As the first and second variable impedance devices in the above-mentioned eighth to eleventh embodiments, not only the n-MOSFETs made of Si but also p-MOSFETs may be used, and other types of transistors, such as MOSFETs, MESFETs, HEMTs, or bipolar transistors which are made of other semiconductor materials, such as SiGe or GaAs may be used, or other variable impedance devices with impedance that varies depending on a control voltage may be used.

As the resistive elements in the above-mentioned eighth to eleventh embodiments, other types of devices having resistive elements may also be used, or a circuit formed by a combination of a plurality of devices having resistive components may be used.

As the first and second impedance devices in the abovementioned ninth and eleventh embodiments, other types of devices, such as other resistive devices, capacitive devices (e.g., capacitors), inductive elements (e.g., inductors or transformers), transistors (e.g., MOSFETs, MESFETs, HEMTs, or bipolar transistors), or a circuit formed by a combination of these devices may also be used.

Industrial Applications

The variable impedance circuit, variable gain differential amplifier, multiplier, high-frequency circuit and differential distributed amplifier according to the present invention may find applications in various types of electric circuits or electric equipment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multiplier comprising:
   first, second, third, fourth, fifth, and sixth transistors each having a first terminal, a second terminal, and a third terminal; and
   a variable impedance circuit, wherein
   said first terminal of said first transistor receives a first input signal, said second terminal thereof is connected to a first potential via a first load, and said third terminal thereof is connected to said second terminal of said fifth transistor;
   said first terminal of said second transistor receives a second input signal, said second terminal thereof is connected, to said first potential via a second load, and said third terminal thereof is connected to said second terminal of said fifth transistor;
   said first terminal of said third transistor receives said second input signal, said second terminal thereof is connected to said first potential via said first load, and said third terminal thereof is connected to said second terminal of said sixth transistor;
   said first terminal of said fourth transistor receives said first input signal, said second terminal thereof is connected to said first potential via said second load, and said third terminal thereof is connected to said second terminal of said sixth transistor;
   said first terminal of said fifth transistor receives a third input signal, and said third terminal thereof is connected to a second potential via a first impedance device;
   said first terminal of said sixth transistor receives a fourth input signal, and said third terminal thereof is connected to said second potential via a second impedance device, and wherein
   said variable impedance circuit includes a first resistive element, a variable impedance device, and a second resistive element connected in series between said third terminal of said fifth transistor and said third terminal of said sixth transistor and wherein
   a control voltage is applied to a control terminal of said variable impedance device.

2. A variable gain differential amplifier comprising:
   a first transistor having a first terminal receiving a first input signal, a second terminal connected to a first potential via a first load, and a third terminal connected to a second potential via a first impedance device;
   a second transistor having a first terminal receiving a second input signal, a second terminal connected to said first potential via a second load, and a third terminal connected to said second potential via a second impedance device; and
   a variable impedance circuit connected between said third terminal of said first transistor and said third terminal of said second transistor, wherein
   said variable impedance circuit includes:
   first and second variable impedance devices connected in series between said third terminal of said first transistor and said third terminal of said second transistor; and
   a resistive element connected between a junction point between said first variable impedance device and said second variable impedance device and said second potential, and wherein
   a control voltage is applied to a control terminal of said first and second variable impedance devices, and
   said junction point between said first variable impedance device and said second variable impedance device has a potential different from said second potential due to a voltage drop caused by a current flowing through said resistive element.

3. A multiplier comprising:
   first, second, third, fourth, fifth, and sixth transistors each having a first terminal, a second terminal, and a third terminal; and
   a variable impedance circuit, wherein
   said first terminal of said first transistor receives a first input signal, said second terminal thereof is connected to a first potential via a first load, and said third terminal thereof is connected to said second terminal of said fifth transistor;
   said first terminal of said second transistor receives a second input signal, said second terminal thereof is connected to said first potential via a second load, and said third terminal thereof is connected to said second terminal of said fifth transistor;
   said first terminal of said third transistor receives said second input signal, said second terminal thereof is connected to said first potential via said first load, and said third terminal thereof is connected to said second terminal of said sixth transistor;
   said first terminal of said fourth transistor receives said first input signal, said second terminal thereof is connected to said first potential via said second load, and said third terminal thereof is connected to said second terminal of said sixth transistor;
   said first terminal of said fifth transistor receives a third input signal, and said third terminal thereof is connected to a second potential via a first impedance device;
   said first terminal of said sixth transistor receives a fourth input signal, and said third terminal thereof is connected to said second potential via a second impedance device, and wherein
   said variable impedance circuit includes:
   first and second variable impedance devices connected in series between said third terminal of said fifth transistor and said third terminal of said sixth transistor; and
   a resistive element connected between a junction point between said first variable impedance device and said second variable impedance device and said second potential, and wherein
   a control voltage is applied to a control terminal of said first and second variable impedance devices.

4. A variable impedance circuit comprising:
first, second, third, fourth, and fifth nodes;
first and second variable impedance devices connected between said first node and said second node;
a first resistive element connected between said first node and said third node;
a second resistive element connected between said second node and said fourth node; and
a third resistive element connected between a junction point between said first variable impedance device and said second variable impedance device and said fifth node, wherein
said first, second, third, fourth, and fifth nodes are supplied with first, second, third, fourth, and fifth potentials respectively,
said first and second potentials being equal, and wherein
a control voltage is applied to a control terminal of said first and second variable impedance devices.

5. A high-frequency circuit comprising:
a differential amplifier that receives first and second input signals; and
a multiplier, wherein
said differential amplifier comprises:
a first transistor having a first terminal receiving a first input signal, a second terminal connected to a first potential via a first load, and a third terminal connected to a second potential via a first impedance device;
a second transistor having a first terminal receiving a second input signal, a second terminal connected to said first potential via a second load; and a third terminal connected to said second potential via a second impedance device; and
a variable impedance circuit connected between said third terminal of said first transistor and said third terminal of said second transistor,
said variable impedance circuit including a first resistive element, a variable impedance device, and a second resistive element connected in series between said third terminal of said first transistor and said third terminal of said second transistor,
a control voltage being applied to a control terminal of said variable impedance device, and wherein
said multiplier comprises:
first, second, third, fourth, fifth, and sixth transistors each having a first terminal, a second terminal, and a third terminal; and
a variable impedance circuit,
said first terminal of said first transistor receiving a third input signal, said second terminal thereof being connected to a first potential via a first load, said third terminal thereof being connected to said second terminal of said fifth transistor;
said first terminal of said second transistor receiving a fourth input signal, said second terminal thereof being connected to said first potential via a second load, said third terminal thereof being connected to said second terminal of said fifth transistor;
said first terminal of said third transistor receiving said fourth input signal, said second terminal thereof being connected to said first potential via said first load, said third terminal thereof being connected to said second terminal of said sixth transistor;
said first terminal of said fourth transistor receiving said third input signal, said second terminal thereof being connected to said first potential via said second load, said third terminal thereof being connected to said second terminal of said sixth transistor;
said first terminal of said fifth transistor receiving a fifth input signal, said third terminal thereof being connected to a second potential via a first impedance device;
said first terminal of said sixth transistor receiving a sixth input signal, said third terminal thereof being connected to said second potential via a second impedance device,
said variable impedance circuit including a first resistive element, a variable impedance device, and a second resistive element connected in series between said third terminal of said fifth transistor and said third terminal of said sixth transistor,
a control voltage being applied to a control terminal of said variable impedance device, and wherein
output signals at said second terminals of said first and second transistors in said differential amplifier are applied to said first terminals of said fifth and sixth transistors in said multiplier as said fifth and sixth input signals, and wherein
a first control voltage is applied to said variable impedance circuit in said differential amplifier, and a second control voltage is applied to said variable impedance circuit in said multiplier.

6. A high-frequency circuit comprising:
a differential amplifier that receives first and second input signals; and
a multiplier, wherein
said differential amplifier comprises:
a first transistor having a first terminal receiving a first input signal, a second terminal connected to a first potential via a first load, and a third terminal connected to a second potential via a first impedance device;
a second transistor having a first terminal receiving a second input signal, a second terminal connected to said first potential via a second load, and a third terminal connected to said second potential via a second impedance device; and
a variable impedance circuit connected between said third terminal of said first transistor and said third terminal of said second transistor,
said variable impedance circuit including a first resistive element, a variable impedance device, and a second resistive element connected in series between said third terminal of said first transistor and said third terminal of said second transistor,
a control voltage being applied to a control terminal of said variable impedance device, and wherein
said multiplier comprises:
first, second, third, fourth, fifth, and sixth transistors each having a first terminal, a second terminal, and a third terminal; and
a variable impedance circuit,
said first terminal of said first transistor receiving a third input signal, said second terminal thereof being connected to a first potential via a first load, said third terminal thereof being connected to said second terminal of said fifth transistor;
said first terminal of said second transistor receiving a fourth input signal, said second terminal thereof being connected to said first potential via a second load, said third terminal thereof being connected to said second terminal of said fifth transistor;
said first terminal of said third transistor receiving said fourth input signal, said second terminal thereof being connected to said first potential via said first load, said third terminal thereof being connected to said second terminal of said sixth transistor;
said first terminal of said fourth transistor receiving said third input signal, said second terminal thereof being connected to said first potential via said second load, said third terminal thereof being connected to said second terminal of said sixth transistor;
said first terminal of said fifth transistor receiving a fifth input signal, said third terminal thereof being connected to a second potential via a first impedance device;
said first terminal of said sixth transistor receiving a sixth input signal, said third terminal thereof being connected to said second potential via a second impedance device,
said variable impedance circuit including:
first and second variable impedance devices connected in series between said third terminal of said fifth transistor and said third terminal of said sixth transistor; and
a resistive element connected between a junction point between said first variable impedance device and said second variable impedance device and said second potential,
a control voltage being applied to a control terminal of said first and second variable impedance devices, and wherein
output signals at said second terminals of said first and second transistors in said differential amplifier are applied to said first terminals of said fifth and sixth transistors in said multiplier as said fifth and sixth input signals, and wherein
a first control voltage is applied to said variable impedance circuit in said differential amplifier, and a second control voltage is applied to said variable impedance circuit in said multiplier.

7. A high-frequency circuit comprising:
a differential amplifier that receives first and second input signals; and
a multiplier, wherein
said variable gain differential amplifier comprises:
a first transistor having a first terminal receiving a first input signal, a second terminal connected to a first potential via a first load, and a third terminal connected to a second potential via a first impedance device;
a second transistor having a first terminal receiving a second input signal, a second terminal connected to said first potential via a second load, and a third terminal connected to said second potential via a second impedance device; and
a variable impedance circuit connected between said third terminal of said first transistor and said third terminal of said second transistor,
said variable impedance circuit including:
first and second variable impedance devices connected in series between said third terminal of said first transistor and said third terminal of said second transistor; and
a resistive element connected between a junction point between said first variable impedance device and said second variable impedance device and said second potential,
a control voltage being applied to a control terminal of said first and second variable impedance devices, and wherein
said multiplier comprises:
first, second, third, fourth, fifth, and sixth transistors each having a first terminal, a second terminal, and a third terminal; and a variable impedance circuit,
said first terminal of said first transistor receiving a third input signal, said second terminal thereof being connected to a first potential via a first load, said third terminal thereof being connected to said second terminal of said fifth transistor;
said first terminal of said second transistor receiving a fourth input signal, said second terminal thereof being connected to said first potential via a second load, said third terminal thereof being connected to said second terminal of said fifth transistor;
said first terminal of said third transistor receiving said fourth input signal, said second terminal thereof being connected to said first potential via said first load, said third terminal thereof being connected to said second terminal of said sixth transistor;
said first terminal of said fourth transistor receiving said third input signal, said second terminal thereof being connected to said first potential via said second load, said third terminal thereof being connected to said second terminal of said sixth transistor;
said first terminal of said fifth transistor receiving a fifth input signal, said third terminal thereof being connected to a second potential via a first impedance device;
said first terminal of said sixth transistor receiving a sixth input signal, said third terminal thereof being connected to said second potential via a second impedance device,
said variable impedance circuit including a first resistive element, a variable impedance device, and a second resistive element connected in series between said third terminal of said fifth transistor and said third terminal of said sixth transistor,
a control voltage being applied to a control terminal of said variable impedance device, and wherein
output signals at said second terminals of said first and second transistors in said differential amplifier are applied to said first terminals of said fifth and sixth transistors in said multiplier as said fifth and sixth input signals, and wherein
a first control voltage is applied to said variable impedance circuit in said differential amplifier, and a second control voltage is applied to said variable impedance circuit in said multiplier.

8. A high-frequency circuit comprising:
a differential amplifier that receives first and second input signals; and
a multiplier, wherein
said differential amplifier comprises:
a first transistor having a first terminal receiving a first input signal, a second terminal connected to a first potential via a first load, and a third terminal connected to a second potential via a first impedance device;
a second transistor having a first terminal receiving a second input signal, a second terminal connected to said first potential via a second load, and a third terminal connected to said second potential via a second impedance device; and
a variable impedance circuit connected between said third, terminal of said first transistor and said third terminal of said second transistor,
said variable impedance circuit including:
first and second variable impedance devices connected in series between said third terminal of said first transistor and said third terminal of said second transistor; and a resistive element connected between a junction point between said first variable impedance device and said second variable impedance device and said second potential, a control voltage being applied to a control terminal of said first and second variable impedance devices, and wherein said multiplier comprises:

first, second, third, fourth, fifth, and sixth transistors each having a first terminal, a second terminal, and a third terminal; and a variable impedance circuit, said first terminal of said first transistor receiving a third input signal, said second terminal thereof being connected to a first potential via a first load, said third terminal thereof being connected to said second terminal of said fifth transistor;

said first terminal of said second transistor receiving a fourth input signal, said second terminal thereof being connected to said first potential via a second load, said third terminal thereof being connected to said second terminal of said fifth transistor;

said first terminal of said third transistor receiving said fourth input signal, said second terminal thereof being connected to said first potential via said first load, said third terminal thereof being connected to said second terminal of said sixth transistor;

said first terminal of said fourth transistor receiving said third input signal, said second terminal thereof being connected to said first potential via said second load, said third terminal thereof being connected to said second terminal of said sixth transistor;

said first terminal of said fifth transistor receiving a fifth input signal, said third terminal thereof being connected to a second potential via a first impedance device;

said first terminal of said sixth transistor receiving a sixth input signal, said third terminal thereof being connected to said second potential via a second impedance device, said variable impedance circuit including:

first and second variable impedance devices connected in series between said third terminal of said fifth transistor and said third terminal of said sixth transistor; and a resistive element connected between a junction point between said first variable impedance device and said second variable impedance device and said second potential, a control voltage being applied to a control terminal of said first and second variable impedance devices, and wherein output signals at said second terminals of said first and second transistors in said differential amplifier are applied to said first tenninals of said fifth and sixth transistors in said multiplier as said fifth and sixth input signals, and wherein a first control voltage is applied to said variable impedance circuit in said differential amplifier, and a second control voltage is applied to said variable impedance circuit in said multiplier.

9. A high-frequency circuit comprising:

a differential amplifier; and a multiplier, wherein said differential amplifier comprises:

a first transistor having a first terminal receiving a first input signal, a second terminal connected to a first potential via a first load, and a third terminal connected to a second potential via a first impedance device;

a second transistor having a first terminal receiving a second input signal, a second terminal connected to said first potential via a second load, and a third terminal connected to said second potential via a second impedance; and a first variable impedance circuit having an impedance connected to said third terminal of said first transistor and said third terminal of said second transistor and varying depending on a first control voltage, and wherein said multiplier includes first, second, third, fourth, fifth, and sixth transistors each having a first terminal, a second terminal, and a third terminal; and a second variable impedance circuit, said first terminal of said first transistor receiving a third input signal, said second terminal thereof being connected to a first potential via a first load, said third terminal thereof being connected to said second terminal of said fifth transistor;

said first terminal of said second transistor receiving a fourth input signal, said second terminal thereof being connected to said first potential via a second load, said third terminal thereof being connected to said second terminal of said fifth transistor;

said first terminal of said third transistor receiving said fourth input signal, said second terminal thereof being connected to said first potential via said first load, said third terminal thereof being connected to said second terminal of said sixth transistor;

said first terminal of said fourth transistor receiving said third input signal, said second terminal thereof being connected to said first potential via said second load, said third terminal thereof being connected to said second terminal of said sixth transistor;

said first terminal of said fifth transistor receiving a fifth input signal, said third terminal thereof being connected to said second potential via a first impedance device;

said first terminal of said sixth transistor receiving a sixth input signal, said third terminal thereof being connected to said second potential via a second impedance device, said second variable impedance circuit being connected between said third terminal of said fifth transistor and said third terminal of said sixth transistor and having an impedance varying depending on a second control voltage, and wherein output signals at said second terminals of said first and second transistors in said differential amplifier are applied to said first terminals of said fifth and sixth transistors in said multiplier as said fifth and sixth input signals.

* * * * *